United States Patent
Jang et al.

(10) Patent No.: US 12,438,132 B2
(45) Date of Patent: Oct. 7, 2025

(54) UNIT PIXEL FOR LED DISPLAY AND LED DISPLAY APPARATUS HAVING THE SAME

(71) Applicant: SEOUL VIOSYS CO., LTD., Ansan-si (KR)

(72) Inventors: Jong Min Jang, Ansan-si (KR); Sung Hyun Lee, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 652 days.

(21) Appl. No.: 17/719,323

(22) Filed: Apr. 12, 2022

(65) Prior Publication Data

US 2022/0336427 A1 Oct. 20, 2022

Related U.S. Application Data

(60) Provisional application No. 63/174,769, filed on Apr. 14, 2021.

(51) Int. Cl.
*H01L 25/075* (2006.01)
*H01L 23/00* (2006.01)
(Continued)

(52) U.S. Cl.
CPC .......... *H01L 25/0756* (2013.01); *H01L 24/29* (2013.01); *H01L 24/32* (2013.01);
(Continued)

(58) Field of Classification Search
CPC .... H10H 20/018; H10H 20/84; H10H 20/831; H10H 29/10; H01L 24/03; H01L 24/05;
(Continued)

(56) References Cited

U.S. PATENT DOCUMENTS 8,035,115 B2  10/2011  Ogihara et al.
10,622,513 B2  4/2020  Lee et al.
(Continued)

FOREIGN PATENT DOCUMENTS

CN  212934611 U  4/2021
JP  4636501 B2  2/2011
(Continued)

OTHER PUBLICATIONS

International Search Report dated Aug. 1, 2022 in International Application No. PCT/KR2022/005384.
(Continued)

*Primary Examiner* — Fazli Erdem
(74) *Attorney, Agent, or Firm* — Oblon, McClelland, Maier & Neustadt, L.L.P.

(57) ABSTRACT

A unit pixel including a first light emitting stack; a second light emitting stack disposed under the first light emitting stack, and having an area greater than that of the first light emitting stack; a third light emitting stack disposed under the second light emitting stack, and having an area greater than that of the second light emitting stack, in which at least one of the first through third light emitting stacks includes a side surface having an inclination angle within a range of about 30 degrees to about 70 degrees with respect to a first plane parallel to a top surface of the third light emitting stack.

19 Claims, 47 Drawing Sheets

(51) Int. Cl.
*H10H 20/01* (2025.01)
*H10H 20/84* (2025.01)

(52) U.S. Cl.
CPC ............ *H01L 24/33* (2013.01); *H10H 20/018* (2025.01); *H10H 20/84* (2025.01); *H01L 24/03* (2013.01); *H01L 24/05* (2013.01); *H01L 24/06* (2013.01); *H01L 24/13* (2013.01); *H01L 24/14* (2013.01); *H01L 2224/039* (2013.01); *H01L 2224/05558* (2013.01); *H01L 2224/05573* (2013.01); *H01L 2224/06179* (2013.01); *H01L 2224/13006* (2013.01); *H01L 2224/13013* (2013.01); *H01L 2224/13023* (2013.01); *H01L 2224/13082* (2013.01); *H01L 2224/13109* (2013.01); *H01L 2224/13144* (2013.01); *H01L 2224/13147* (2013.01); *H01L 2224/14179* (2013.01); *H01L 2224/29082* (2013.01); *H01L 2224/29186* (2013.01); *H01L 2224/2919* (2013.01); *H01L 2224/32148* (2013.01); *H01L 2224/33181* (2013.01); *H01L 2224/83005* (2013.01); *H01L 2224/8393* (2013.01); *H01L 2924/05442* (2013.01); *H10H 20/013* (2025.01)

(58) Field of Classification Search
CPC ......... H01L 24/06; H01L 24/13; H01L 24/14; H01L 24/29; H01L 24/32; H01L 24/33; H01L 25/0753; H01L 25/0756
See application file for complete search history.

(56) References Cited

U.S. PATENT DOCUMENTS

| | | | |
|---|---|---|---|
| 11,114,499 | B2 | 9/2021 | Lee et al. |
| 11,282,892 | B2 | 3/2022 | Kim et al. |
| 2001/0020994 | A1* | 9/2001 | Kaneko ............ G02F 1/136286 349/147 |
| 2005/0245087 | A1* | 11/2005 | Sasagawa ............ H10K 71/60 257/E21.582 |
| 2019/0189596 | A1* | 6/2019 | Chae ..................... H01L 33/50 |
| 2020/0365568 | A1 | 11/2020 | Jang et al. |
| 2020/0365648 | A1 | 11/2020 | Jang et al. |
| 2021/0104574 | A1 | 4/2021 | Behringer et al. |
| 2022/0165816 | A1* | 5/2022 | Son ..................... H10K 59/122 |

FOREIGN PATENT DOCUMENTS

| | | |
|---|---|---|
| KR | 20120005662 A | 1/2012 |
| KR | 20170118511 A | 10/2017 |
| KR | 2019-0074066 A | 6/2019 |
| KR | 102016260 B1 | 8/2019 |
| KR | 20200090841 A | 7/2020 |
| KR | 2020-0096529 A | 8/2020 |
| WO | 2016129873 A2 | 8/2016 |
| WO | 2020-231108 A1 | 11/2020 |

OTHER PUBLICATIONS

International Search Report dated Jul. 11, 2022 in International Application No. PCT/KR2022/004677.

* cited by examiner

UNIT PIXEL FOR LED DISPLAY AND LED DISPLAY APPARATUS HAVING THE SAME

CROSS REFERENCE TO RELATED APPLICATION

This application claims priority from and the benefit of U.S. Provisional Application No. 63/174,769, filed on Apr. 14, 2021, which is hereby incorporated by reference for all purposes as if fully set forth herein.

BACKGROUND

Field

Exemplary embodiments of the invention relate generally to a unit pixel for an LED display that implements an image using a light emitting diode and a display apparatus having the same and, more specifically, to a highly reliable unit pixel for an LED display and a display apparatus having the same.

Discussion of the Background

Light emitting diodes are inorganic light sources, which are used in various fields, such as displaying apparatuses, automobile lamps, general lighting, and the like. The light emitting diodes have advantages over conventional light sources, such as longer lifespan, lower power consumption, and quicker response, and thus, the light emitting diodes have been replacing the conventional light sources.

The conventional light emitting diodes have been generally used as backlight light sources in displaying apparatuses. However, LED displays that directly realize images using the light emitting diodes have been recently developed In general, the display apparatus realizes various colors using a mixed color of blue, green, and red. In order to realize various images, the display apparatus includes a plurality of pixels each including sub-pixels of blue, green, and red light. In this manner, a color of a certain pixel is determined based on colors of the sub-pixels, and images can be realized through a combination of such pixels.

LEDs can emit light of various colors depending on materials thereof, and thus, individual light emitting devices emitting blue, green, and red are typically arranged on a two-dimensional plane to provide a display apparatus. The individual light emitting devices correspond to sub-pixels, and blue, green, and red light emitting devices typically form one pixel. However, when one light emitting device is arranged on each sub-pixel, the number of light emitting devices increases, and a process for mounting each of the light emitting devices takes a significant amount of time.

Accordingly, a technique of manufacturing unit pixels at a wafer level by stacking blue, green, and red light emitting devices and arranging the manufactured unit pixels on a circuit board has recently been developed. However, when the blue, green, and red light emitting devices are stacked, an overall height of the unit pixel is increased, and thus, an insulation layer or a metal layer may be easily cracked during a manufacturing process.

The above information disclosed in this Background section is only for understanding of the background of the inventive concepts, and, therefore, it may contain information that does not constitute prior art.

SUMMARY

Unit pixels constructed according to exemplary embodiments of the invention have high reliability and are capable of preventing a crack of an insulation layer or a metal layer in a manufacturing process, and an LED display apparatus having the same.

Additional features of the inventive concepts will be set forth in the description which follows, and in part will be apparent from the description, or may be learned by practice of the inventive concepts.

A unit pixel according to an exemplary embodiment includes a first light emitting stack, a second light emitting stack disposed under the first light emitting stack, and having an area greater than that of the first light emitting stack, a third light emitting stack disposed under the second light emitting stack, and having an area greater than that of the second light emitting stack, in which at least one of the first through third light emitting stacks includes a side surface having an inclination angle within a range of about 30 degrees to about 70 degrees with respect to a first plane parallel to a top surface of the third light emitting stack.

Each of the first through third light emitting stacks may have an inclination angle within a range of about 30 degrees to about 70 degrees with respect to the first plane.

The third light emitting stack may include a mesa, and a side surface of the mesa has an inclination angle within a range of about 30 degrees to about 70 degrees with respect to the first plane.

The first light emitting stack may include a first side surface having a first inclination angle with respect to the first plane and a second side surface having a second inclination angle less than the first inclination angle, and the first side surface may be disposed closer to the second light emitting stack than the second side surface.

The first side surface may be continuous with the second side surface.

The unit pixel may further include a first adhesive layer disposed between the first light emitting stack and the second light emitting stack, and a second adhesive layer disposed between the second light emitting stack and the third light emitting stack, in which the first adhesive layer and the second adhesive layer may include side surfaces having inclination angles within a range of about 30 degrees to about 70 degrees with respect to the first plane.

The unit pixel may further include a first adhesion enhancement layer disposed between the second adhesive layer and the second light emitting stack, in which the first adhesion enhancement layer may include a side surface having an inclination angle within a range of about 5 degrees to about 60 degrees with respect to the first plane.

The unit pixel may further include a second adhesion enhancement layer disposed between the second adhesive layer and the third light emitting stack, in which the second adhesion enhancement layer may include a side surface having an inclination angle within a range of about 5 degrees to about 60 degrees with respect to the first plane.

The first adhesion enhancement layer or the second adhesion enhancement layer may include a silicon oxide film.

The unit pixel may further include a first lower contact electrode electrically connected to a second conductivity type semiconductor layer of the first light emitting stack, a second lower contact electrode electrically connected to a second conductivity type semiconductor layer of the second light emitting stack, and a third lower contact electrode electrically connected to a second conductivity type semiconductor layer of the third light emitting stack, in which the first through third lower contact electrodes may include side surfaces having inclination angles within a range of about 5 degrees to about 60 degrees with respect to the first plane.

The unit pixel may further include a first upper contact electrode disposed on the first light emitting stack, in which the first upper contact electrode may include a side surface having an inclination angle within a range of about 20 degrees to about 70 degrees with respect to the first plane.

The unit pixel may further include a first insulation layer covering the first through third unit pixels, and first, second, third, and fourth pads disposed on the first insulation layer, in which the first insulation layer may have contact holes providing an electrical path for the first through third light emitting stacks, the first through fourth pads may be electrically connected to the first through third light emitting stacks through the contact holes, and sidewalls of the contact holes may have inclination angles within a range of about 10 degrees to about 70 degrees with respect to the first plane.

The unit pixel may further include a second insulation layer covering the first through fourth pads, and first, second, third, and fourth connection electrodes disposed on the second insulation layer, in which the second insulation layer may have through holes providing an electrical path for the first through fourth pads, the first through fourth connection electrodes may be electrically connected to the first through fourth pads through the through holes of the second insulation layer, and sidewalls of the through may holes have inclination angles within a range of about 10 degrees to about 70 degrees with respect to the first plane.

At least one of the first through third light emitting stacks may have a mirror symmetrical structure with respect to at least one vertical plane passing through a center of the at least one of the first through third light emitting stacks in plan view.

The unit pixel may have a rectangular shape in plan view, and the at least one vertical plane may pass through a straight line parallel to an edge of the unit pixel.

The unit pixel may further include a substrate disposed under the third light emitting stack.

A display apparatus according to another exemplary embodiment includes a circuit board, a unit pixel disposed on the circuit board and including a first light emitting stack, a second light emitting stack disposed under the first light emitting stack, and having an area greater than that of the first light emitting stack, a third light emitting stack disposed under the second light emitting stack, and having an area greater than that of the second light emitting stack, in which at least one of the first through third light emitting stacks includes a side surface having an inclination angle within a range of about 30 degrees to about 70 degrees with respect to a first plane parallel to a top surface of the third light emitting stack.

The first light emitting stack may include a first side surface having a first inclination angle with respect to the first plane, and a second side surface having a second inclination angle less than the first inclination angle; and the first side surface may be disposed closer to the second light emitting stack than the second side surface.

The unit pixel may further include a first adhesive layer disposed between the first light emitting stack and the second light emitting stack, and a second adhesive layer disposed between the second light emitting stack and the third light emitting stack, in which the first adhesive layer and the second adhesive layer may include side surfaces having inclination angles within a range of about 30 degrees to about 70 degrees with respect to the first plane.

The unit pixel may further include a first lower contact electrode electrically connected to a second conductivity type semiconductor layer of the first light emitting stack, a second lower contact electrode electrically connected to a second conductivity type semiconductor layer of the second light emitting stack, and a third lower contact electrode electrically connected to a second conductivity type semiconductor layer of the third light emitting stack, in which the first through third lower contact electrodes may include side surfaces having inclination angles within a range of about 5 degrees to about 60 degrees with respect to the first plane.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
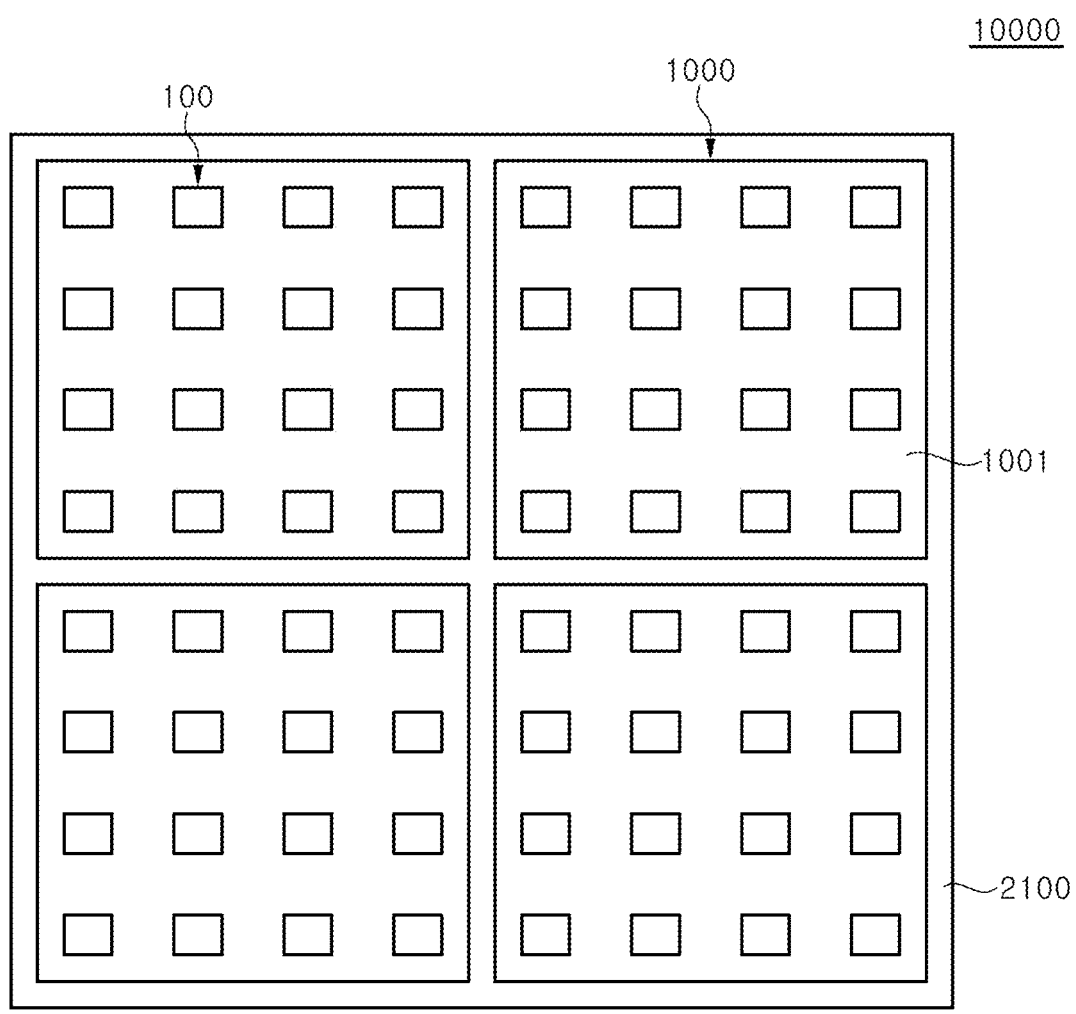
FIG. 1 is a schematic plan view illustrating a display apparatus according to one or more exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

In this specification, a "side inclination angle" of an element means an inner angle formed by a side surface of the element with respect to a flat bottom surface of the element. Herein, the flat bottom surface may be defined as a plane parallel to a top surface of the third light emitting stack. Here, a top surface and a bottom surface of an arbitrary element are defined in a state in which the first light emitting stack is disposed over the third light emitting stack.

Hereinafter, exemplary embodiments will be described in detail with reference to the accompanying drawings. Hereinafter, a light emitting area of a unit pixel according to an exemplary embodiment may be 10,000 $\mu m^2$ or less. In other exemplary embodiments, the unit pixel may have a light emitting area of 4,000 $\mu m^2$ or less, and further, 2,500 $\mu m^2$ or less. A total area of the unit pixel according to an exemplary embodiment may be 10,000 $\mu m^2$ or more.

FIG. 1 is a schematic plan view illustrating a display apparatus according to one or more exemplary embodiment.

Referring to FIG. 1, a display apparatus 10000 may include a panel substrate 2100 and a plurality of pixel modules 1000. The display apparatus 10000 is not particularly limited, but it may include a virtual reality (VR) display apparatus, such as a micro LED TV, a smart watch, a VR headset, or an argument reality (AR) display apparatus, such as augmented reality glasses.

The panel substrate 2100 may include a circuit for a passive matrix driving or active matrix driving. In an exemplary embodiment, the panel substrate 2100 may include interconnections and resistors therein, and in another exemplary embodiment, the panel substrate 2100 may include interconnections, transistors, and capacitors. The panel substrate 2100 may also be formed with pads on an upper surface thereof for electrical connection to the circuits.

In an exemplary embodiment, the plurality of pixel modules 1000 is arranged on the panel substrate 2100. Each of the pixel modules 1000 may include a circuit board 1001, and a plurality of unit pixels 100 disposed on the circuit board 1001, and may further include a molding member 200 covering the unit pixels 100. In another exemplary embodiment, the plurality of unit pixels 100 may be arranged directly on the panel substrate 2100, and the molding member 200 may cover the unit pixels 100.

Each of the unit pixels 100 will be described in detail with reference to FIGS. 2A, 2B, and 2C.

Figure 2A:
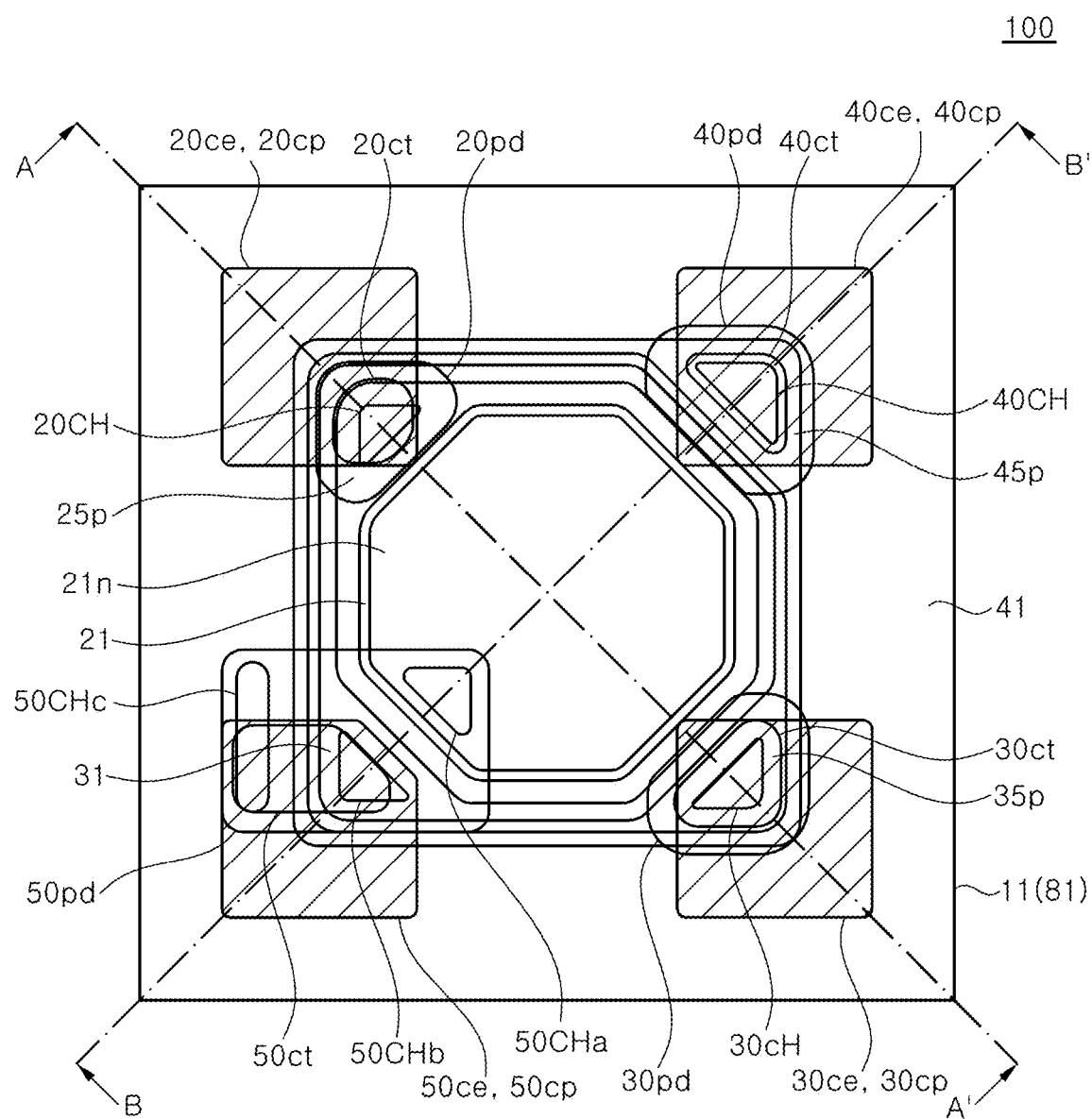
FIG. 2A is a schematic plan view illustrating a unit pixel according to one or more exemplary embodiment.
Figure 2B:
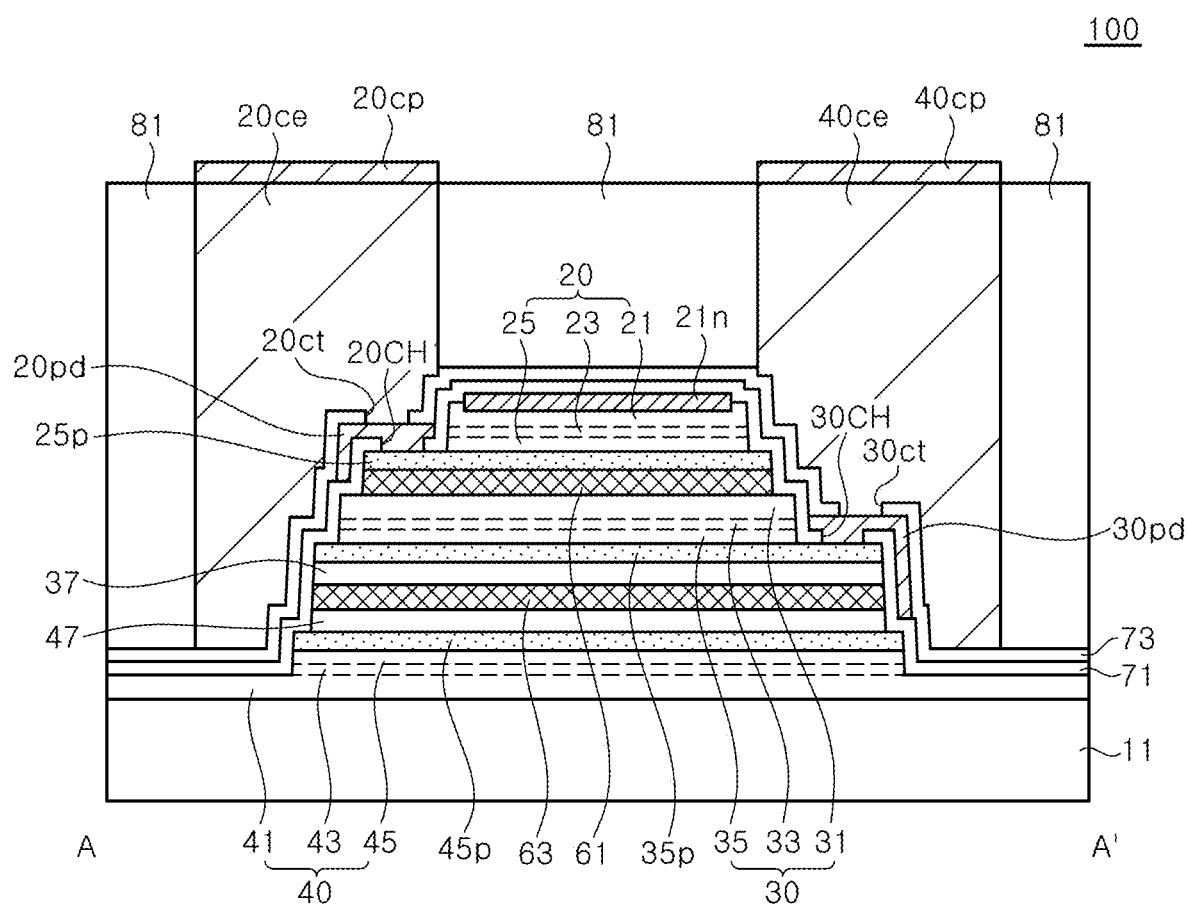
FIG. 2B is a schematic cross-sectional view taken along line A-A' of the unit pixel shown in FIG. 2A.
Figure 2C:
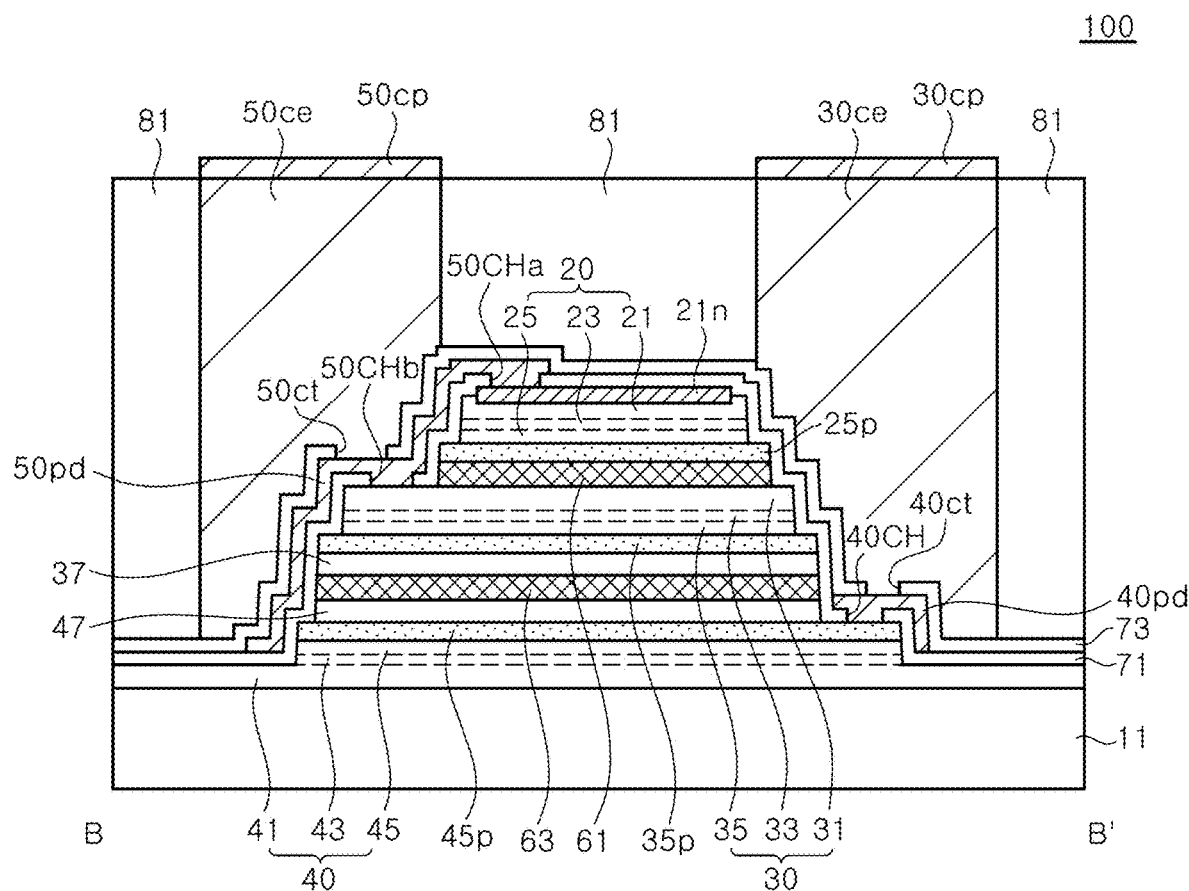
FIG. 2C is a schematic cross-sectional view taken along line B-B' of the unit pixel shown in FIG. 2A.

FIG. 2A is a schematic plan view illustrating a unit pixel 100 according to an exemplary embodiment, and FIG. 2B and FIG. 2C are schematic cross-sectional views respectively taken along lines A-A' and B-B' of its corresponding plan view shown in FIG. 2A.

Referring to FIGS. 2A, 2B, and 2C, the unit pixel 100 may include a light emitting stacked structure, a first connection electrode 20ce, a second connection electrode 30ce, a third connection electrode 40ce, and a fourth connection electrode 50ce formed on the light emitting stacked structure, and bonding metal layers 20cp, 30cp, 40cp, and 50cp may be disposed on each of the connection electrodes.

The unit pixel 100 may include a first LED sub-unit, a second LED sub-unit, and a third LED sub-unit disposed on a substrate 11. The first LED sub-unit may include a first light emitting stack 20, the second LED sub-unit may include a second light emitting stack 30, and the third LED sub-unit may include a third light emitting stack 40. While the drawings exemplarily show the light emitting stacked structure including three light emitting stacks 20, 30, and 40, however, the inventive concepts are not limited to a particular number of light emitting stacks. For example, in some exemplary embodiments, the light emitting stacked structure may include two or more light emitting stacks therein. Hereinafter, the light emitting stacked structure will be described with reference to one that includes three light emitting stacks 20, 30, and 40 according to an exemplary embodiment.

The substrate 11 may have a light transmissive insulating substrate. However, in some exemplary embodiments, the substrate 11 may be formed to be translucent or partially transparent so as to transmit only light of a specific wavelength or transmit only a portion of light of a specific wavelength. The substrate 11 may be a growth substrate on which the third light emitting stack 40 may be epitaxially grown, for example, a sapphire substrate. However, the substrate 11 is not limited to the sapphire substrate, and may include various other transparent insulating materials. For example, the substrate 11 may include glass, quartz, silicone, organic polymer, or an organic-inorganic composite material, and may be, for example, a silicon carbide (SiC) substrate, a gallium nitride (GaN) substrate, an indium gallium nitride (InGaN) substrate, and aluminum gallium nitride (AlGaN) substrate, an aluminum nitride (AlN) substrate, a gallium oxide ($Ga_2O_3$) substrate, or a silicon substrate. In addition, the substrate 11 may include irregularities on an upper surface thereof, and may be, for example, a patterned sapphire substrate. The irregularities formed on the upper surface of the substrate 11 may increase extraction efficiency of light generated in the third light emitting stack 40 in contact with the substrate 11. In addition, the irregularities of the substrate 11 may selectively increase a luminous intensity of the third light emitting stack 40 compared to the first light emitting stack 20 and the second light emitting stack 30. Meanwhile, in another exemplary embodiment, the substrate 11 may be removed.

The first, second, and third light emitting stacks 20, 30, and 40 are configured to emit light towards the substrate 11. Accordingly, light emitted from the first light emitting stack 20 may pass through the second and third light emitting stacks 30 and 400. According to an exemplary embodiment, the first, second, and third light emitting stacks 20, 30, and 40 may emit light of different peak wavelengths from one another. In an exemplary embodiment, the light emitting stack disposed further away from the substrate 11 emits light of a longer wavelength than that of the light emitting stack disposed closer the substrate 11 to reduce light loss. For example, the first light emitting stack 20 may emit red light, the second light emitting stack 30 may emit green light, and the third light emitting stack 40 may emit blue light, without being limited thereto.

In another exemplary embodiment, the second light emitting stack 30 may emit light having a shorter wavelength than that of the third light emitting stack 40. In this case, a portion of light emitted from the second light emitting stack 30 may be absorbed by the third light emitting stack 40. Accordingly, it is possible to reduce the luminous intensity of the second light emitting stack 30 and relatively increase the luminous intensity of the third light emitting stack 40, and thus, it is possible to change a luminous intensity ratio of light emitted from the first, second, and third light emitting stacks 20, 30, and 40. For example, the first light emitting stack 20 may be configured to emit red light, the second light emitting stack 30 to emit blue light, and the third light emitting stack 40 to emit green light. In this manner, it is possible to relatively decrease the luminous intensity of blue light and relatively increase the luminous intensity of green light, and thus, it is possible to easily adjust the luminous intensity ratio of red, green, and blue to be close to 3:6:1. Furthermore, emission areas of the first, second, and third light emitting stacks 20, 30, and 40 may be less than or equal to about 10,000 um², further, may be less than or equal to 4,000 um², furthermore, less than or equal to 2,500 um². In addition, the emission area may be increased with decreasing distance to the substrate 11, and the luminous intensity of green light may be further increased by disposing the third light emitting stack 40 emitting green light closest to the substrate 11.

The second light emitting stack 30 has been exemplarily described above as emitting light having the shorter wavelength than that of the third light emitting stack 40, but it is contemplated that the second light emitting stack 30 in other exemplary embodiments may emit light having the longer wavelength than that emitted from the third light emitting stack 40, for example, green light.

The first light emitting stack 20 includes a first conductivity type semiconductor layer 21, an active layer 23, and a second conductivity type semiconductor layer 25. According to an exemplary embodiment, the first light emitting stack 20 may include, for example, a semiconductor material emitting red light such as AlGaAs, GaAsP, AlGaInP, and GaP, without being limited thereto.

In an exemplary embodiment, the first light emitting stack 20 may have a symmetrical structure in plan view. For example, the first light emitting stack 20 may have a regular octagonal shape as shown in FIG. 2A. The symmetrical structure of the first light emitting stack 20 will be described in detail later with reference to FIGS. 17A, 17B, and 17C.

The first light emitting stack 20 may have an inclined side surface. For example, the first light emitting stack 20 may include a side surface having an inclination angle within a range of about 30 degrees to about 70 degrees, and further, an inclination angle of about 40 degrees to about 70 degrees with respect to a plane parallel to a top surface of the third light emitting stack 40. Since the first light emitting stack 20 has the inclined side surface, an insulation layer covering a side surface of the first light emitting stack 20, for example, first and second insulation layers 71 and 73 or a fourth pad 50pd may be stably formed without defects. Furthermore, the side surface of the first light emitting stack 20 may be inclined with two or more steps.

A first upper contact electrode 21n may be disposed on the first conductivity type semiconductor layer 21 and may form an ohmic contact with the first conductivity type semiconductor layer 21. A first lower contact electrode 25p may be disposed under the second conductivity type semiconductor layer 25. According to an exemplary embodiment, a portion of the first conductivity type semiconductor layer 21 may be patterned to be recessed, and the first upper contact electrode 21n may be disposed in a recessed region of the first conductivity type semiconductor layer 21 so as to increase a level of ohmic contact. The first upper contact electrode 21n may have a single-layered structure or a multi-layered structure, and may include Al, Ti, Cr, Ni, Au, Ag, Sn, W, Cu, or an alloy thereof, for example, Au—Te alloy or an Au—Ge alloy, without being limited thereto. In an exemplary embodiment, the first upper contact electrode 21n may have a thickness of about 100 nm, and may include metal having high reflectance so as to increase light emission efficiency in a downward direction towards the substrate 11.

The upper contact electrode 21n may include a side surface having an inclination angle within a range of about 20 degrees to about 70 degrees with respect to the plane parallel to the top surface of the third light emitting stack 40. Since the first upper contact electrode 21n is formed to have an inclined side surface, the insulation layer 71 covering the first upper contact electrode 21n may be stably formed.

The second light emitting stack 30 includes a first conductivity type semiconductor layer 31, an active layer 33, and a second conductivity type semiconductor layer 35. According to an exemplary embodiment, the second light emitting stack 30 may include a semiconductor material that emits blue light, such as gallium nitride (GaN), indium gallium nitride (InGaN), zinc selenide (ZnSe), or the like, without being limited thereto. A second lower contact electrode 35p is disposed under the second conductivity type semiconductor layer 35 of the second light emitting stack 30.

The second light emitting stack 30 may have an inclined side surface. For example, the third light emitting stack 30 may include a side surface having an inclination angle within a range of about 30 degrees to about 70 degrees with respect to the plane parallel to the top surface of the third light emitting stack 40. Since the second light emitting stack 30 has the inclined side surface, an insulation layer covering the side surface of the second light emitting stack 30, for example, the first and second insulation layers 71 and 73 or metal layers, such as first through fourth pads 20pd, 30pd, 40pd, and 50pd, may be stably formed without defects. Furthermore, the side surface of the second light emitting stack 30 may be inclined with two or more steps.

The third light emitting stack 40 includes a first conductivity type semiconductor layer 41, an active layer 43, and a second conductivity type semiconductor layer 45. According to an exemplary embodiment, the third light emitting stack 40 may include a semiconductor material that emits green light, such as GaN, InGaN, GaP, AlGaInP, AlGaP, or the like. A third lower contact electrode 45p is disposed on the second conductivity type semiconductor layer 45 of the second light emitting stack 40.

The third light emitting stack 40 may have an inclined side surface. For example, the third light emitting stack 40 may include a side surface having an inclination angle within a range of about 30 degrees to about 70 degrees with respect to the plane parallel to the top surface of the third light emitting stack 40. In an exemplary embodiment, the third light emitting stack 40 may include a mesa, and the mesa may include an inclined side surface. Since the third light emitting stack 40 has the inclined side surface, an insulation layer covering the side surface of the third light emitting stack 40, for example, the first and second insulation layers 71 and 73 or metal layers, such as the fourth pad 50pd, may be stably formed without defects. Moreover, the side surface of the third light emitting stack 40 may be inclined with two or more steps.

According to an exemplary embodiment, each of the first conductivity type semiconductor layers 21, 31, and 41 and the second conductivity type semiconductor layers 25, 35, and 45 of the first, second, and third light emitting stacks 20, 30, and 40 may have a single-layered structure or a multi-layered structure and, in some exemplary embodiments, may include a superlattice layer. Furthermore, the active layers 23 of the first, second, and third light emitting stacks 20, 30, and 40 may have a single quantum well structure or a multiple quantum well structure.

Each of the first, second, and third lower contact electrodes 25p, 35p, and 45p may include a transparent conductive material to transmit light. For example, the lower contact electrodes 25p, 35p, and 45p may include a transparent conductive oxide (TCO), for example, SnO, $InO_2$, ZnO, ITO, ITZO, or the like, without being limited thereto. The first lower contact electrode 25p may be thinner than the second and third lower contact electrodes 35p and 45p. For example, the first lower contact electrode 25p may be formed to have a thickness of about 240 nm, and the second and third lower contact electrodes 35p and 45p may be formed to have a thickness of about 300 nm.

The first, second, and third lower contact electrodes 25p, 35p, and 45p may also have an inclined side surface. The first, second, and third lower contact electrodes 25p, 35p, and 45p may have, for example, inclination angles within a range of about 5 degrees to about 60 degrees with respect to the plane parallel to the top surface of the third light emitting stack 40. Since the first, second, and third lower contact electrodes 25p, 35p, and 45p have the inclined side surface, the first and second insulation layers 71 and 73 covering them or metal layers, such as the first through fourth pads 20pd, 30pd, 40pd, and 50pd, may be stably formed.

A first adhesive layer 61 is disposed between the first light emitting stack 20 and the second light emitting stack 30, and a second adhesive layer 62 is disposed between the second light emitting stack 30 and the third light emitting stack 40. The first and second adhesive layers 61 and 63 may include a non-conductive material that transmits light. For example, the first and second adhesive layers 61 and 63 may include an optically clear adhesive (OCA), which may include epoxy, polyimide, SUB, spin-on-glass (SOG), benzocyclobutene (BCB), without being limited thereto.

The first adhesive layer 61 and the second adhesive layer 63 may each have an inclined side surface. For example, the first adhesive layer 61 and the second adhesive layer 63 may have, for example, inclination angles within a range of about 20 degrees to about 70 degrees with respect to the plane parallel to the top surface of the third light emitting stack 40. Since the first adhesive layer 61 and the second adhesive layer 63 have the inclined side surfaces, the first and second insulation layers 71 and 73 covering them or metal layers may be stably formed.

A first adhesion enhancement layer 37 may be disposed between the second adhesive layer 63 and the second light emitting stack 30. For example, the first adhesive enhancement layer 37 may be disposed between the second adhesive layer 63 and the second lower contact electrode 35p to contact them. The first adhesion enhancement layer 37 may prevent the second light emitting stack 30 from being peeled off from the second adhesive layer 63 in a process involving a rapid stress change, such as a laser lift-off process, and furthermore, may prevent the second light emitting stack 30 from being cracked. The first adhesion enhancement layer 37 may be formed of, for example, a silicon oxide film, without being limited thereto.

A second adhesion enhancement layer 47 may be disposed between the second adhesive layer 63 and the third light emitting stack 40. For example, the second adhesive enhancement layer 47 may be disposed between the second adhesive layer 63 and the third lower contact electrode 45p to contact them. The second adhesion enhancement layer 47 may prevent the third light emitting stack 40 from being peeled off from the second adhesive layer 63 in a process involving a rapid stress change, such as a laser lift-off process, and furthermore, may prevent the third light emitting stack 40 from being cracked. The second adhesion enhancement layer 47 may be formed of, for example, a silicon oxide film, without being limited thereto.

The first and second adhesion enhancement layers 37 and 47 may have a thickness smaller than that of the second and third lower contact electrodes 35p and 45p, respectively, and may have a thickness of, for example, about 100 nm.

The first and second adhesion enhancement layers 37 and 47 may have an inclined side surface. For example, the first adhesive layer 37 and the second adhesive layer 47 may have inclination angles, for example, within a range of about 20 degrees to about 70 degrees with respect to the plane parallel to the top surface of the third light emitting stack 40. Since the first adhesive layer 37 and the second adhesive layer 47 have the inclined side surface, the first and second insulation layers 71 and 73 covering them or metal layers, such as the first through fourth pads 20pd, 30pd, 40pd, and 50pd, may be stably formed.

According to the illustrated exemplary embodiment, a first insulation layer 71 and a second insulation layer 73 are disposed on at least portions of side surfaces of the first, second, and third light emitting stacks 20, 30, and 40. The first and second insulation layers 71 and 73 may include various organic or inorganic insulating materials, for example, polyimide, SiO2, SiNx, $Al_2O_3$, or the like. For example, at least one of the first and second insulation layers 71 and 73 may include a distributed Bragg reflector DBR. As another example, at least one of the first and second insulation layers 71 and 73 may include a black organic polymer. In some exemplary embodiments, an electrically floating metallic reflection layer may be disposed on the first and second insulation layers 71 and 73 to reflect light emitted from the light emitting stacks 20, 30, and 40 toward the substrate 11. In some exemplary embodiments, at least one of the first and second insulation layers 71 and 73 may have a single-layered structure or a multi-layered structure formed of two or more insulation layers having different refractive indices from one another.

According to an exemplary embodiment, each of the first, second, and third light emitting stacks 20, 30 and 40 may be driven independently. More specifically, a common voltage may be applied to one of the first and second conductivity type semiconductor layers of each of the light emitting stacks, and an individual light emitting signal may be applied to another one of the first and second conductivity type semiconductor layers of each of the light emitting stacks. For example, according to an exemplary embodiment, the first conductivity type semiconductor layer 21, 31, and 41 of each of the light emitting stacks may be n-type, and the second conductivity type semiconductor layer 25, 35, and 45 may be p-type. In this case, the third light emitting stack 40 may have a reversed stacked sequence compared to those of the first light emitting stack 20 and the second light emitting stack 30, such that the p-type semiconductor layer 45 may be disposed over the active layer 43, so that a manufacturing process may be simplified. Hereinafter, according to the illustrated exemplary embodiment, the first conductivity type and second conductivity type semiconductor layers will be described as p-type and n-type, respectively. As described above, however, the n-type and the p-type may be reversed in other exemplary embodiments.

The first, second, and third lower contact electrodes 25p, 35p, and 45p respectively connected to the p-type semiconductor layers 25, 35 and 45 of the light emitting stacks may be electrically connected to the first, second, and third connection electrodes 20ce, 30ce, and 40ce, respectively, to receive corresponding light emitting signals. Meanwhile, the n-type semiconductor layers 21, 31, and 41 of the light emitting stacks may be commonly electrically connected to the fourth connection electrode 50ce. Accordingly, the unit pixel 100 may have a common n-type light emitting stacked structure in which the n-type semiconductor layers 21, 31, and 41 of the first, second, and third light emitting stacks 20, 30 and 40 are commonly connected, and may be driven independently of one another. Since the unit pixel 100 has the common n-type light emitting stacked structure, sources of voltages applied to the first, second, and third light emitting stacks 20, 30, and 40 may be different from one another.

Although the unit pixel 100 according to the illustrated exemplary embodiment is described as having a common n-type structure, the inventive concepts are not limited thereto. For example, in some exemplary embodiments, the first conductivity type semiconductor layers 21, 31, and 41 of each light emitting stack may be the p-type, and the second conductivity type semiconductor layers 25, 35, and 45 of each light emitting stack may be the n-type, and thus, it is possible to form a common p-type light emitting stacked structure. Furthermore, in some exemplary embodiments, a stacked sequence of each light emitting stack may be variously modified without being limited to that shown in the drawings. Hereinafter, the unit pixel 100 will be described with reference to the common n-type light emitting stacked structure.

According to the illustrated exemplary embodiment, the unit pixel 100 includes a first pad 20pd, a second pad 30pd, a third pad 40pd, and a fourth pad 50pd. The first pad 20pd is electrically connected to the first lower contact electrode 25p through a first contact hole 20CH defined through the first insulation layer 71. The first connection electrode 20ce is electrically connected to the first pad 20pd through a first through hole 20ct defined through the second insulation layer 73. The second pad 30pd is electrically connected to the second lower contact electrode 35p through a second contact hole 30CH defined through the first insulation layer 71. The second connection electrode 30ce is electrically connected to the second pad 30pd through a second through hole 30ct defined through the second insulation layer 73.

The third pad 40pd is electrically connected to the third lower contact electrode 45p through a third contact hole 40CH defined through the first insulation layer 71. The third connection electrode 40ce is electrically connected to the third pad 40pd through a third through hole 40ct defined through the second insulation layer 73. The fourth pad 50pd is connected to the first conductivity type semiconductor layers 21, 31, and 41 of the first, second, and third light emitting stacks 20, 30, and 40 through a first sub-contact hole 50 CHa, a second sub-contact hole 50CHb, and a third sub-contact hole 50CHc defined through the first insulation layer 71 on the first conductivity type semiconductor layers 21, 31, and 41 of the first, second, and third light emitting stacks 20, 30, and 40. In particular, the first sub-contact hole 50CHa may expose the first upper contact electrode 21n, and the fourth pad 50pd may be connected to the first upper contact electrode 21n through the first sub-contact hole 50CHa. In this manner, the fourth pad 50pd may be electrically connected to the first conductivity type semiconductor layers 21, 31, and 41 through the sub-contact holes 50CHa, 50CHb and 50CHc, and thus, a manufacturing process of the unit pixel 100 may be simplified. The fourth connection electrode 50ce is electrically connected to the fourth pad 50pd through a fourth through hole 50ct defined through the second insulation layer 73.

The contact holes 20CH, 30CH, 40CH, 50CHa, 50CHb, and 50CHc formed in the first insulation layer 71 may have inclined sidewalls. The sidewalls of the contact holes 20CH, 30CH, 40CH, 50CHa, 50CHb, and 50CHc may have inclination angles within a range of about 10 degrees to about 70 degrees with respect to the plane parallel to the top surface of the third light emitting stack 40. Accordingly, the first through fourth pads 20pd, 30pd, 40pd, and 50pd may be stably formed in the contact holes 20CH, 30CH, 40CH, 50CHa, 50CHb, and 50CHc.

In addition, the through holes 20ct, 30ct, 40ct, and 50ct formed in the second insulation layer 73 may have inclined sidewalls. The sidewalls of the through holes 20ct, 30ct, 40ct, and 50ct may have inclination angles within a range of about 10 degrees to about 70 degrees with respect to the plane parallel to the top surface of the third light emitting stack 40. Accordingly, the first through fourth connection electrodes 20ce, 30ce, 40ce, and 50ce may be stably formed in the through holes 20ct, 30ct, 40ct, and 50ct.

In the illustrated exemplary embodiment, although the first through fourth connection electrodes 20ce, 30ce, 40ce, and 50ce are illustrated and described as directly contacting the pads 20pd, 30pd, 40pd, and 50pd, respectively, in some exemplary embodiments, the first through fourth connection electrodes 20ce, 30ce, 40ce, and 50ce may not be directly connected to the pads 20pd, 30pd, 40pd, and 50pd, and another connector may be interposed therebetween.

The first, second, third, and fourth pads 20pd, 30pd, 40pd, and 50pd are spaced apart from and insulated from one another. According to an exemplary embodiment, each of the first, second, third, and fourth pads 20pd, 30pd, 40pd, and 50pd may cover at least a portion of the side surfaces of the first, second, and third light emitting stacks 20, 30, and 40. In this manner, heat generated from the first, second, and third light emitting stacks 20, 30, and 40 may be easily dissipated.

According to the illustrated exemplary embodiment, each of the connection electrodes 20ce, 30ce, 40ce, and 50ce may have a substantially upwardly elongated shape from the substrate 11. In an exemplary embodiment, the first through fourth connection electrodes 20*ce*, 30*ce*, 40*ce*, and 50*ce* may be disposed in a diagonal direction of the unit pixel 100. Accordingly, light emitting areas of the first through third light emitting stacks 20, 30, and 40 may be maximally secured.

The first through fourth connection electrodes 20*ce*, 30*ce*, 40*ce*, and 50*ce* may include metal, such as Cu, Ni, Ti, Sb, Zn, Mo, Co, Sn, Ag, or an alloy thereof, without being limited thereto. For example, each of the connection electrodes 20*ce*, 30*ce*, 40*ce*, and 50*ce* may include two or more metals or a plurality of different metal layers so as to reduce the stress from the elongated shape of the connection electrodes 20*ce*, 30*ce*, 40*ce*, and 50*ce*. The first through fourth connection electrodes 20*ce*, 30*ce*, 40*ce*, and 50*ce* may be formed of, for example, Cu, which is advantageous in terms of deposition using plating and cost. Cu forms a natural oxide film, which can be removed by flux in a solder paste in a surface mount technology using the solder paste. However, in the surface mount technology using the solder paste, when a distance between the first through fourth connection electrodes 20*ce*, 30*ce*, 40*ce*, and 50*ce* is about 50 µm or less, an electrical short between the solder pastes may occur, so that the unit pixel 100 is not suitable for being mounted.

Eutectic bonding technology may be used as a method that can be used to bond light emitting devices of extremely small sizes, such as micro LEDs. However, the natural oxide film on Cu may interfere with eutectic bonding, and may cause a bonding failure.

Accordingly, according to an exemplary embodiment, the bonding metal layers 20*cp*, 30*cp*, 40*cp*, and 50*cp* may be disposed on the first through fourth connection electrodes 20*ce*, 30*ce*, 40*ce*, and 50*ce*, respectively. The bonding metal layers 20*cp*, 30*cp*, 40*cp*, and 50*cp* are electrically connected to the first through fourth connection electrodes 20*ce*, 30*ce*, 40*ce*, and 50*ce*, respectively. The bonding metal layers 20*cp*, 30*cp*, 40*cp*, and 50*cp* may be formed of a metallic layer that can be bonded to a circuit board through eutectic bonding, for example, Au or Au/In. In this case, a pad disposed on the circuit board may include, for example, In or Sn. It may be considered to form the bonding metal layers 20*cp*, 30*cp*, 40*cp*, and 50*cp* of In or Sn, but there are drawbacks in that depositing In thick through plating technology is difficult, and it is also difficult to probe Sn for measuring electrical characteristics of the unit pixel 100. Accordingly, by forming the bonding metal layers 20*cp*, 30*cp*, 40*cp*, and 50*cp* of Au, a bonding metal layer having a sufficient thickness may be formed, and further, the electrical characteristics of the unit pixel 100 may be easily measured.

In some exemplary embodiments, a barrier layer may be interposed between the first through fourth connection electrodes 20*ce*, 30*ce*, 40*ce*, and 50*ce* and the bonding metal layers 20*cp*, 30*cp*, 40*cp*, and 50*cp*. The barrier layer prevents the bonding metal layers 20*cp*, 30*cp*, 40*cp*, and 50*cp* from being mixed with the connection electrodes 20*ce*, 30*ce*, 40*ce*, and 50*ce*.

A region between the first through fourth connection electrodes 20*ce*, 30*ce*, 40*ce*, and 50*ce* may be filled with a protection layer 81. The protection layer 81 may be formed of, for example, PDMA or black epoxy molding compound (EMC). The protection layer 81 may surround side surfaces of the first through fourth connection electrodes 20*ce*, 30*ce*, 40*ce*, and 50*ce*. The protection layer 81 may surround substantially the entire side surfaces of the first through fourth connection electrodes 20*ce*, 30*ce*, 40*ce*, and 50*ce*, and may expose upper surfaces thereof. In an exemplary embodiment, an upper surface of the protection layer 81 may be flush with the upper surfaces of the first through fourth connection electrodes 20*ce*, 30*ce*, 40*ce*, and 50*ce*. In another exemplary embodiment, the upper surfaces of the first through fourth connection electrodes 20*ce*, 30*ce*, 40*ce*, and 50*ce* may be recessed from the upper surface of the protection layer 81. In yet another exemplary embodiment, the upper surfaces of the first through fourth connection electrodes 20*ce*, 30*ce*, 40*ce*, and 50*ce* may protrude from the upper surface of the protection layer 81.

According to an exemplary embodiment, when the unit pixel 100 is a micro-LED, which has a surface area less than about 10,000 µm² as known in the art, or less than about 4,000 µm² or 2,500 µm² in other exemplary embodiments, the connection electrodes 20*ce*, 30*ce*, 40*ce*, and 50*ce* may overlap a portion of at least one of the first, second, and third light emitting stacks 20, 30, and 40 as shown in the drawings. More particularly, the first through fourth connection electrodes 20*ce*, 30*ce*, 40*ce*, and 50*ce* may overlap at least one step formed in the side surface of the light emitting stacked structure. As such, since an area of a lower surface of a connection electrode is greater than that of an upper surface thereof, a greater contacting area may be formed between the connection electrodes 20*ce*, 30*ce*, 40*ce*, and 50*ce* and the light emitting stacked structure. Accordingly, the connection electrodes 20*ce*, 30*ce*, 40*ce*, and 50*ce* may be more stably formed on the light emitting stacked structure, and heat generated in the light emitting stacked structure may be more efficiently dissipated to the outside.

In some exemplary embodiments, at least one of the first through fourth connection electrodes 20*ce*, 30*ce*, 40*ce*, and 50*ce* may overlap the side surface of each of the light emitting stacks 20, 30, and 40, and thus, heat generated in the light emitting stacks 20, 30, and 40 is efficiently dissipated to the outside. In addition, when the first through fourth connection electrodes 20*ce*, 30*ce*, 40*ce*, and 50*ce* include a reflective material, such as metal, the first through fourth connection electrodes 20*ce*, 30*ce*, 40*ce*, and 50*ce* may reflect light emitted from at least one or more light emitting stacks 20, 30, and 40, thereby improving radiation efficiency.

Figure 3A:
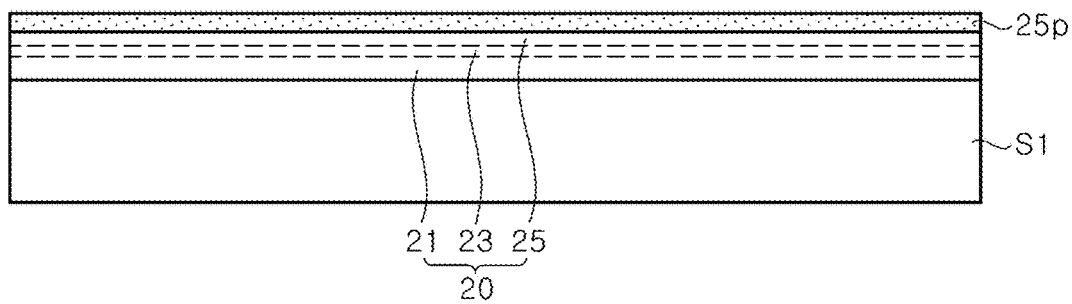
FIG. 3A is a schematic cross-sectional view illustrating a method of manufacturing a first sub-pixel of a unit pixel according to an exemplary embodiment.
Figure 3B:
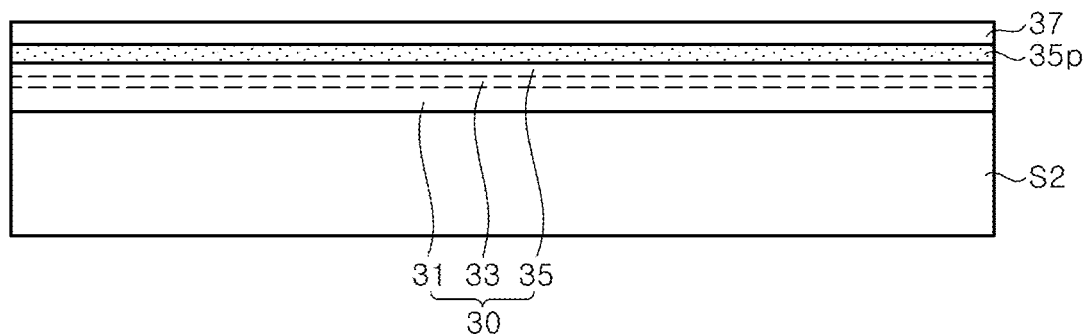
FIG. 3B is a schematic cross-sectional view illustrating a method of manufacturing a second sub-pixel of a unit pixel according to an exemplary embodiment.
Figure 3C:
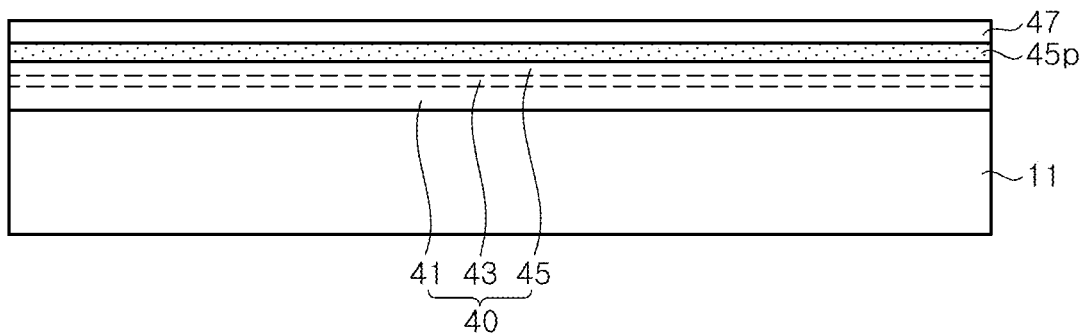
FIG. 3C is a schematic cross-sectional view illustrating a method of manufacturing a third sub-pixel of a unit pixel according to an exemplary embodiment.

FIG. 3A is a schematic cross-sectional view illustrating a method of manufacturing a first LED sub-unit of a unit pixel according to an exemplary embodiment, FIG. 3B is a schematic cross-sectional view illustrating a method of manufacturing a second LED sub-unit of the unit pixel according to an exemplary embodiment, and FIG. 3C is a schematic cross-sectional view illustrating a method of manufacturing a third LED sub-unit of the unit pixel according to an exemplary embodiment.

Referring to FIG. 3A, a first light emitting stack 20 is grown on a first temporary substrate S1. The first temporary substrate S1 may be, for example, a GaAs substrate. In addition, the first light emitting stack 20 may be formed of AlGaInP-based semiconductor layers, and includes a first conductivity type semiconductor layer 21, an active layer 23, and a second conductivity type semiconductor layer 25. A first lower contact electrode 25*p* may be formed on the second conductivity type semiconductor layer 25.

Referring to FIG. 3B, a second light emitting stack 30 is grown on a second temporary substrate S2, and a second lower contact electrode 35*p* is formed on the second light emitting stack 30. The second light emitting stack 30 may include a first conductivity type semiconductor layer 31, an active layer 33, and a second conductivity type semiconductor layer 35.

The second temporary substrate S2 is a substrate capable of growing a gallium nitride-based semiconductor layer, and may be, for example, a sapphire substrate. The second light emitting stack 30 may be formed to emit blue light, for example. Meanwhile, the second lower contact electrode 35p is in ohmic contact with the second conductivity type semiconductor layer 35. Furthermore, a first adhesion enhancement layer 37 may be formed on the second lower contact electrode 35p. The first adhesion enhancement layer 37 may be formed of, for example, $SiO_2$.

Referring to FIG. 3C, a third light emitting stack 40 is grown on a substrate 11, and a third lower contact electrode 45p is formed on the third light emitting stack 40. The third light emitting stack 40 includes a first conductivity type semiconductor layer 41, an active layer 43, and a second conductivity type semiconductor layer 45.

A third substrate 11 is a substrate capable of growing a gallium nitride-based semiconductor layer, and may be, for example, a sapphire substrate. The third light emitting to stack 40 may be formed to emit green light, for example. The third lower contact electrode 45p is in ohmic contact with the second conductivity type semiconductor layer 45. Furthermore, a second adhesion enhancement layer 47 may be formed on the third lower contact electrode 45p. The second adhesion enhancement layer 47 may be formed of, for example, $SiO_2$.

The first conductivity type semiconductor layer 41, the active layer 43, and the second conductivity type semiconductor layer 45 of the third light emitting stack 40 may be sequentially grown on the substrate 11 by, for example, a metal organic chemical vapor deposition (MOCVD) method or a molecular beam epitaxy (MBE) method. The third lower contact electrode 45p may be formed on the second conductivity type semiconductor layer 45 by, for example, a physical vapor deposition method or a chemical vapor deposition method, and may include a transparent conductive oxide (TCO), such as SnO, $InO_2$, ZnO, ITO, ITZO, or the like. When the third light emitting stack 40 emits green light, for example, the substrate 11 may include $Al_2O_3$ (e.g., a sapphire substrate), and the third lower contact electrode 45p may include a transparent conductive oxide (TCO). The first and second light emitting stacks 20 and 30 may be similarly formed by sequentially growing the first conductivity type semiconductor layer, the active layer, and the second conductivity type semiconductor layer on the temporary substrates S1 and S2, respectively. The lower contact electrodes 25p and 35p including the transparent conductive oxide (TCO) may be formed on the second conductivity type semiconductor layers 25 and 35, respectively, by, for example, the physical vapor deposition method or the chemical vapor deposition method.

Figure 4:
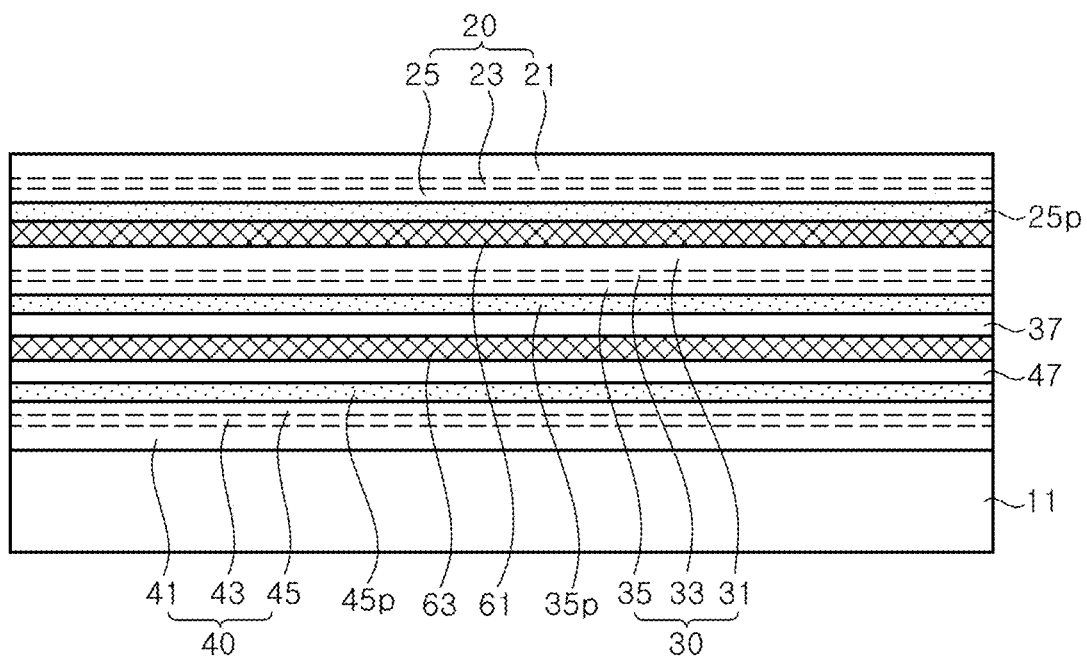
FIG. 4 is a schematic cross-sectional view illustrating a stacked structure of a unit pixel according to an exemplary embodiment.

FIG. 4 is a schematic cross-sectional view illustrating a stacked structure of the unit pixel according to an exemplary embodiment. The stacked structure of the unit pixel is formed using the first through third LED sub-units described above with reference to FIGS. 3A, 3B, and 3C.

Referring to FIG. 4, the second light emitting stack 30 described with reference to FIG. 3B is bonded to the first light emitting stack 40 described with reference to FIG. 3C. For example, the first adhesion enhancement layer 37 and the second adhesion enhancement layer 47 may be bonded so as to face each other. A second adhesive layer 63 may be formed on the second adhesion enhancement layer 47, and the first adhesion enhancement layer 37 may be adhered to the second adhesive layer 63. The second adhesive layer 63 may be, for example, a transparent organic material layer or a transparent inorganic material layer. Examples of the organic layer include SU8, poly(methylmethacrylate) (PMMA), polyimide, parylene, benzocyclobutene (BCB), or the like, and examples of the inorganic layer include $Al_2O_3$, $SiO_2$, SiNx, or the like. The organic layers may be bonded under a high vacuum and a high pressure. After surfaces of the organic layers are planarized through chemical mechanical polishing, for example, the inorganic layers may be bonded under a high vacuum by lowering a surface energy using plasma or the like.

Thereafter, the second temporary substrate S2 may be removed from the second light emitting stack 30 using a technique such as laser lift-off, chemical lift-off, or the like. In particular, the second temporary substrate S2 may be removed using the laser lift-off, and in this case, a sudden stress change may be induced in the second light emitting stack 30 and the second adhesive layer 63. The first and second adhesion enhancement layers 37 and 47 prevent the second light emitting stack 30 from being cracked or being peeled off from such a sudden stress change. Meanwhile, as the second temporary substrate S2 is removed, the first conductivity type semiconductor layer 31 of the second LED stack 30 is exposed upward. The exposed surface of the first conductivity type semiconductor layer 31 may be textured.

Subsequently, the first light emitting stack 20 is bonded to the second light emitting stack 30. In an exemplary embodiment, a first adhesive layer 61 may be formed on the first lower contact electrode 25p, and the first light emitting stack 20 may be coupled onto the second light emitting stack 30 using the first adhesive layer 61. Since the first adhesive layer 61 is formed on the first lower contact electrode 25p, the first adhesive layer 61 may be formed on the first light emitting stack 20 while the second light emitting stack 30 and the third light emitting stack 40 are bonded, and thus, a process time may be shortened. However, the inventive concepts are not limited thereto, and in other exemplary embodiments, the first adhesive layer 61 may be formed on the second light emitting stack 30, and the first light emitting stack 20 may be coupled to the second light emitting stack 30.

Thereafter, the first temporary substrate S1 is removed. The first temporary substrate S1 may be removed from the first light emitting stack 20 using, for example, an etching technique. Accordingly, the light emitting stacked structure shown in FIG. 4 is provided. The above-described unit pixel 100 is formed by processing the light emitting stacked structure.

Hereinafter, a method of manufacturing the unit pixel 100 using the light emitting stacked structure of FIG. 4 will be described in detail.

FIGS. 5A, 6A, 7A, 8A, 9A, 10A, 11A, 12A, 13A, 14A, and 15A are plan views illustrating a method of manufacturing the unit pixel 100 according to an exemplary embodiment. FIGS. 5B, 6B, 7B, 8B, 9B, 10B, 11B, 12B, 13B, 14B, and 15B are cross-sectional views taken along line A-A' of its corresponding plan view shown in FIGS. 5A, 6A, 7A, 8A, 9A, 10A, 11A, 12A, 13A, 14A, and 15A. FIGS. 5C, 6C, 7C, 8C, 9C, 10C, 11C, 12C, 13C, 14C, and 15C are schematic cross-sectional views taken along line B-B' of its corresponding plan view shown in FIGS. 5A, 6A, 7A, 8A, 9A, 10A, 11A, 12A, 13A, 14A, and 15A. FIGS. 5D, 6D, 7D, 8D, 9D, 10D, and 11D are enlarged cross-sectional views of portions of FIGS. 5B, 6B, 7B, 8B, 9B, 10B, and 11C, respectively.

Figure 5A:
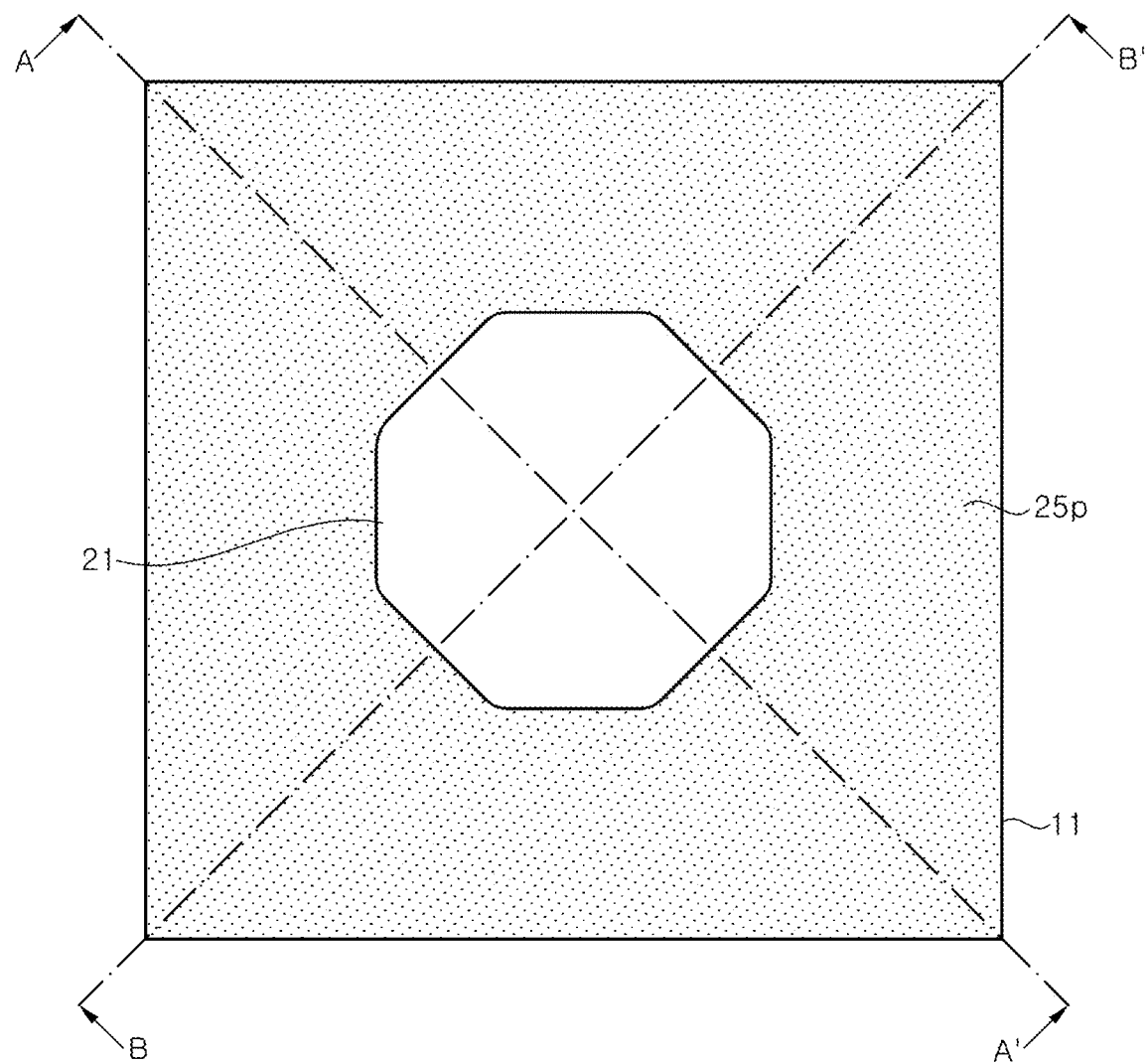
FIGS. 5A, 6A, 7A, 8A, 9A, 10A, 11A, 12A, 13A, 14A, and 15A are plan views illustrating a method of manufacturing a light emitting device according to an exemplary embodiment.
Figure 5B:
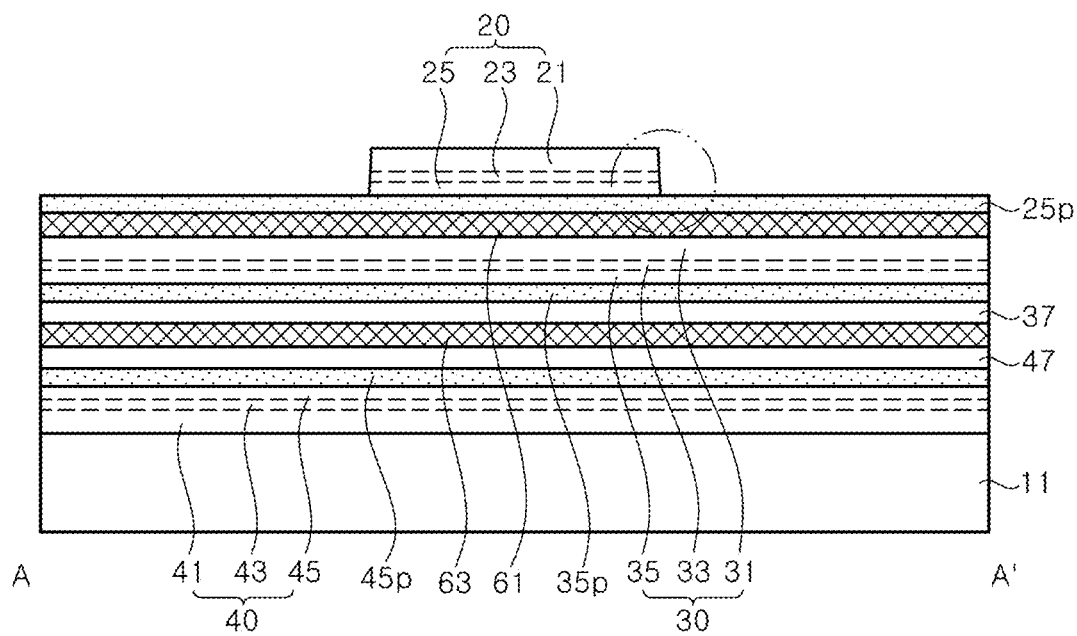
FIGS. 5B, 6B, 7B, 8B, 9B, 10B, 11B, 12B, 13B, 14B, and 15B are cross-sectional views taken along line A-A' of its corresponding plan view shown in FIGS. 5A, 6A, 7A, 8A, 9A, 10A, 11A, 12A, 13A, 14A, and 15A.
Figure 5C:
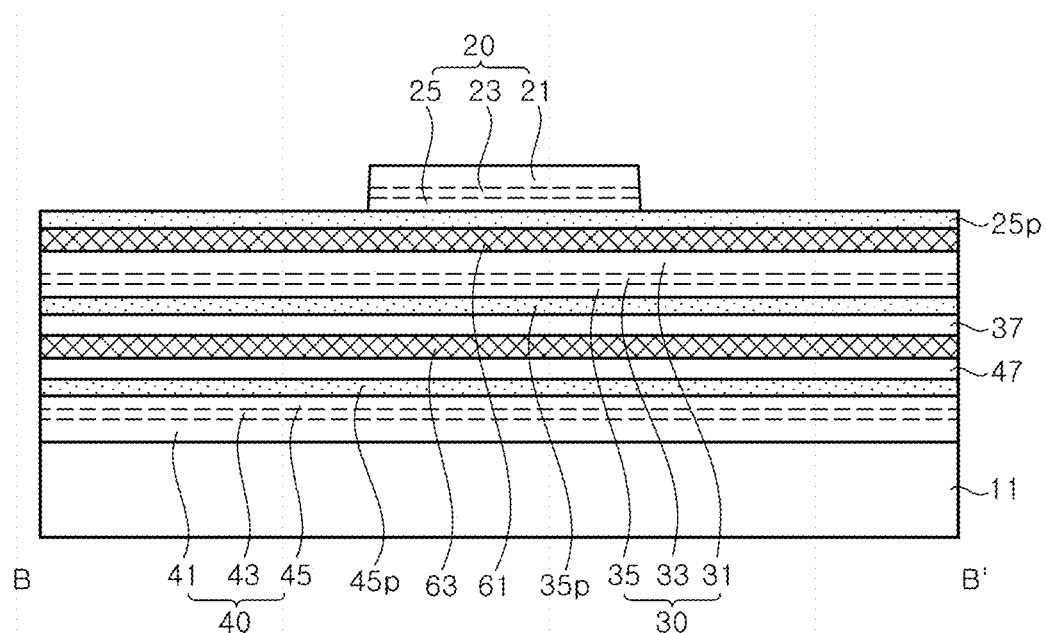
FIGS. 5C, 6C, 7C, 8C, 9C, 10C, 11C, 12C, 13C, 14C, and 15C are schematic cross-sectional views taken along line B-B' of its corresponding plan view shown in FIGS. 5A, 6A, 7A, 8A, 9A, 10A, 11A, 12A, 13A, 14A, and 15A.

First, referring to FIGS. 5A, 5B and 5C, the first lower contact electrode 25p is exposed by patterning the first conductivity type semiconductor layer 21, the active layer 23, and the second conductivity type semiconductor layer 25. The first conductivity type semiconductor layer 21, the active layer 23, and the second conductivity type semiconductor layer 25 may be patterned using photolithography and etching processes. The photolithography process may be performed using a first mask, and the first conductivity type semiconductor layer 21, the active layer 23, and the second conductivity type semiconductor layer 25 may be etched, for example, using a dry etching technique. After patterning, the first light emitting stack 20 is surrounded by the exposed first lower contact electrode 25p when viewed in plan. Although one first light emitting stack 20 is illustrated herein, the first light emitting stack 20 may be patterned in each of unit pixel regions on the substrate 11.

The first light emitting stack 20 may be disposed in a central portion of the unit pixel region, without being limited thereto. Meanwhile, a planar shape of the first light emitting stack 20 may have a symmetrical structure. For example, the planar shape of the first light emitting stack 20 may have a symmetrical structure such as a mirror symmetrical structure or a rotational symmetrical structure. The unit pixel 100 may have a rectangular or square shape, and the planar shape of the first light emitting stack 20 may have a mirror symmetrical structure with respect to a vertical plane passing through a straight line parallel to a lateral edge of the unit pixel and/or a vertical plane passing through a straight line parallel to a vertical edge of the unit pixel. The planar shape of the first light emitting stack 20 may have, for example, an octagonal, hexagonal, or rhombus shape, and further, may have a regular octagonal, regular hexagonal, or square shape, without being limited thereto.

Figure 5D:
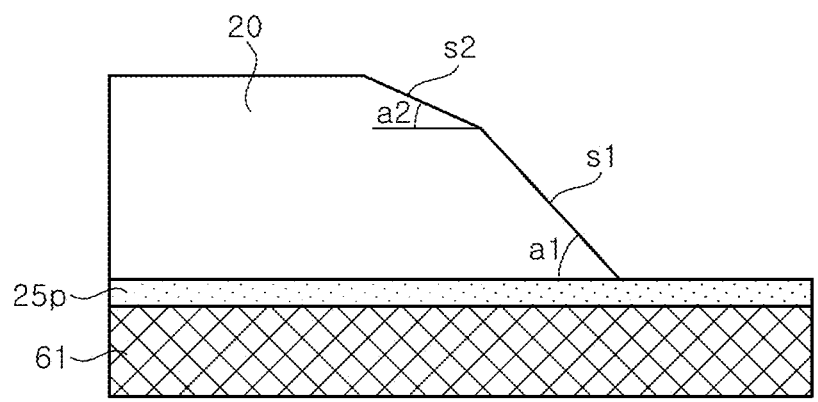
FIGS. 5D, 6D, 7D, 8D, 9D, 10D, and 11D are enlarged cross-sectional views of portions of FIGS. 5B, 6B, 7B, 8B, 9B, 10B, and 11C, respectively.

Meanwhile, as shown in FIG. 5D, the first light emitting stack 20 may have inclined side surfaces s1 and s2. For example, a first side surface s1 of the first light emitting stack 20 may include a side surface having an inclination angle a1 within a range of about of about 30 degrees to about 70 degrees with respect to a plane parallel to a top surface of the third light emitting stack 40, further, an inclination angle of about 40 degrees to about 70 degrees. A second side surface s2 of the first light emitting stack 20 may have an inclination angle a2 less than the inclination angle a1. The first side surface s1 and the second side surface s2 may be continuous, without being limited thereto, or a side surface having a different inclination angle may be interposed between the first side surface s1 and the second side surface s2.

Figure 6A:
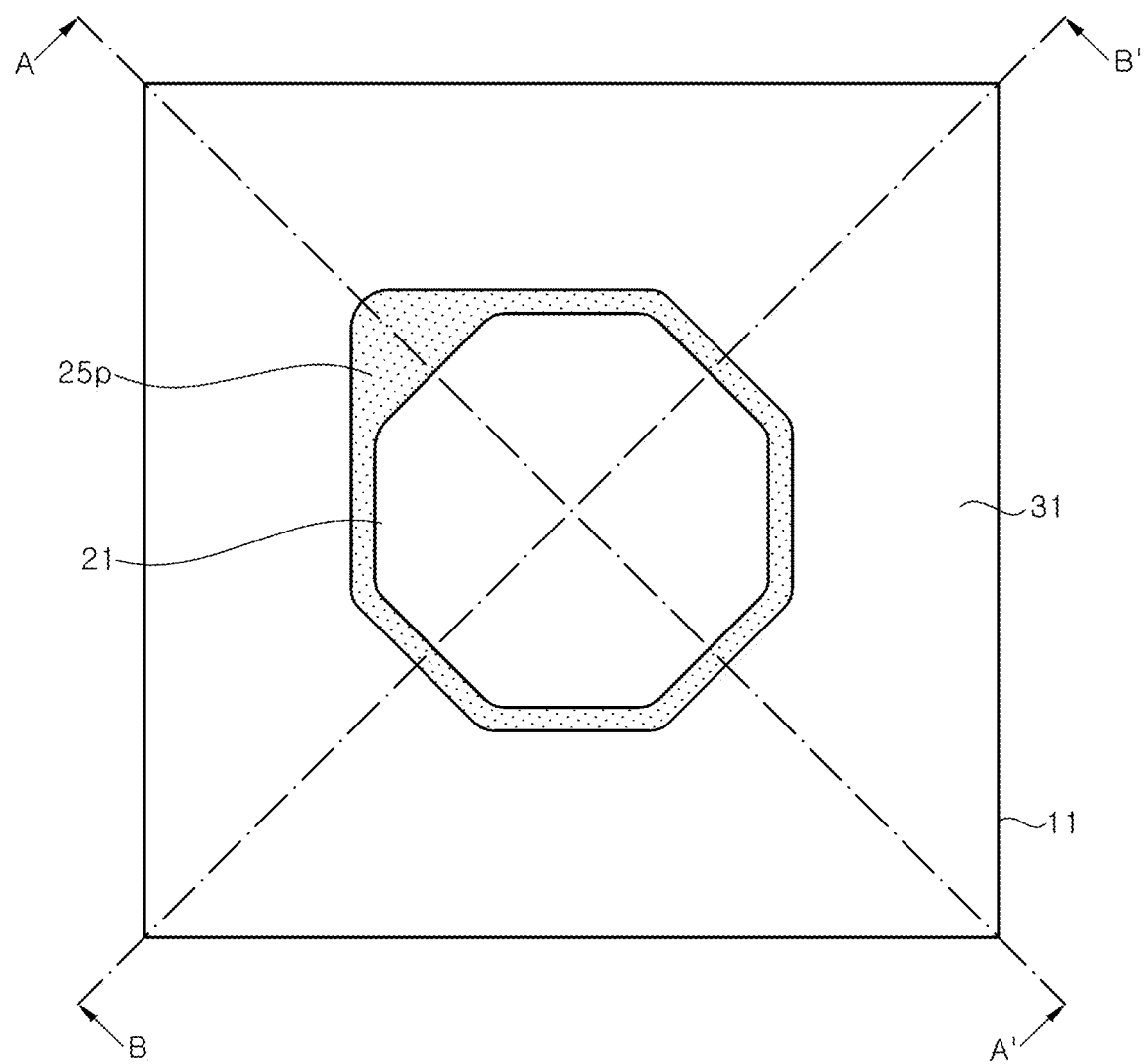
Figure 6B:
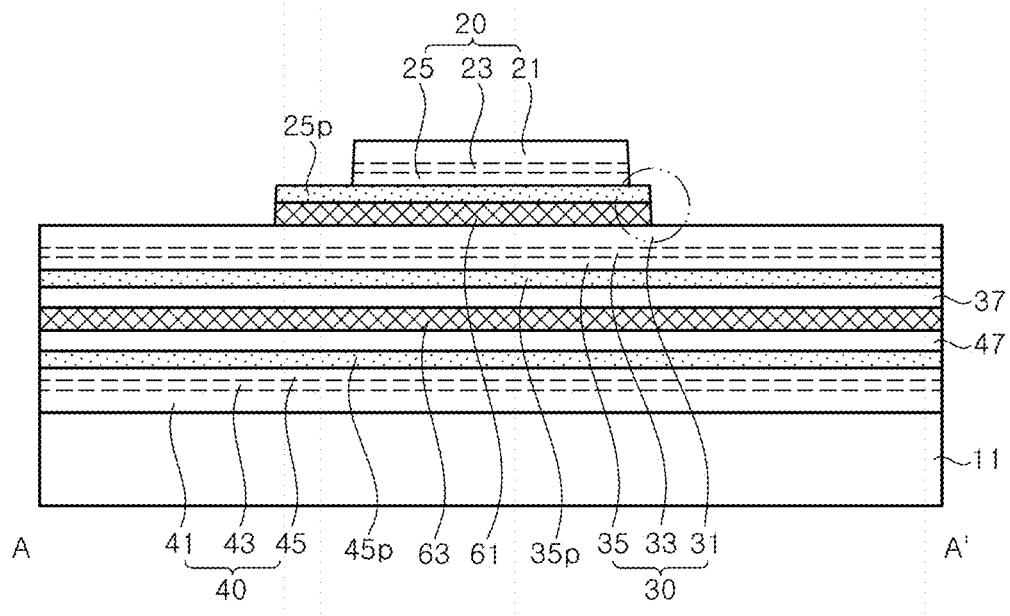
Figure 6C:
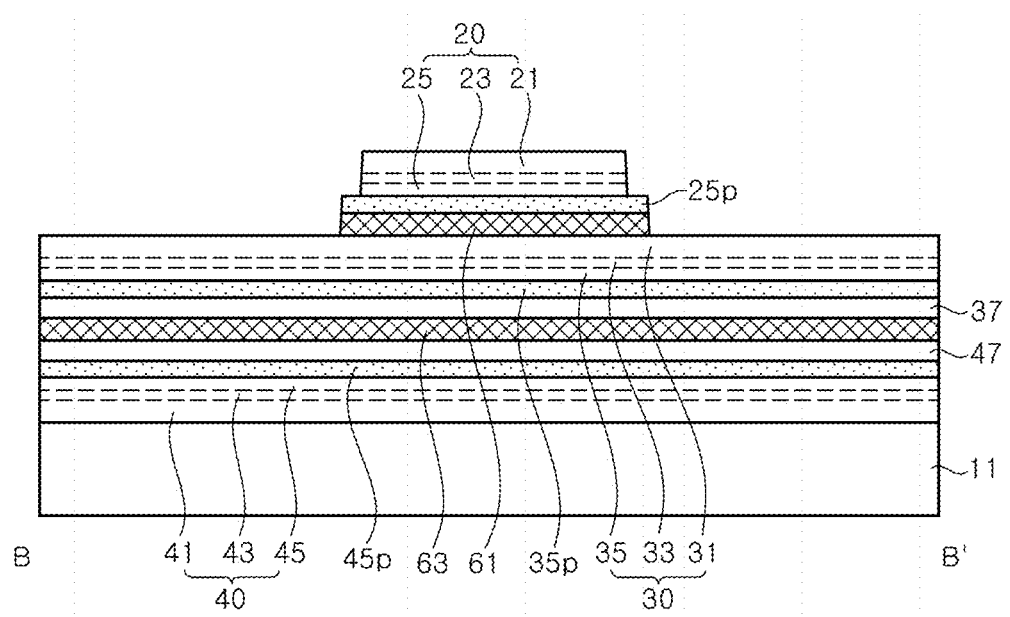

Referring to FIGS. 6A, 6B, and 6C, the first lower contact electrode 25p is patterned such that a portion of the first lower contact electrode 25p is retained around the first light emitting stack 20. The first lower contact electrode 25p may be patterned using a second mask. In this case, the first adhesive layer 61 may also be patterned together. Accordingly, the first conductivity type semiconductor layer 31 of the second light emitting stack 30 may be exposed around the first lower contact electrode 25p.

A planar shape of the first lower contact electrode 25p is substantially similar to that of the first light emitting stack 20, except that a protrusion (a portion near one end of the lead line of the reference number 25p) is included on one side of the first light emitting stack 20. The protrusion is disposed in a diagonal direction of the unit pixel 100. A region of the first lower contact electrode 25p excluding the protrusion may have a shape substantially identical to the planar shape of the first light emitting stack 20. In a particular exemplary embodiment, the first lower contact electrode 25p may have a mirror symmetrical structure with respect to a vertical plane passing through line A-A', and may have an asymmetrical structure with respect to a vertical plane passing through line B-B'.

Figure 6D:
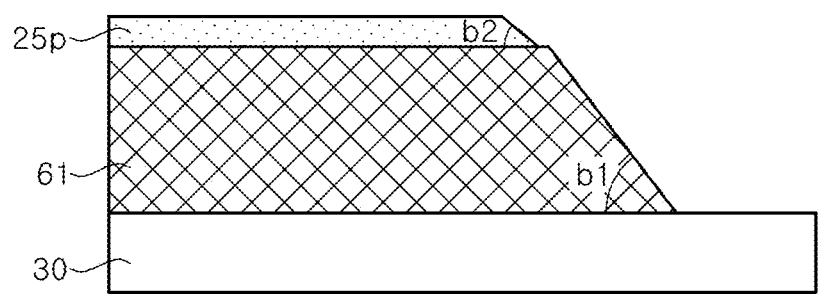

Meanwhile, as shown in FIG. 6D, the first adhesive layer 61 may be formed to have an inclined side surface. For example, the first adhesive layer 61 may have an inclination angle b1 within a range of about 20 degrees to about 70 degrees with respect to the plane parallel to the top surface of the third light emitting stack 40. In addition, the first lower contact electrode 25p may also be formed to have an inclined side surface. The first lower contact electrode 25p may have an inclination angle b2 within a range of about 5 degrees to about 60 degrees with respect to the plane parallel to the top surface of the third light emitting stack 40.

Figure 7A:
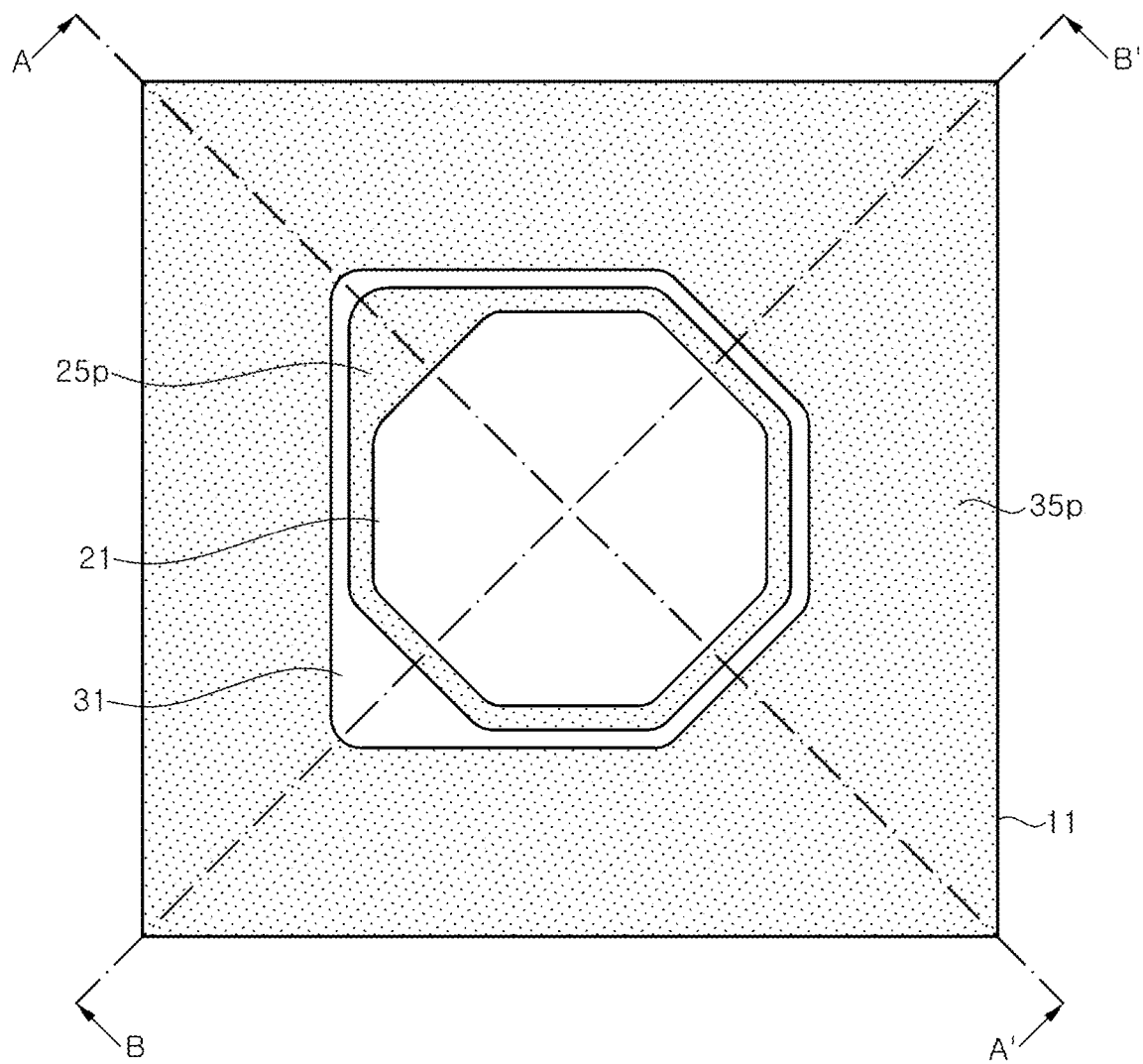
Figure 7B:
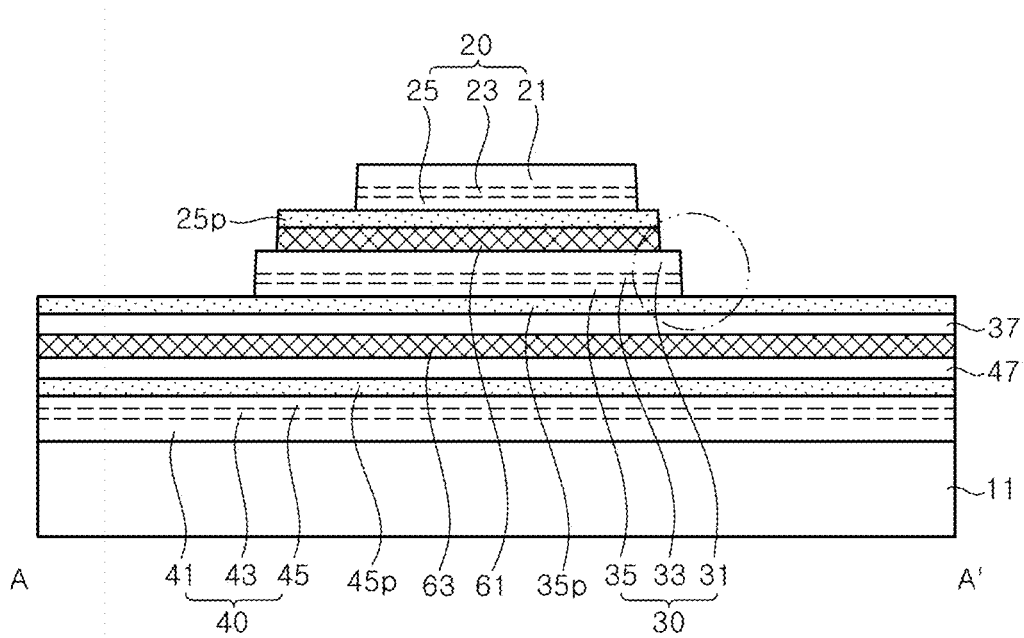
Figure 7C:
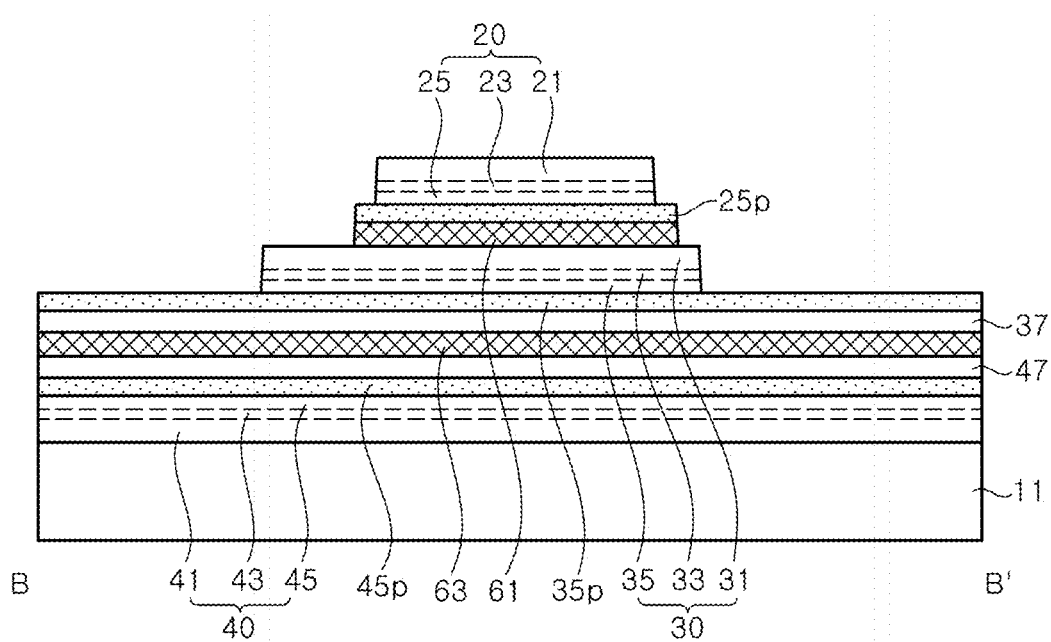

Referring to FIGS. 7A, 7B, and 7C, the second lower contact electrode 35p is exposed by patterning the first conductivity type semiconductor layer 31, the active layer 33, and the second conductivity type semiconductor layer 35. The first conductivity type semiconductor layer 31, the active layer 33, and the second conductivity type semiconductor layer 35 may be patterned using photolithography and etching processes. The photolithography process may be performed using a third mask, and the first conductivity type semiconductor layer 31, the active layer 33, and the second conductivity type semiconductor layer 35 may be etched using, for example, a dry etching technique. After patterning, the second light emitting stack 30 is surrounded by the exposed second lower contact electrode 35p when viewed in plan.

A planar shape of the second light emitting stack 30 is substantially similar to that of the first lower contact electrode 25p, except that a protrusion (a portion near one end of the lead line of the reference number 31) is included on one side of the first lower contact electrode 25p. A region of the second light emitting stack 30 excluding the protrusion may have a shape substantially identical to the planar shape of the first lower contact electrode 25p. Accordingly, the second light emitting stack 30 has the shape substantially similar to the planar shape of the first light emitting stack 20, but has protrusions at two portions in the diagonal direction of the unit pixel 100. In a particular exemplary embodiment, the second light emitting stack 30 has a mirror symmetrical structure with respect to a vertical plane dividing an upper part from a lower part of the second light emitting stack 30, that is, the vertical plane passing through a straight line parallel to the lateral edge of the unit pixel 100. Except for the protrusion of the first lower contact electrode 25p and the protrusion of the second light emitting stack 30, the second light emitting stack 30 may have substantially the same planar shape as that of the first light emitting stack 20.

Figure 7D:
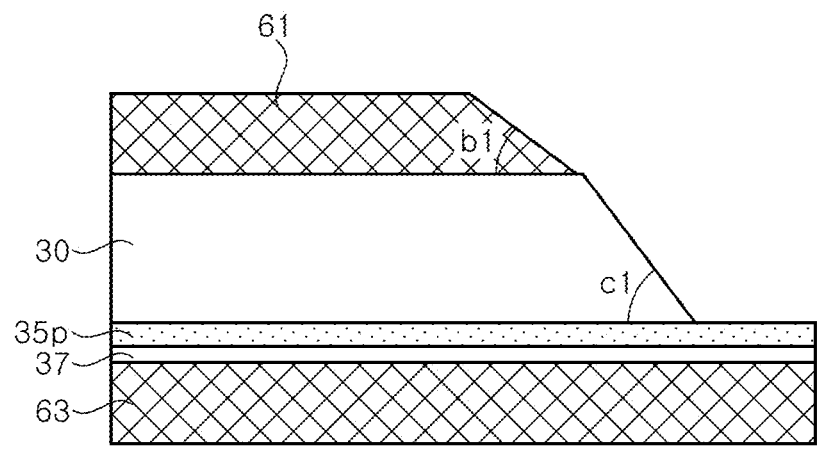

As shown in FIG. 7D, the second light emitting stack 30 may be formed to have an inclined side surface. For example, the second light emitting stack 30 may include a side surface having an inclination angle c1 within a range of about 30 degrees to about 70 degrees with respect to the plane parallel to the top surface of the third light emitting stack 40. The side surface of the second light emitting stack 30 may be inclined with two or more steps. In an exemplary embodiment, the inclination angle c1 of the second light emitting stack 30 may be greater than the inclination angle b1 of the first adhesive layer 61. Accordingly, the side surface of the first adhesive layer 61 and the side surface of the second light emitting stack 30 may form a gentle slope as a whole.

Figure 8A:
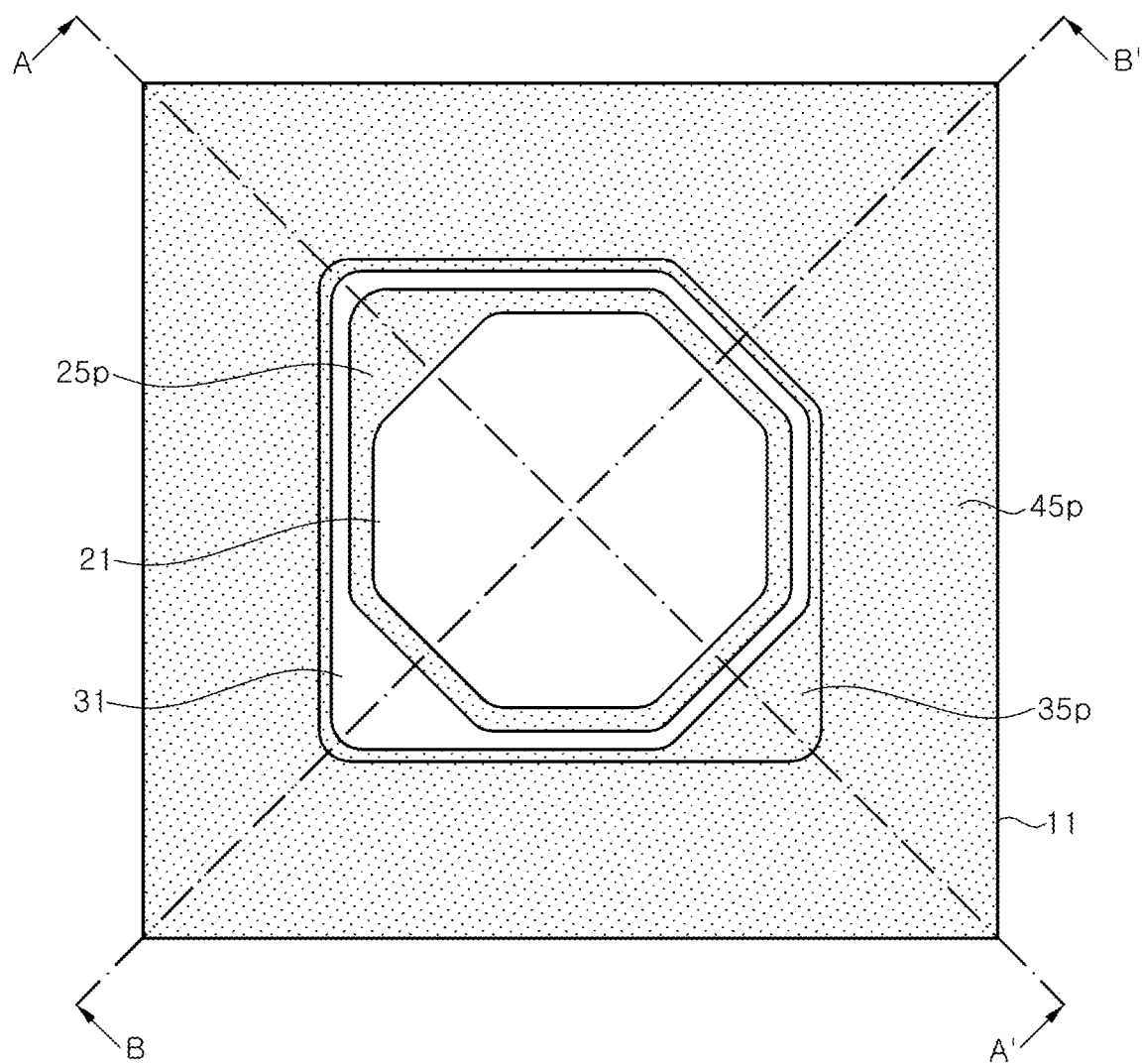
Figure 8B:
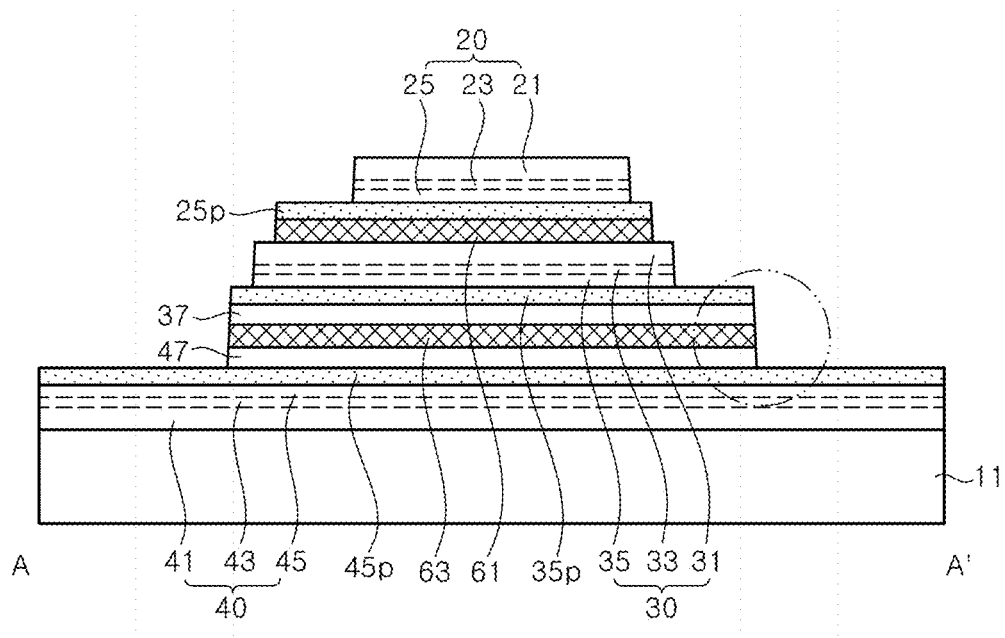
Figure 8C:
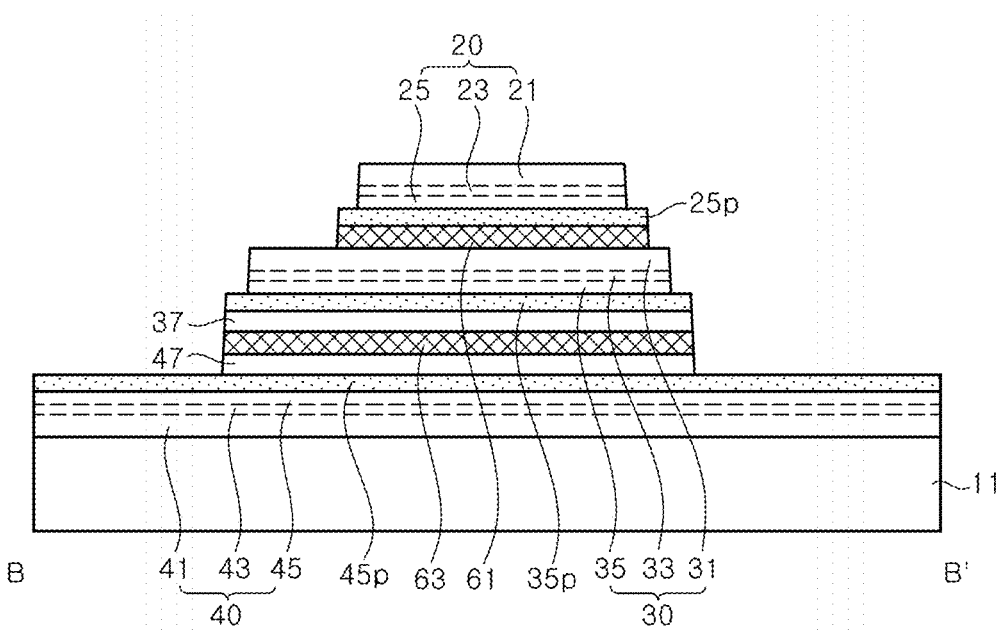

Referring to FIGS. 8A, 8B, and 8C, the second lower contact electrode 35p is patterned such that a portion of the second lower contact electrode 35p is retained around the second light emitting stack 30. The second lower contact electrode 35p may be patterned using a fourth mask. In this case, the first adhesion enhancement layer 37, the second adhesive layer 63, and the second adhesion enhancement layer 47 may also be patterned together. Accordingly, the third lower contact electrode 45p may be exposed around the second lower contact electrode 35p.

A planar shape of the second lower contact electrode 35p is substantially similar to that of the second light emitting stack 30, except that a protrusion (a portion near one end of the lead line of the reference number 35p) is included on one side of the second light emitting stack 30. A region of the second lower contact electrode 35p excluding the protrusion may have a shape substantially identical to the planar shape of the second light emitting stack 30. In a particular exemplary embodiment, the second lower contact electrode 35p may have a mirror symmetrical structure with respect to the vertical plane passing through line B-B', and may have an asymmetrical structure with respect to the vertical plane passing through line A-A'.

Figure 8D:
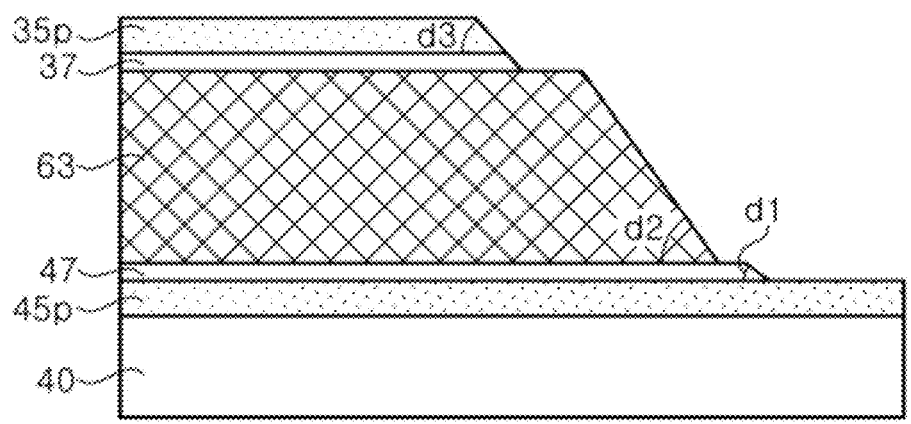

Meanwhile, as shown in FIG. 8D, the second adhesion enhancement layer 47 may be formed to have an inclined side surface. The second adhesion enhancement layer 47 may include, for example, a side surface having an inclination angle d1 within a range of about 5 degrees to about 60 degrees with respect to the plane parallel to the top surface of the third light emitting stack 40. In addition, the second adhesive layer 63 may be formed to have an inclined side surface. For example, the second adhesive layer 63 may have an inclination angle d2 within a range of about 30 degrees to about 70 degrees with respect to the plane parallel to the top surface of the third light emitting stack 40. In addition, the first adhesion enhancement layer 37 may also include an inclined side surface, and may have an inclination angle d1 similar to that of the second adhesion enhancement layer 47. The second lower contact electrode 35p may also be formed to have an inclined side surface. The second lower contact electrode 35p may have an inclination angle d3 in a range of about 5 degrees to about 60 degrees with respect to the plane parallel to the top surface of the third light emitting stack 40. The second adhesive layer 63 may be thicker than the first adhesion enhancement layer 37, the second lower contact electrode 35p, or the second adhesion enhancement layer 47, and the inclination angle d2 of the second adhesive layer 63 may be greater than the inclination angles d1 and d3 of the first adhesion enhancement layer 37, the second lower contact electrode 35p, or the second adhesion enhancement layer 47.

Figure 9A:
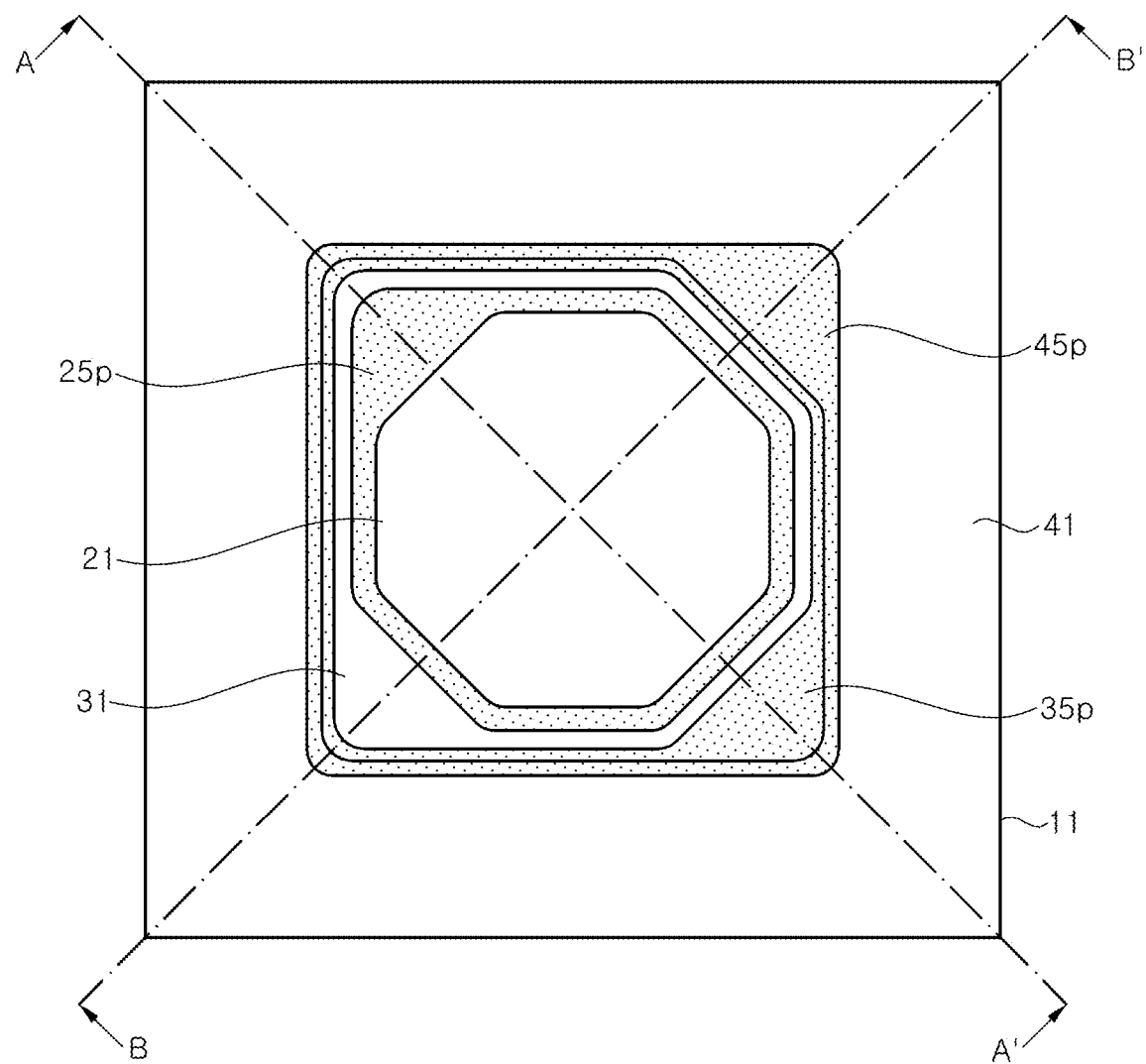
Figure 9B:
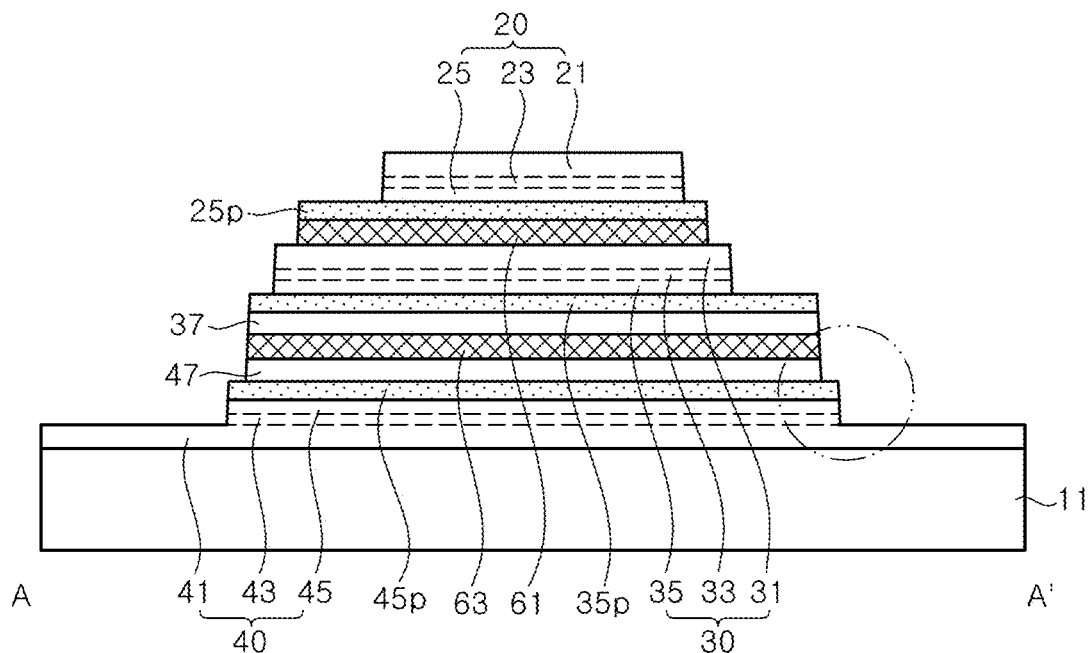
Figure 9C:
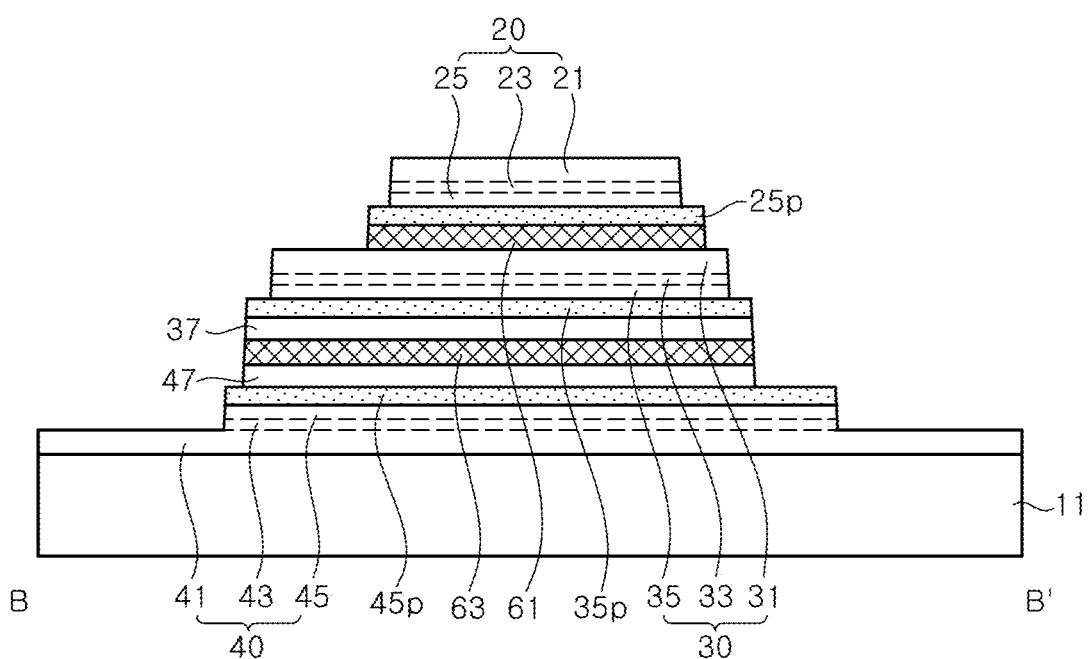

Referring to FIGS. 9A, 9B, and 9C, the third lower contact electrode 45p is patterned such that the third lower contact electrode 45p is retained around the second lower contact electrode 35p. The third lower contact electrode 45p may be patterned using a fifth mask. Furthermore, the first conductivity type semiconductor layer 41 may be exposed by patterning the second conductivity type semiconductor layer 45 and the active layer 43. For example, the third lower contact electrode 45p, the second conductivity type semiconductor layer 45, and the active layer 43 may be etched using a dry etching technique. Accordingly, the first conductivity type semiconductor layer 41 is exposed around the third lower contact electrode 45p. In addition, a mesa may be formed on the exposed first conductivity type semiconductor layer 41. The mesa may include a portion of the first conductivity type semiconductor layer 41, the active layer 43, and the second conductivity type semiconductor layer 45.

A planar shape of the third lower contact electrode 45p is substantially similar to that of the second lower contact electrode 35p, except that a protrusion (a portion near one end of the lead line of the reference number 45p) is included on one side of the second lower contact electrode 35p. A region of the third lower contact electrode 45p excluding the protrusion may have a shape substantially identical to the planar shape of the second lower contact electrode 35p. In a particular exemplary embodiment, the planar shape of the third lower contact electrode 45p may have a mirror symmetrical structure with respect to the vertical plane passing through line A-A', and may have a symmetrical structure with respect to the vertical plane passing through line B-B'. Furthermore, the planar shape of the third lower contact electrode 45p may be substantially rectangular or square.

According to the illustrated exemplary embodiment, the first light emitting stack 20 has a smallest area among the light emitting stacks 20, 30, and 40. Meanwhile, the third light emitting stack 40 may have a largest area among the light emitting stacks 20, 30, and 40, and thus, a luminous intensity of the third light emitting stack 40 may be relatively increased.

Figure 9D:
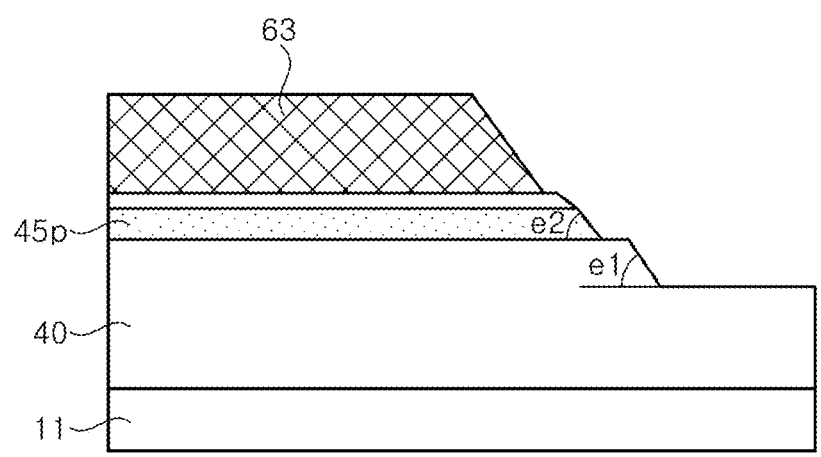

Meanwhile, as shown in FIG. 9D, the third light emitting stack 40 may include an inclined side surface. For example, a mesa of the third light emitting stack 40 may include an inclined side surface. The inclined side surface of the third light emitting stack 40 may have, for example, an inclination angle e1 within a range of about 30 degrees to about 70 degrees with respect to a plane parallel to the top surface of the third light emitting stack 40.

Meanwhile, the third lower contact electrode 45p may also be formed to have an inclined side surface. The third lower contact electrode 45p may have an inclination angle e2 within a range of about 5 degrees to about 60 degrees with respect to the plane parallel to the top surface of the third light emitting stack 40. In an exemplary embodiment, the inclination angle e1 may be greater than the inclination angle e2.

Figure 10A:
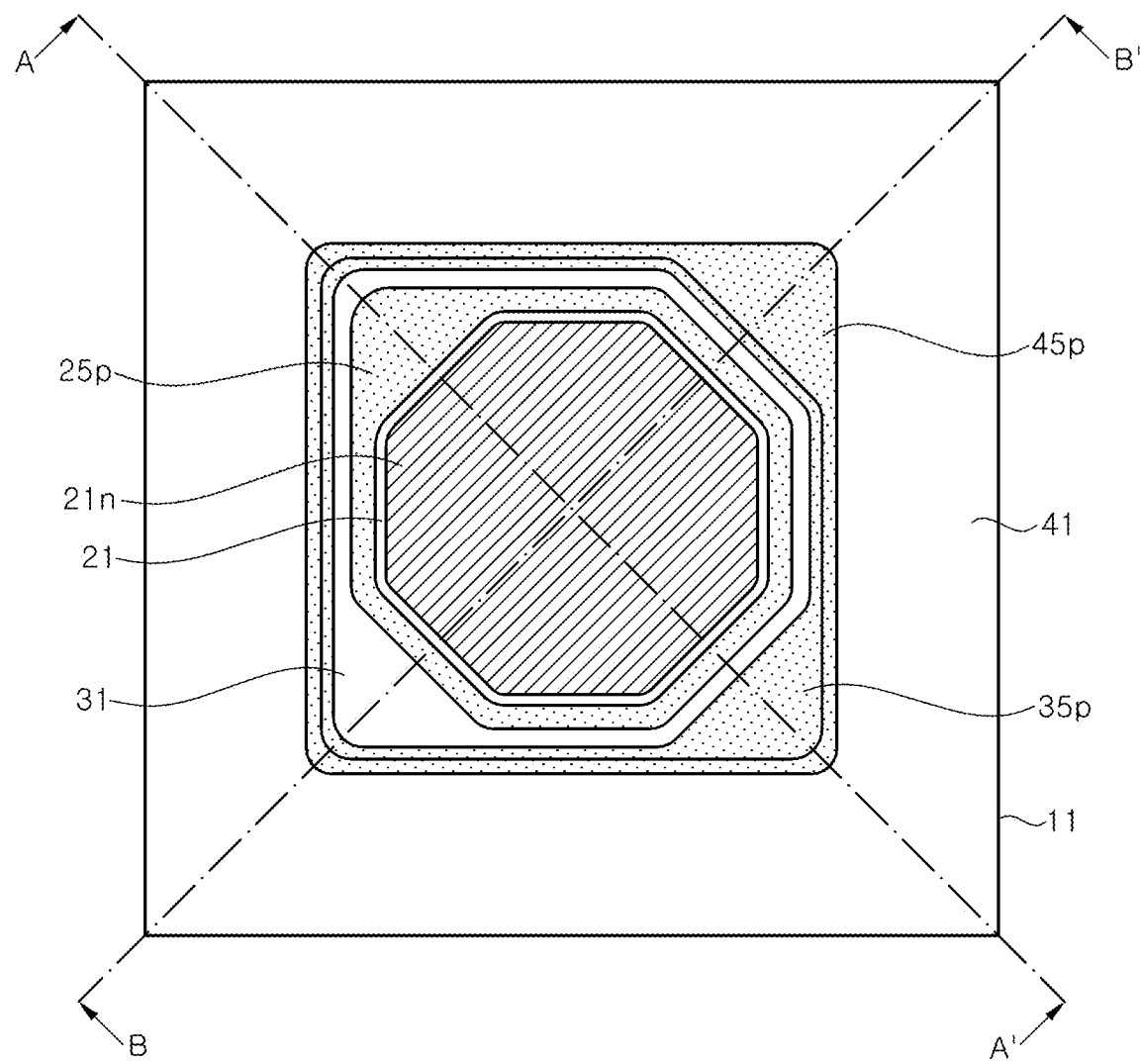
Figure 10B:
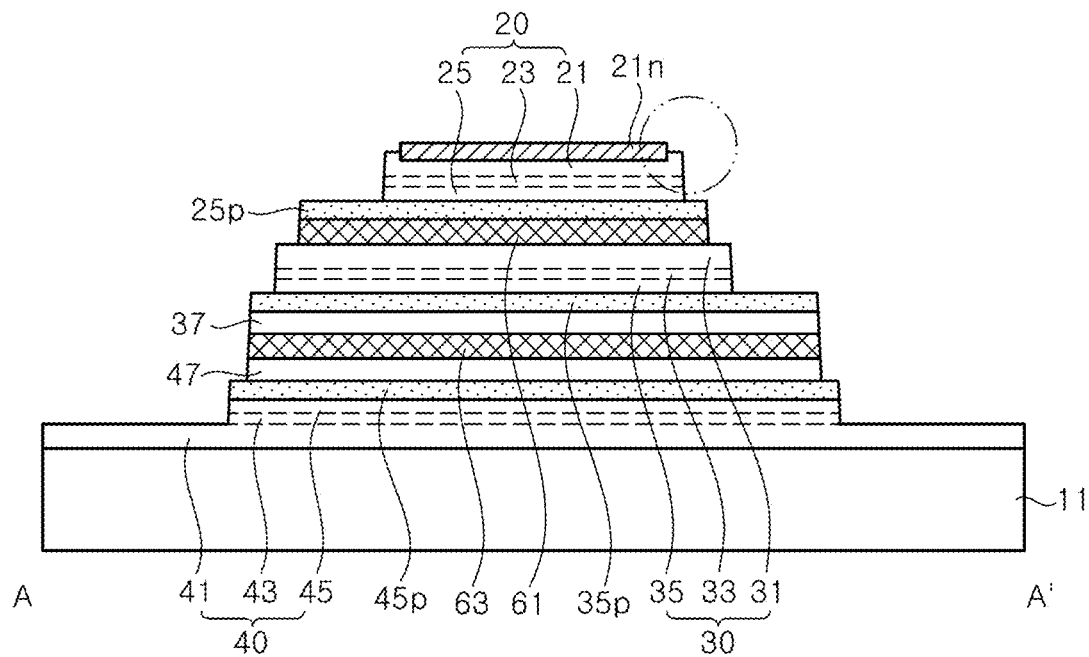
Figure 10C:
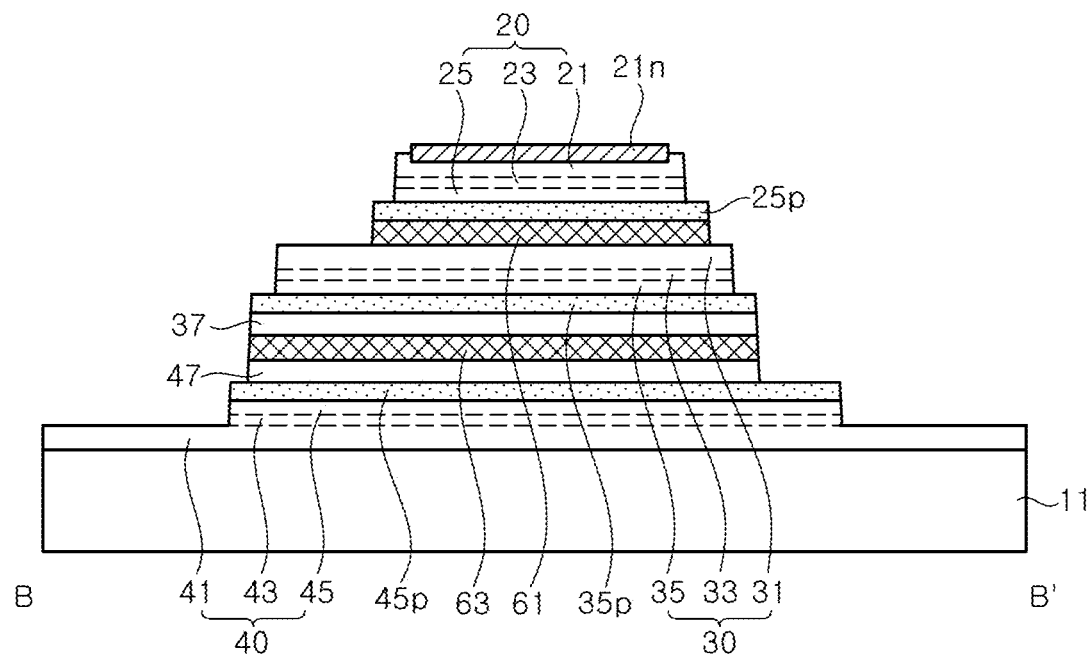

Referring to FIGS. 10A, 10B, and 10C, a portion of an upper surface of the first conductivity type semiconductor layer 21 of the first light emitting stack 20 may be patterned through wet-etching so as to form a first upper contact electrode 21n. The first conductivity type semiconductor layer 21 may be, for example, an $n^{++}$ GaAs layer, and a portion of an upper surface of the $n^{++}$ GaAs layer may be recessed through wet etching.

The first upper contact electrode 21n may be formed in a recessed region of the first conductivity type semiconductor layer 21. The first upper contact electrode 21n may be formed of, for example, AuGe/Ni/Au/Ti, and may have a thickness of, for example, 100 nm/25 nm/100 nm/10 nm. Ohmic contact characteristics may be improved by partially removing the surface of the $n_{++}$ GaAs layer and allowing the first upper contact electrode 21n to contact the first conductivity type semiconductor layer 21 in the recessed region.

The first upper contact electrode 21n may have an area smaller than that of the first light emitting stack 20. However, the first upper contact electrode 21n may have a planar shape substantially identical to that of the first light emitting stack 20, without being limited thereto.

Figure 10D:

As shown in FIG. 10D, a sidewall of the recessed region of the first light emitting stack 20 (e.g., the first conductivity type semiconductor layer 21) may be formed as a gently inclined surface. For example, the sidewall of the recessed region may have an inclination angle f1 within a range of about 30 degrees to about 70 degrees with respect to the plane parallel to the top surface of the third light emitting stack 40.

Meanwhile, the first upper contact electrode 21n may include side surfaces having inclination angles f2 and f3 within a range of about 20 degrees to about 70 degrees with respect to the plane parallel to the top surface of the third light emitting stack 40. The inclination angle f3 may be less than the inclination angle f2.

Figure 11A:
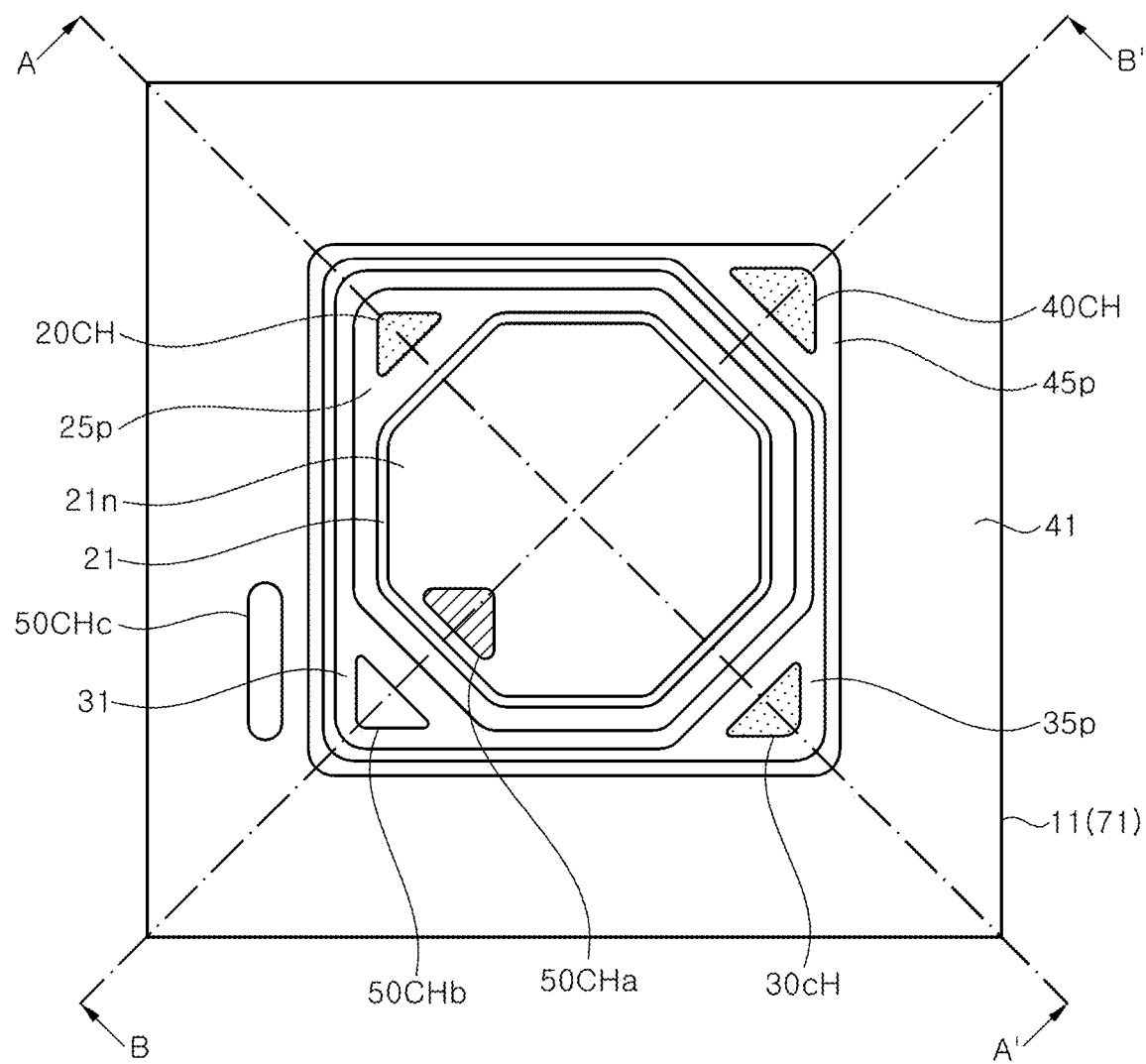
Figure 11B:
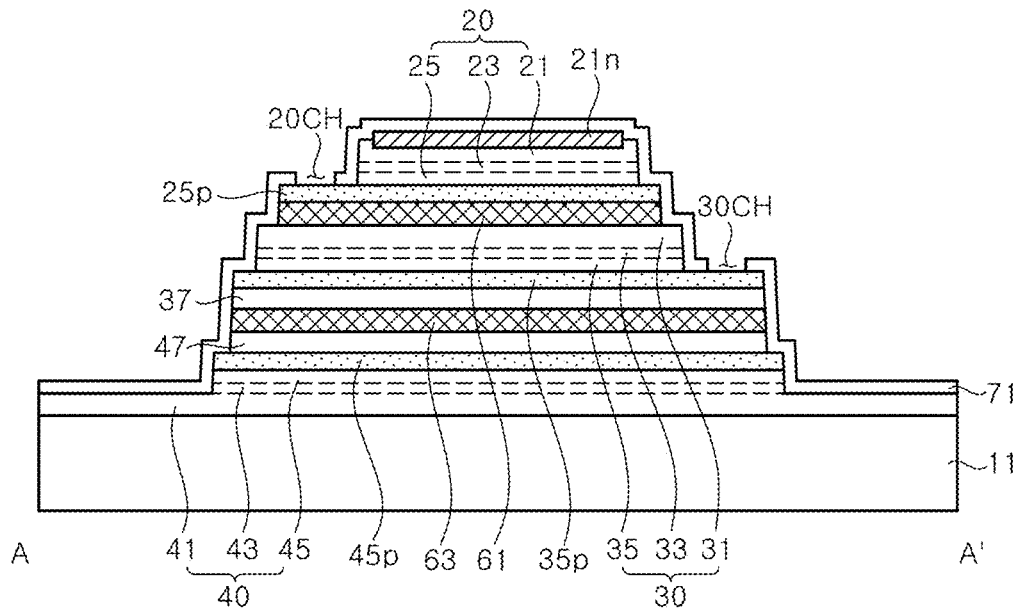
Figure 11C:
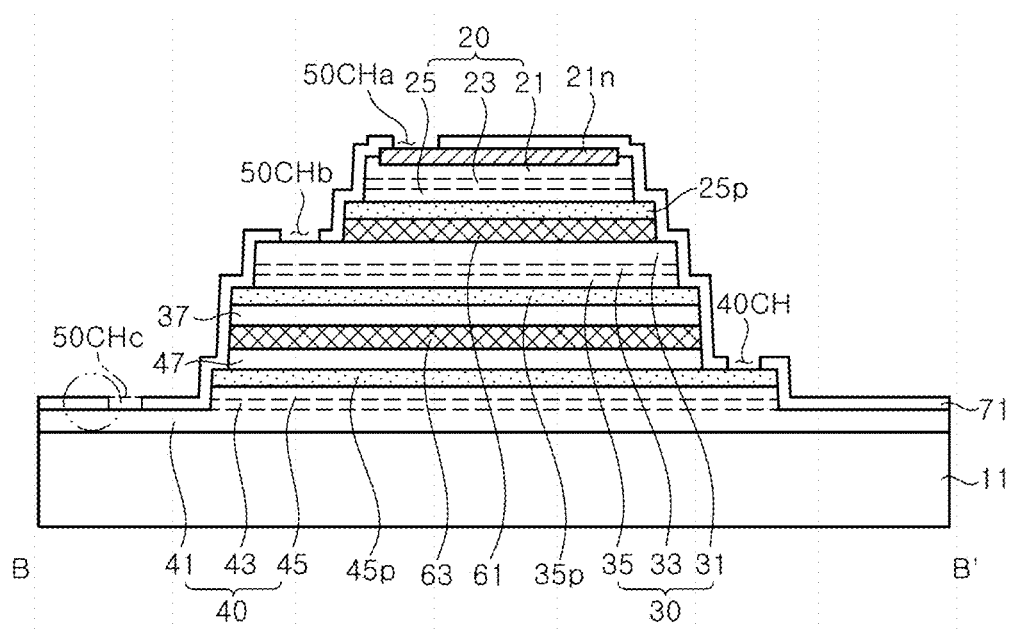

Referring to FIGS. 11A, 11B and 11C, a first insulation layer 71 covering the first through third light emitting stacks 20, 30, and 40 is formed. The first insulation layer 71 covers the first upper contact electrode 21n. The first insulation layer 71 may be formed of, for example, SiN, $SiO_2$, $Al_2O_3$, or the like and has a thickness of about 4000 Å.

Meanwhile, a portion of the first insulation layer 71 may be partially removed so as to form first, second, third, and fourth contact holes 20CH, 30CH, 40CH, and 50CH. The first contact hole 20CH is defined on the first lower contact electrode 25p to expose a portion of the first lower contact electrode 25p. The second contact hole 30CH may be defined on the second lower contact electrode 35p to expose the second lower contact electrode 35p. The third contact hole 40CH may be defined on the third lower contact electrode 45p to expose the third lower contact electrode 45p.

The fourth contact hole 50CH provides a path for allowing electrical connection to the first conductivity type semiconductor layers 21, 31, and 41 of the first through third light emitting stacks 20, 30, and 40. The fourth contact hole 50CH may include a first sub-contact hole 50CHa, a second sub-contact hole 50CHb, and a third sub-contact hole 50CHc. The first sub-contact hole 50CHa may be defined on the first conductivity type semiconductor layer 21 to expose a portion of the first upper contact electrode 21n, and the second sub-contact hole 50CHb may be defined on the first conductivity type semiconductor layer 31 to expose a portion of the first conductivity type semiconductor layer 31, and the third sub-contact hole 50CHc may be defined on the first conductivity type semiconductor layer 41 to expose a portion of the first conductivity type semiconductor layer 41. In FIG. 11C, the third sub-contact hole 50CHc is indicated with a dotted line to exemplarily illustrate its position in a cross-sectional view of the unit pixel 100.

The first contact hole 20CH, the second contact hole 30CH, the third contact hole 40CH, and the second sub-contact hole 50CHb may be disposed on the protrusions disposed at the outside of the first light emitting stack 20, respectively. Meanwhile, the first sub-contact hole 50CHa may be disposed on the first upper contact electrode 21n, and the third sub-contact hole 50CHc may be disposed on the first conductivity type semiconductor layer 41 outside of the third lower contact electrode 45p.

Figure 11D:
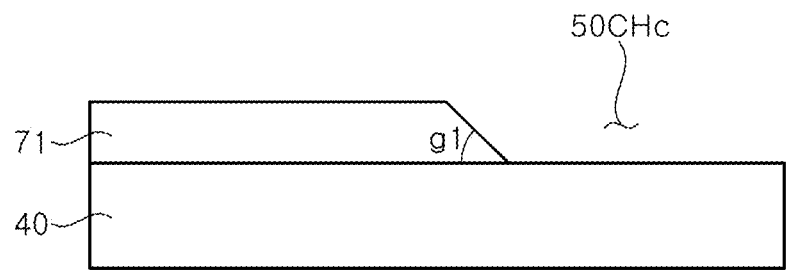

As shown in FIG. 11D, the contact holes 20CH, 30CH, 40CH, 50CHa, 50CHb, and 50CHc formed in the first insulation layer 71 may be defined by inclined sidewalls. The sidewalls defining the contact holes 20CH, 30CH, 40CH, 50CHa, 50CHb, and 50CHc may have inclination angles g1 within a range of about 10 degrees to about 70 degrees with respect to the plane parallel to the top surface of the third light emitting stack 40.

Figure 12A:
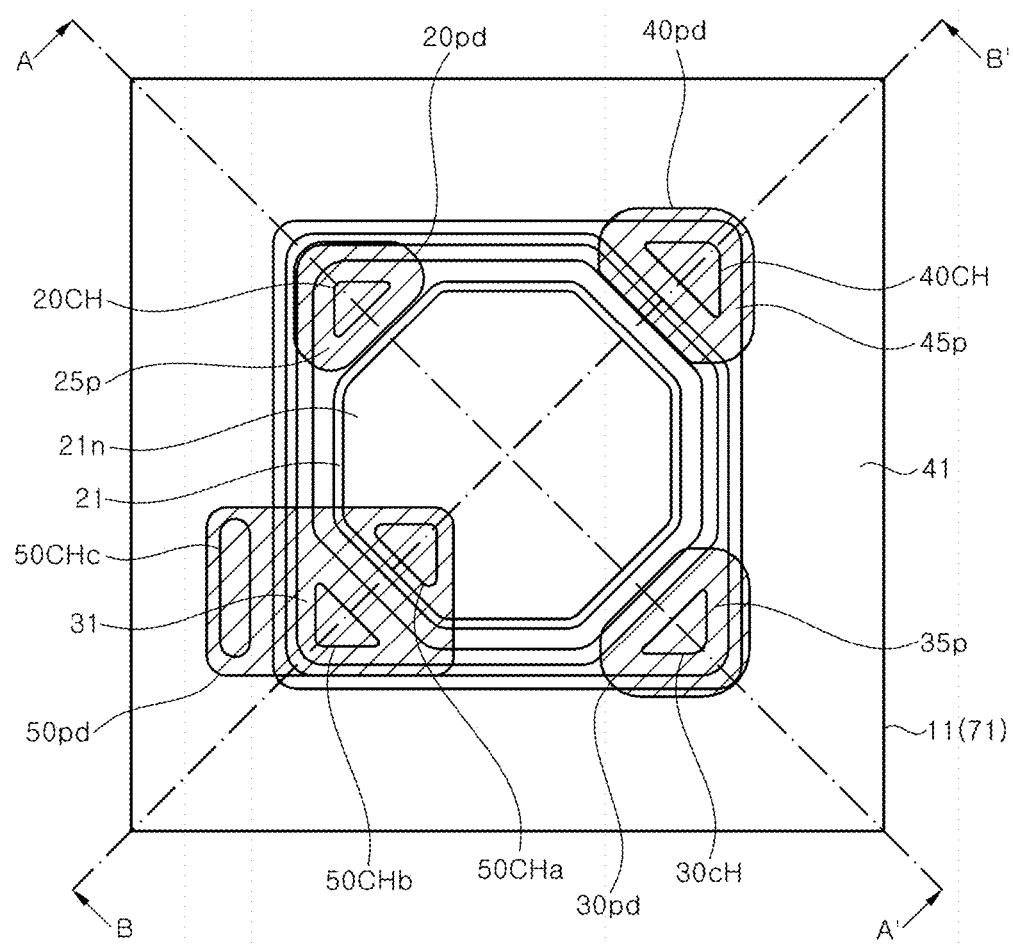
Figure 12B:
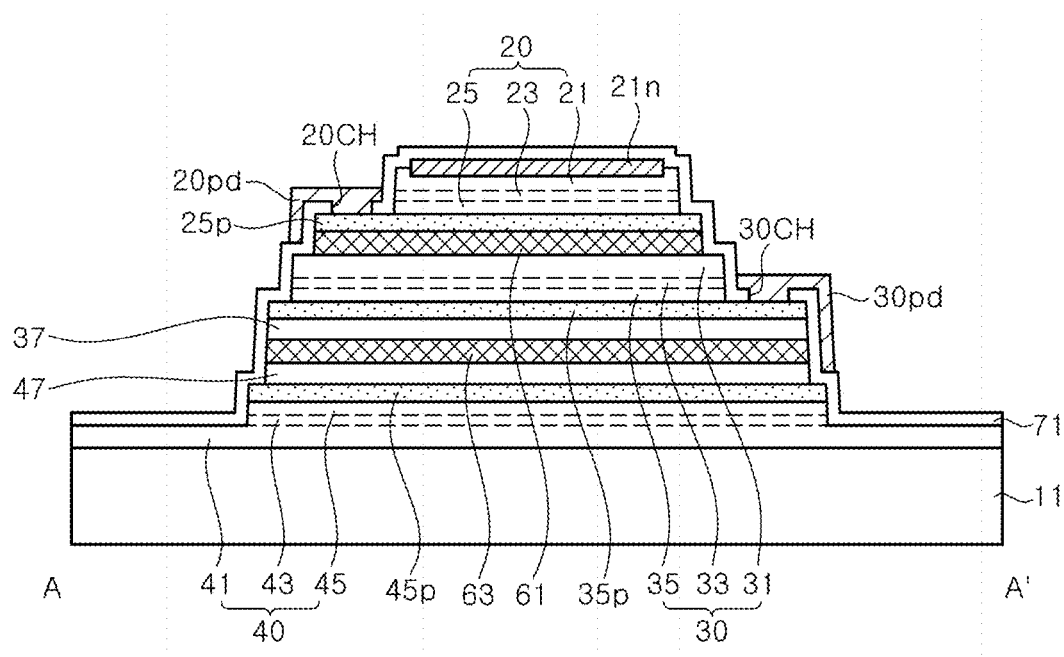
Figure 12C:
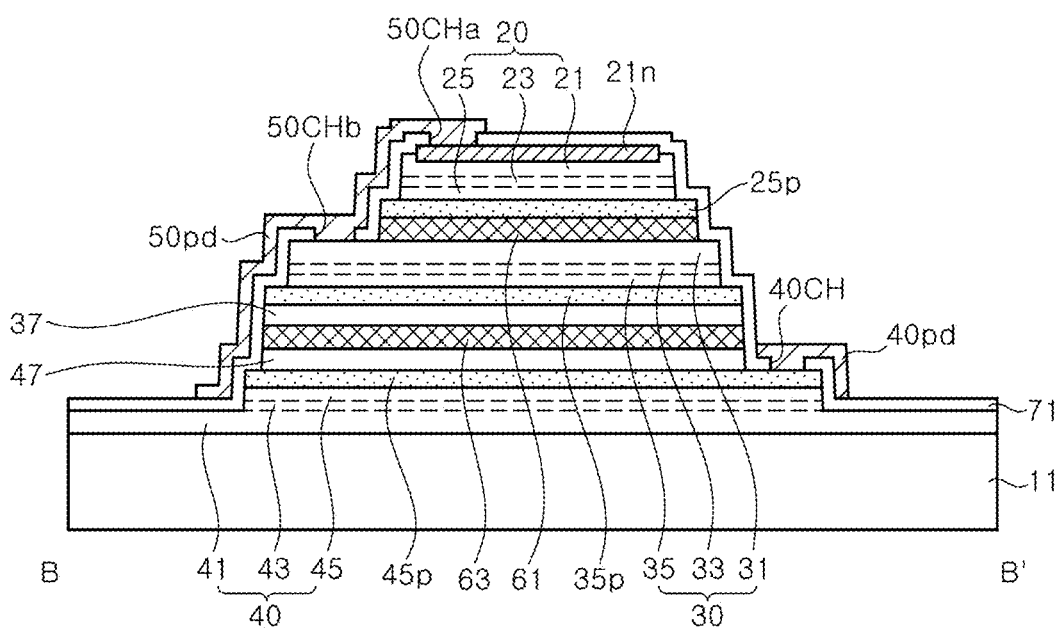

Referring to FIGS. 12A, 12B, and 12C, first, second, third, and fourth pads 20pd, 30pd, 40pd, and 50pd are formed on the first insulation layer 71. The first, second, third and fourth pads 20pd, 30pd, 40pd, and 50pd may be formed by, for example, forming a conductive layer on a substantially entire surface of the substrate 11 and patterning the conductive layer using photolithography and etching processes.

The first pad 20pd may be formed so as to overlap a region where the first contact hole 20CH is formed, and may be connected to the first lower contact electrode 25p through the first contact hole 20CH. The second pad 30pd may be formed so as to overlap a region where the second contact hole 30CH is formed, and may be connected to the second lower contact electrode layer 35p through the second contact hole 30CH. The third pad 40pd may be formed so as to overlap a region where the third contact hole 40CH is formed, and may be connected to the third lower contact electrode 45p through the third contact hole 40CH. The fourth pad 50pd may be formed so as to overlap a region in which the fourth contact hole 50CH is formed, in particular, a region in which the first, second, and third sub-contact holes 50CHa, 50CHb, and 50CHc are formed, and may be electrically connected to the first conductivity type semiconductor layers 21, 31, and 41 of the first through third light emitting stacks 20, 30, and 40.

The first through fourth pads 20pd, 30pd, 40pd, and 50pd may include Au, may be formed in, for example, a stacked structure of Ti/Ni/Ti/Ni/Ti/Ni/Au/Ti, and a thickness thereof may be, for example, about 100 nm/50 nm/100 nm/50 nm/100 nm/50 nm/3000 nm/10 nm.

Figure 13A:
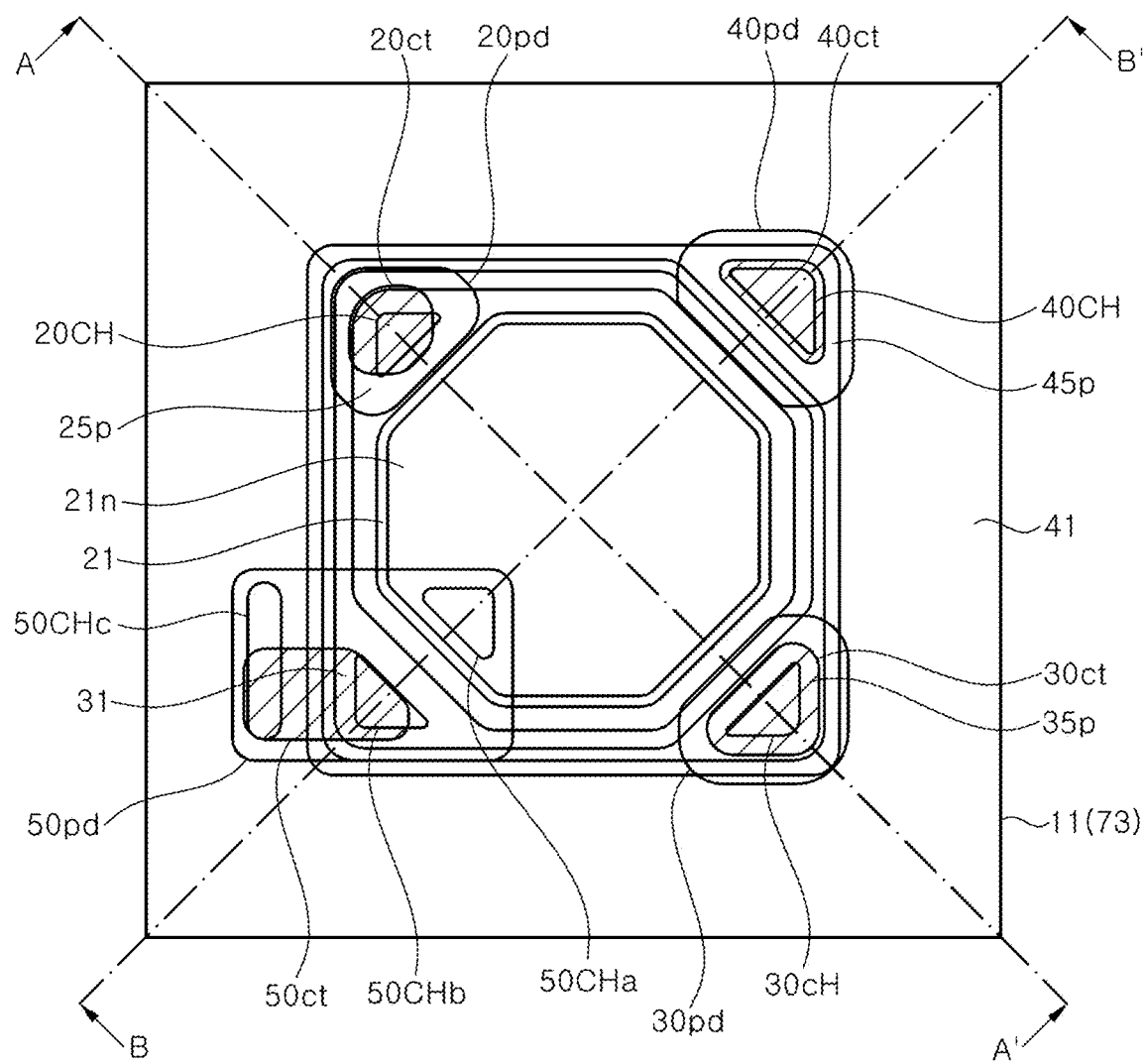
Figure 13B:
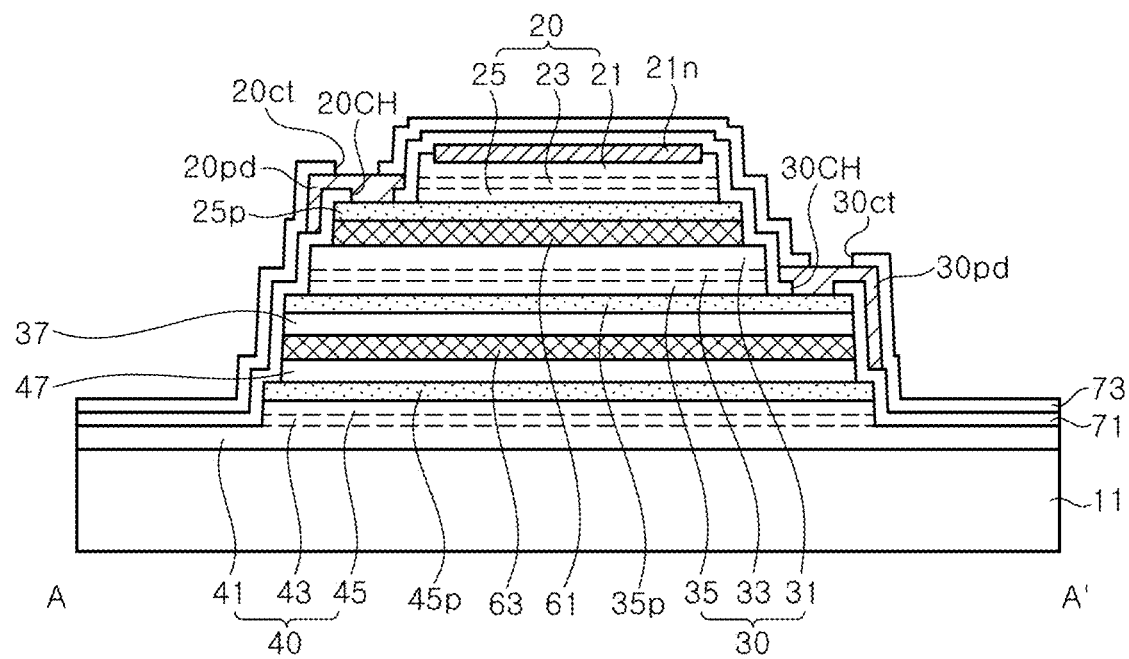
Figure 13C:
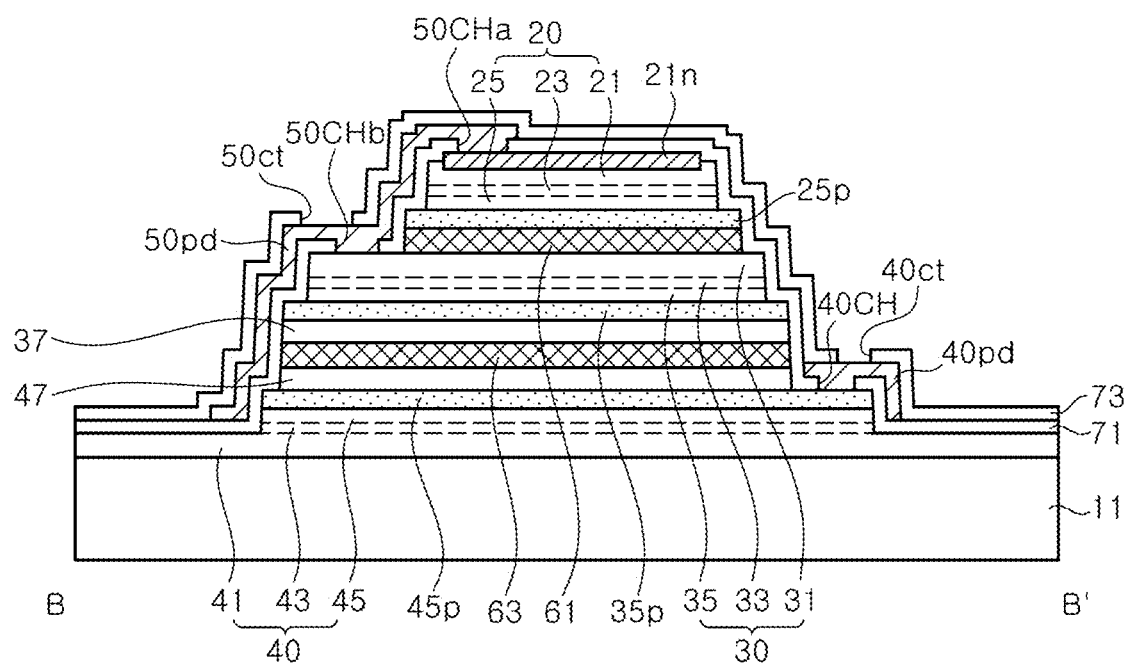

Referring to FIGS. 13A, 13B, and 13C, a second insulation layer 73 may be formed on the first insulation layer 71. The second insulation layer 73 may be formed of SiNx, $SiO_2$, $Al_2O_3$, or the like.

Subsequently, the second insulation layer 73 may be patterned to form first, second, third, and fourth through holes 20ct, 30ct, 40ct, and 50ct exposing the first through fourth pads 20pd, 30pd, 40pd, and 50pd. The through holes 20ct, 30ct, 40ct, and 50ct formed in the second insulation layer 73 may be defined by inclined sidewalls. For example, sidewalls defining the through holes 20ct, 30ct, 40ct, and 50ct may have inclination angles within a range of about 10 degrees to about 70 degrees with respect to the plane parallel to the top surface of the third light emitting stack 40.

The first through hole 20ct formed on the first pad 20pd exposes a portion of the first pad 20pd. The second through hole 30ct formed on the second pad 30pd exposes a portion of the second pad 30pd. The third through hole 40ct formed on the third pad 40pd exposes a portion of the third pad 40pd. The fourth through hole 50ct formed on the fourth pad 50pd exposes a portion of the fourth pad 50pd. In the illustrated exemplary embodiment, the first, second, third, and fourth through holes 20ct, 30ct, 40ct, and 50ct may be defined within regions in which the first, second, third, and fourth pads 20pd, 30pd, 40pd, and 50pd are formed, respectively. In addition, the first, second, third, and fourth through holes 20ct, 30ct, 40ct, and 50ct may be disposed outside of the first light emitting stack 20.

Figure 14A:
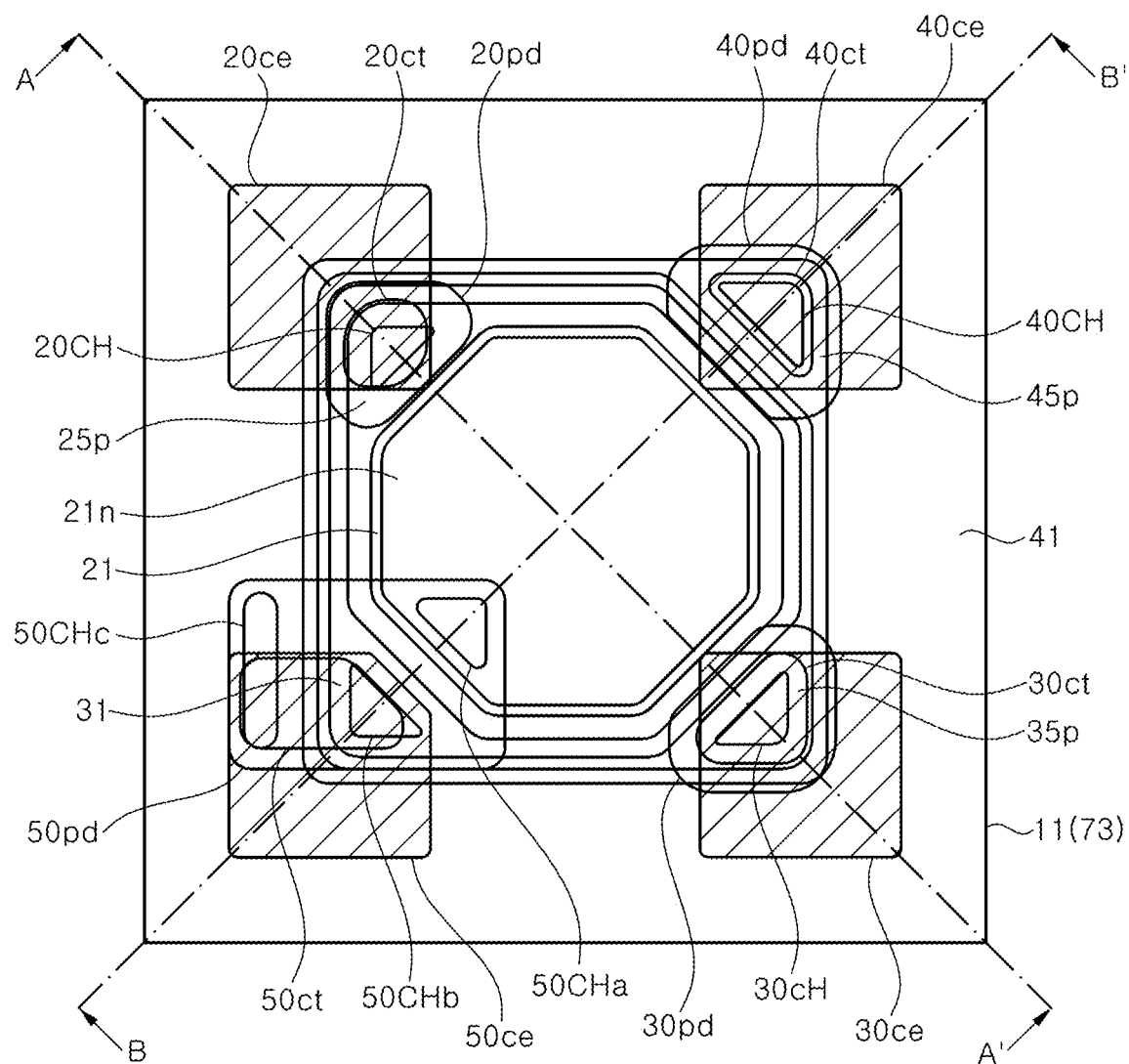
Figure 14B:
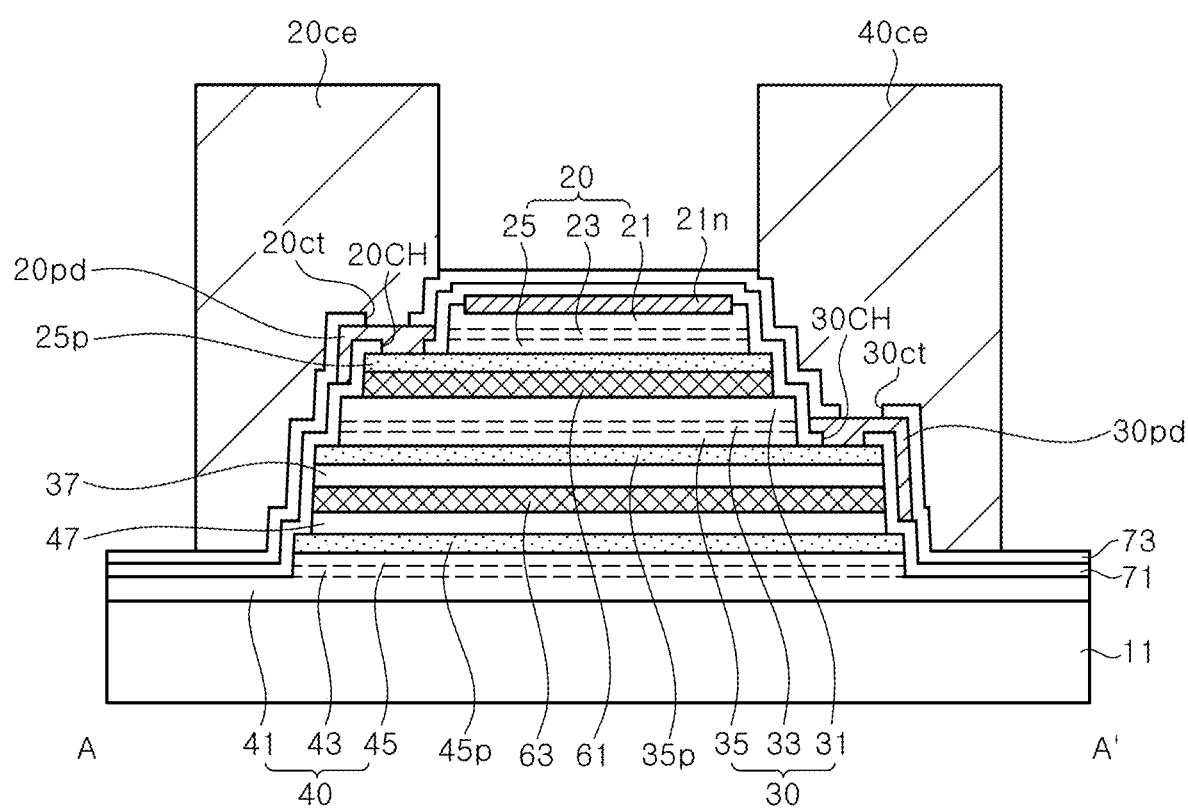
Figure 14C:
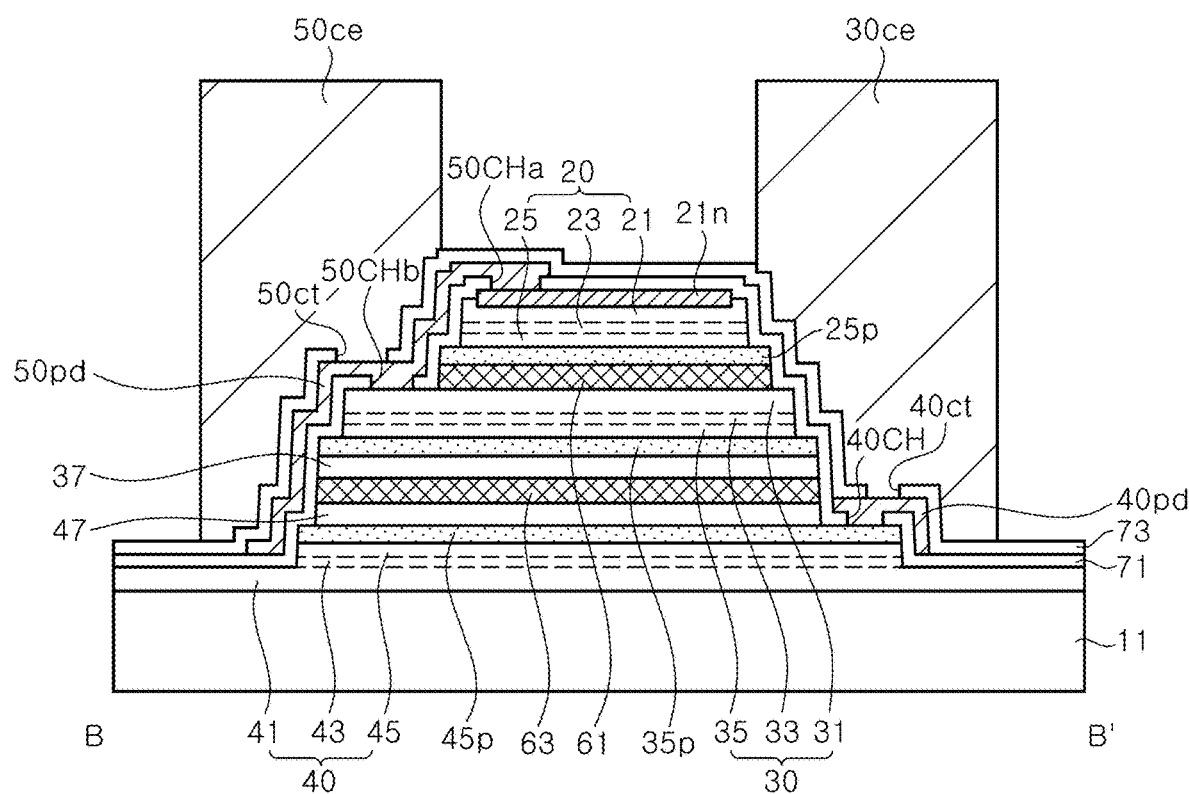

Referring to FIGS. 14A, 14B, and 14C, first, second, third, and fourth connection electrodes 20ce, 30ce, 40ce, and 50ce are formed on the second insulation layer 73 in which the first, second, third, and fourth through-holes 20ct, 30ct, 40ct, and 50ct are formed. The first connection electrode 20ce may be formed so as to overlap a region in which the first through hole 20ct is formed, and may be connected to the first pad 20pd through the first through hole 20ct. The second connection electrode 30ce may be formed so as to overlap a region where the second through hole 30ct is formed, and may be connected to the second pad 30pd through the second through hole 30ct. The third connection electrode 40ce may be formed so as to overlap a region in which the third through hole 40ct is formed, and may be connected to the third pad 40pd through the third through hole 40ct. The fourth connection electrode 50ce may be formed so as to overlap a region where the fourth through hole 50ct is formed, and may be connected to the fourth pad 50pd through the fourth through hole 50ct.

The first, second, third, and fourth connection electrodes 20*ce*, 30*ce*, 40*ce*, and 50*ce* may be spaced apart from one another and formed on the light emitting stacked structure. The first, second, third, and fourth connection electrodes 20*ce*, 30*ce*, 40*ce*, and 50*ce* may be electrically connected to the first, second, third, and fourth pads 20*pd*, 30*pd*, 40*pd*, and 50*pd*, respectively, to transmit an external signal to each of the light emitting stacks 20, 30, and 40.

A method of forming the first, second, third, and fourth connection electrodes 20*ce*, 30*ce*, 40*ce*, and 50*ce* is not particularly limited. For example, according to an exemplary embodiment, a seed layer may be deposited as a conductive surface on the light emitting stacked structure, and a photoresist pattern may be formed such that the seed layer is exposed at a location where a connection electrode is to be formed. According to an exemplary embodiment, the seed layer may be deposited to have a thickness of about 1000 Å, without being limited thereto. The seed layer may be formed of, for example, Ti/Cu. Subsequently, the seed layer may be plated with metal, such as Cu, Ni, Ti, Sb, Zn, Mo, Co, Sn, Ag, or an alloy thereof. Cu is particularly easy to be plated and economical.

Meanwhile, after the plating process is completed, a polishing process may be performed so as to planarize an upper surface of the connection electrode. Thereafter, the photoresist pattern and the seed layer remaining between the connection electrodes may be removed. In some exemplary embodiments, the polishing process may be omitted.

According to the illustrated exemplary embodiment, each of the connection electrodes 20*ce*, 30*ce*, 40*ce*, and 50*ce* may have a substantially elongated shape in a direction away from the substrate 11. In another exemplary embodiment, the first through fourth connection electrodes 20*ce*, 30*ce*, 40*ce*, and 50*ce* may include two or more metals or a plurality of different metal layers so as to reduce a stress from the elongated shape of the first through fourth connection electrodes 20*ce*, 30*ce*, 40*ce*, and 50*ce*. However, the inventive concepts are not limited to specific shapes of the first through fourth connection electrodes 20*ce*, 30*ce*, 40*ce*, and 50*ce*, and the connection electrodes may have various shapes in other exemplary embodiments.

The first through fourth connection electrodes 20*ce*, 30*ce*, 40*ce*, and 50*ce* may overlap at least one step formed on a side surface of the light emitting stacked structure. In this manner, a lower surface of the connection electrode may have a width larger than that of an upper surface, and it is possible to provide a larger contact area between the first through fourth connection electrodes 20*ce*, 30*ce*, 40*ce*, and 50*ce* and the light emitting stacked structure, and thus, that the unit pixel 100 may have a more stable structure capable of withstanding subsequent processes.

Figure 15A:
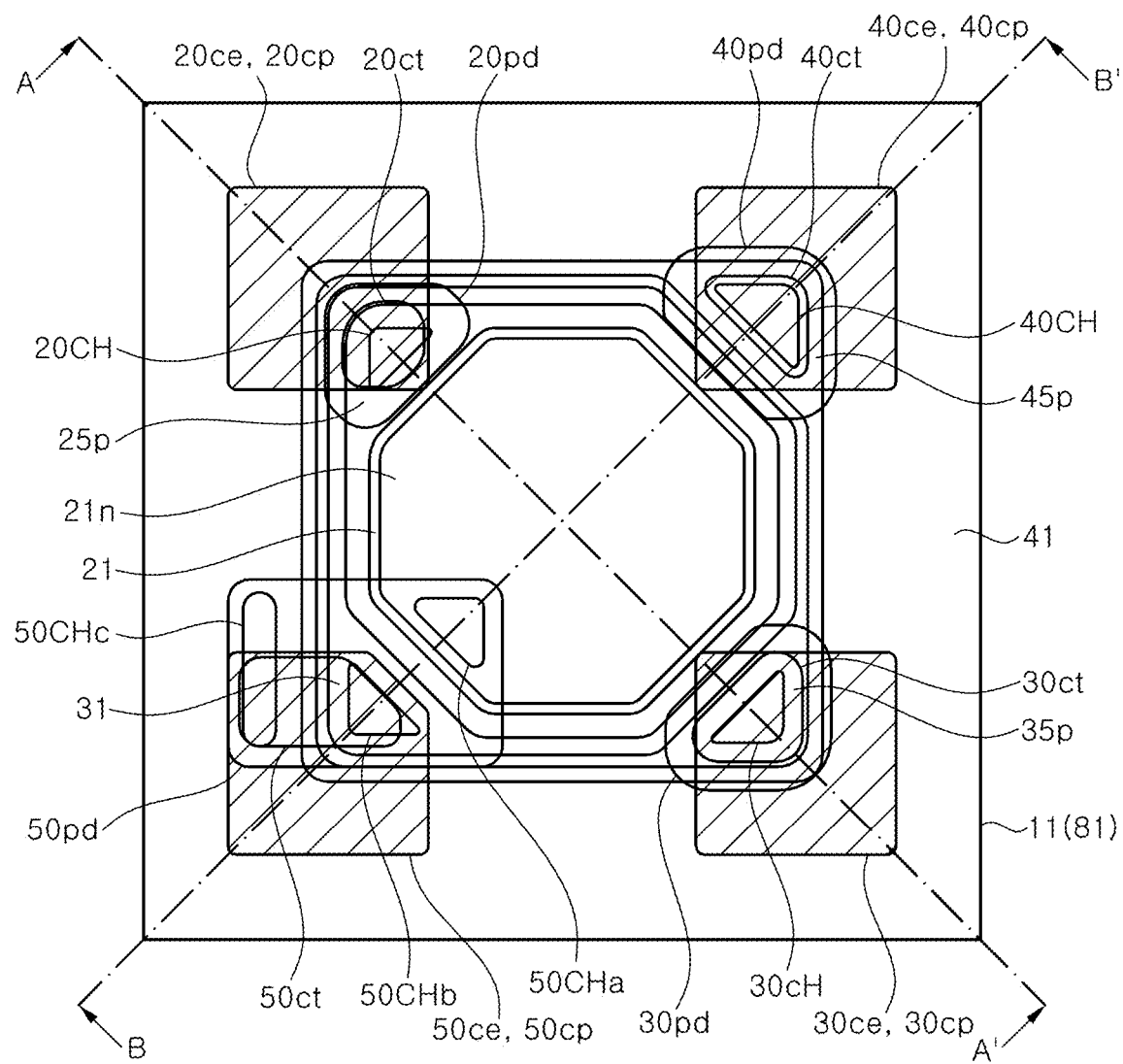
Figure 15B:
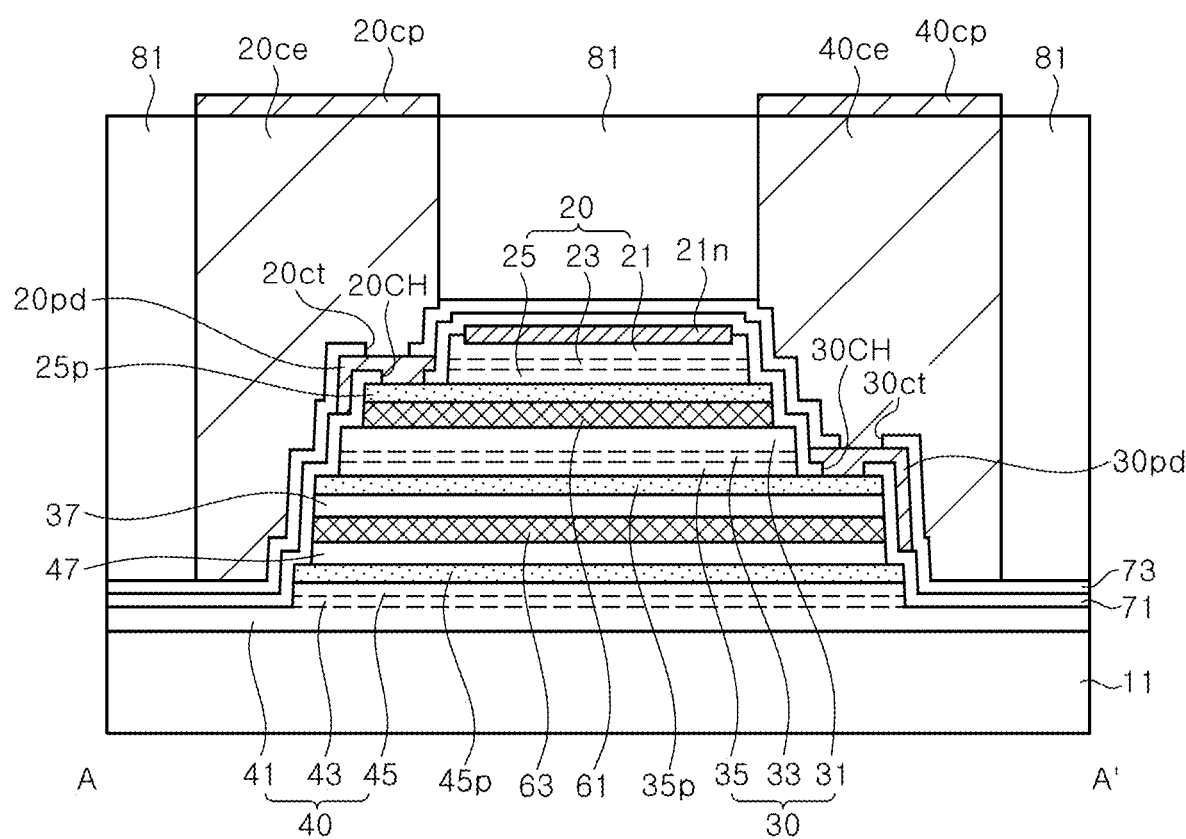
Figure 15C:
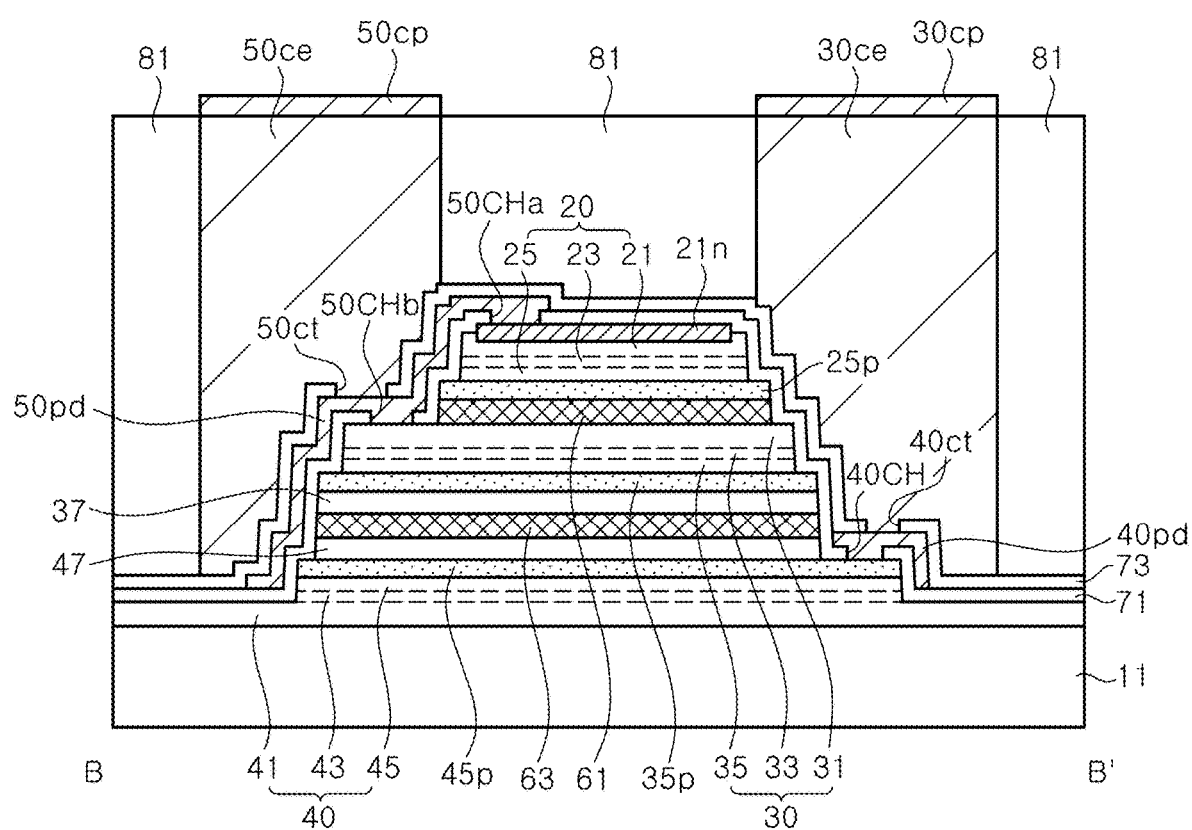

Referring to FIGS. 15A, 15B, and 15C, a protection layer 81 covering the first through fourth connection electrodes 20*ce*, 30*ce*, 40*ce*, and 50*ce* is formed. The protection layer 81 may fill a region between the first through fourth connection electrodes 20*ce*, 30*ce*, 40*ce*, and 50*ce*, and may cover side surfaces of the first through fourth connection electrodes 20*ce*, 30*ce*, 40*ce*, and 50*ce*. Furthermore, the protection layer 81 may be first formed so as to cover the upper surfaces of the first through fourth connection electrodes 20*ce*, 30*ce*, 40*ce*, and 50*ce*, and then, may be removed together with portions of upper regions of the first through fourth connection electrodes 20*ce*, 30*ce*, 40*ce*, and 50 using a grinding technique. For example, the first through fourth connection electrodes 20*ce*, 30*ce*, 40*ce*, and 50*ce* may be covered with an epoxy molding compound using a lamination technique, and after curing them, the epoxy molding compound may be removed using the grinding technique. Accordingly, an upper surface of the protection layer 81 may be formed flush with the upper surfaces of the first through fourth connection electrodes 20*ce*, 30*ce*, 40*ce*, and 50*ce*. In one exemplary embodiment, the upper surfaces of the first through fourth connection electrodes 20*ce*, 30*ce*, 40*ce*, and 50*ce* may slightly protrude than the upper surface of the protection layer 81.

Thereafter, bonding metal layers 20*cp*, 30*cp*, 40*cp*, and 50*cp* are formed on the first through fourth connection electrodes 20*ce*, 30*ce*, 40*ce*, and 50*ce*. The bonding metal layers 20*cp*, 30*cp*, 40*cp*, and 50*cp* having a multilayer structure of, for example, Ti/Ni/Au (50 nm/50 nm/400 nm) may be formed using a lift-off technique using a photoresist pattern exposing the upper surfaces of the first through fourth connection electrodes 20*ce*, 30*ce*, 40*ce*, and 50*ce*.

The bonding metal layers 20*cp*, 30*cp*, 40*cp*, and 50*cp* may be deposited using sputtering technology, and before the deposition, a pretreatment of removing natural oxide layers formed on the upper surfaces of the first through fourth connection electrodes 20*ce*, 30*ce*, 40*ce*, and 50*ce* may be performed using sulfuric acid. In an exemplary embodiment, the bonding metal layers 20*cp*, 30*cp*, 40*cp*, and 50*cp* may have an area smaller than an area of the upper surface of the first through fourth connection electrodes 20*ce*, 30*ce*, 40*ce*, and 50*ce*, respectively. In this case, the upper surfaces of the first through fourth connection electrodes 20*ce*, 30*ce*, 40*ce*, and 50*ce* may include a recessed region. In another exemplary embodiment, the bonding metal layers 20*cp*, 30*cp*, 40*cp*, and 50*cp* may have an area larger than the area of the upper surface of the first through fourth connection electrodes 20*ce*, 30*ce*, 40*ce*, and 50*ce*, respectively. In this case, portions of the bonding metal layers 20*cp*, 30*cp*, 40*cp*, and 50*cp* may be disposed on the protection layer 81.

Since the first through fourth connection electrodes 20*ce*, 30*ce*, 40*ce*, and 50*ce* are formed of metal that is advantageous for plating, they may not be suitable for bonding. Furthermore, natural oxide layers that may be formed on the upper surfaces of the first through fourth connection electrodes 20*ce*, 30*ce*, 40*ce*, and 50*ce* would cause contact failure. Accordingly, the natural oxide layers may be removed by partially removing the upper surfaces of the first through fourth connection electrodes 20*ce*, 30*ce*, 40*ce*, and 50*ce*, and in addition, the unit pixel 100 may be easily mounted on a circuit board using eutectic bonding technology by employing the bonding metal layers 20*cp*, 30*cp*, 40*cp*, and 50*cp*.

Thereafter, individualized unit pixels 100 may be completed by dividing the substrate 11 into unit pixel regions. The substrate 11 may be divided using a laser scribing technique. In other exemplary embodiments, the substrate 11 may be removed from the third light emitting stack 40.

The unit pixels 100 may be bonded onto the circuit board 1001 or a pixel substrate 2100 of FIG. 1 using the bonding metal layers 20*cp*, 30*cp*, 40*cp*, and 50*cp* to provide a display apparatus 10000. Accordingly, the unit pixels 100 are bonded such that the substrate 11 is disposed on a user's side in the display apparatus 10000, and light emitted from the first light emitting stack 20, the second light emitting stack 30, and the third light emitting stack 40 is emitted to the outside through the substrate 11.

Figure 16:
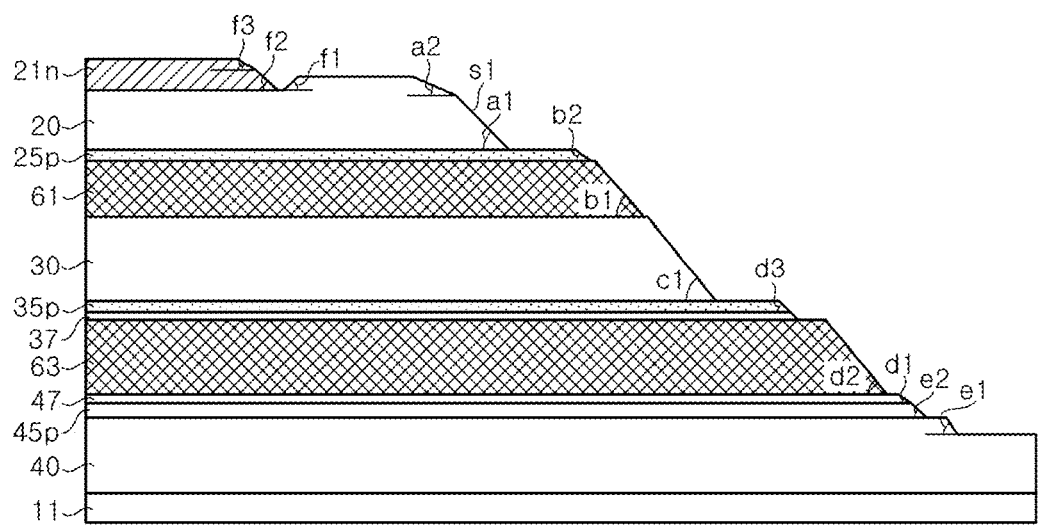
FIG. 16 is a partial cross-sectional view illustrating an inclination of a side surface of each layer of a unit pixel according to an exemplary embodiment.

The unit pixel 100 has a structure in which a side surface of each layer is inclined so as to prevent breakage of the insulation layer or the metal layer in the manufacturing process. FIG. 16 is a schematic partial cross-sectional view illustrating an inclination of a side surface of each layer of the unit pixel 100 described above as a whole.

Figure 17A:
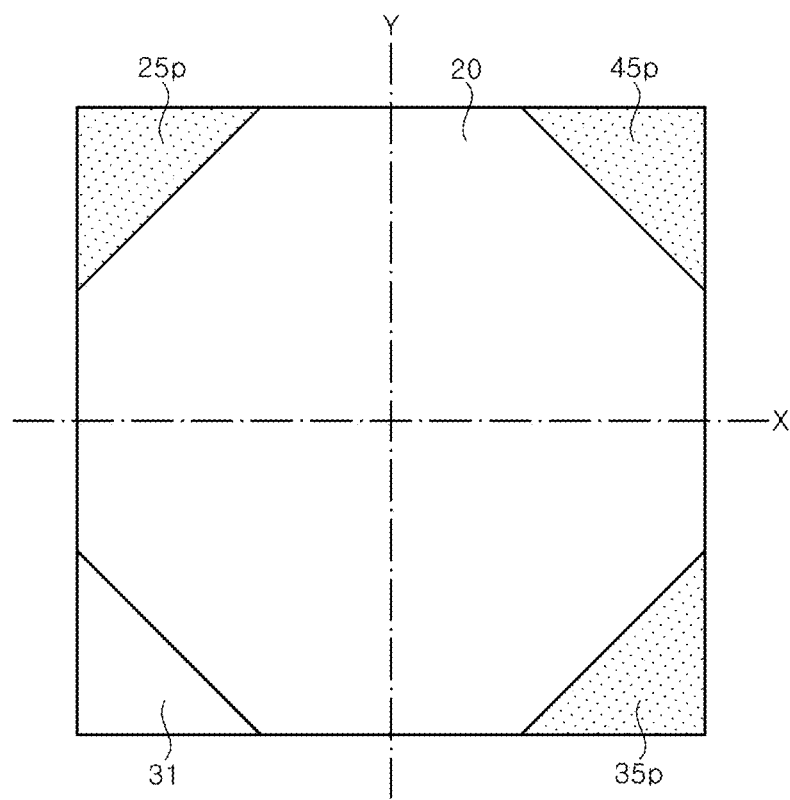
FIG. 17A is a schematic plan view illustrating a shape of a unit pixel according to an exemplary embodiment.

FIG. 17A is a schematic plan view illustrating a shape of the unit pixel 100 according to an exemplary embodiment.

Referring to FIG. 17A, the first light emitting stack 20 may have a symmetrical structure with respect to an X-axis dividing an upper part from a lower part in plan view. In addition, the first light emitting stack 20 may have a symmetrical structure with respect to a Y axis dividing a left part from a right part in plan view. Accordingly, light emitted from the first light emitting stack 20 may exhibit a symmetrical emission pattern in the X-axis direction, and may also exhibit a symmetrical emission pattern in the Y-axis direction. In the illustrated exemplary embodiment, the first light emitting stack 20 has a regular octagonal shape. Accordingly, the emission pattern in the X-axis direction and the emission pattern in the Y-axis direction may be substantially similar. However, the shape of the first light emitting stack 20 is not limited to the regular octagon, and the first light emitting stack 20 may have any octagonal shape that is symmetrical left and right and up and down in other exemplary embodiments.

Meanwhile, the second light emitting stack 30 has a shape substantially similar to that of the first light emitting stack 20, but includes additional regions for electrical connection. For example, it may have protrusions near the ends of the lead lines of reference numerals 25p and 31 (for example, see FIG. 7A). Accordingly, the second light emitting stack 30 may have a symmetrical structure with respect to the X-axis, but may have an asymmetrical structure with respect to the Y-axis. However, the additional region of the second light emitting stack 30 is out of the X and Y axes. Accordingly, when only the second light emitting stack 30 on the X and Y axes is considered, the second light emitting stack 30 has the symmetrical structure. Accordingly, light emitted from the second light emitting stack 30 may also exhibit a generally symmetrical light emitting pattern in the X-axis direction and the Y-axis direction.

Further, the third light emitting stack 40 has a shape including regions indicated by reference numerals 25p, 31, 35p, and 45p, that is, a rectangular or square shape, and thus, it has the symmetrical structure with respect to the X and Y axes. (For example, see FIG. 9A). Accordingly, light emitted from the third light emitting stack 40 may exhibit a generally symmetric light emitting pattern.

Figure 17B:
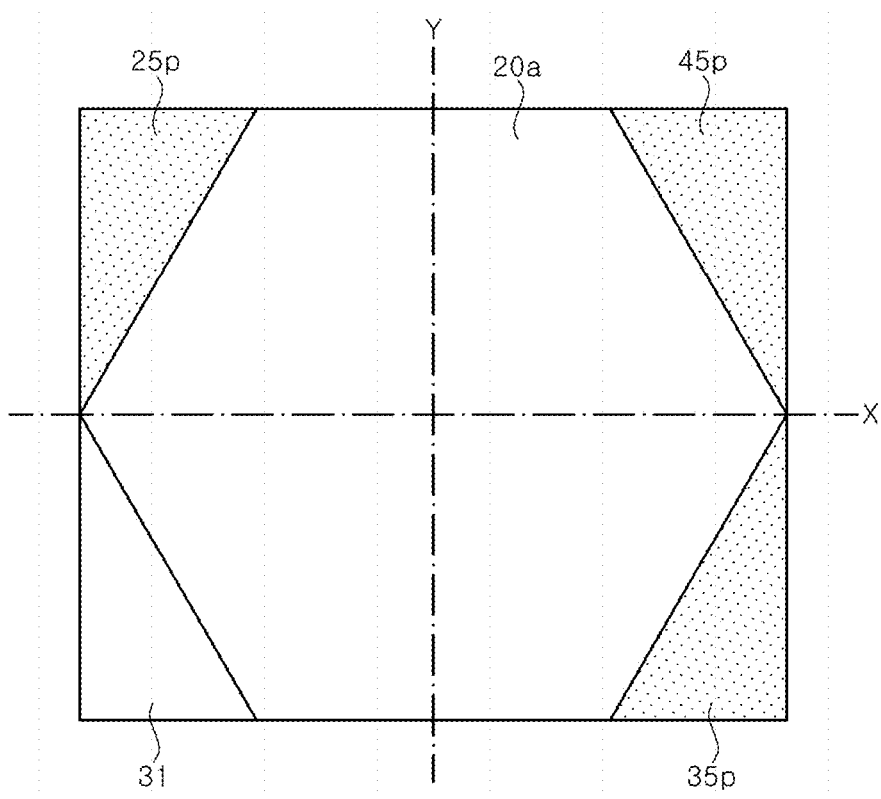
FIG. 17B is a schematic plan view illustrating a shape of a unit pixel according to another exemplary embodiment.

FIG. 17B is a schematic plan view illustrating a shape of a unit pixel according to another exemplary embodiment.

Referring to FIG. 17B, the first light emitting stack 20 may have a symmetrical structure with respect to an X-axis dividing an upper part from a lower part in plan view. In addition, the first light emitting stack 20 may have a symmetrical structure with respect to a Y axis dividing a left part from a right part in plan view. Accordingly, light emitted from the first light emitting stack 20 may exhibit a symmetrical emission pattern in the X-axis direction, and may also exhibit a symmetrical emission pattern in the Y-axis direction. In the illustrated exemplary embodiment, the first light emitting stack 20 has a regular hexagonal shape. However, the shape of the first light emitting stack 20 is not limited to the regular hexagon, and the first light emitting stack 20 may have any hexagonal that is symmetrical left and right and up and down in other exemplary embodiments.

Meanwhile, the second light emitting stack 30 has a shape substantially similar to that of the first light emitting stack 20, but includes additional regions for electrical connection. For example, it may have protrusions near ends of the lead lines for reference numerals 25p and 31. Accordingly, the second light emitting stack 30 may have a symmetrical structure with respect to the X-axis, but may have an asymmetrical structure with respect to the Y-axis. However, the additional region of the second light emitting stack 30 is out of the X and Y axes. Accordingly, when only the second light emitting stack 30 on the X and Y axes is considered, the second light emitting stack 30 has the symmetrical structure. Accordingly, light emitted from the second light emitting stack 30 may also exhibit a generally symmetrical light emitting pattern in the X-axis direction and the Y direction.

Further, the third light emitting stack 40 has a shape including regions indicated by reference numerals 25p, 31, 35p, and 45p, that is, a rectangular or square shape, and thus, it has a symmetrical structure with respect to the X and Y axes. Accordingly, light emitted from the third light emitting stack 40 may exhibit a generally symmetric light emitting pattern.

Figure 17C:
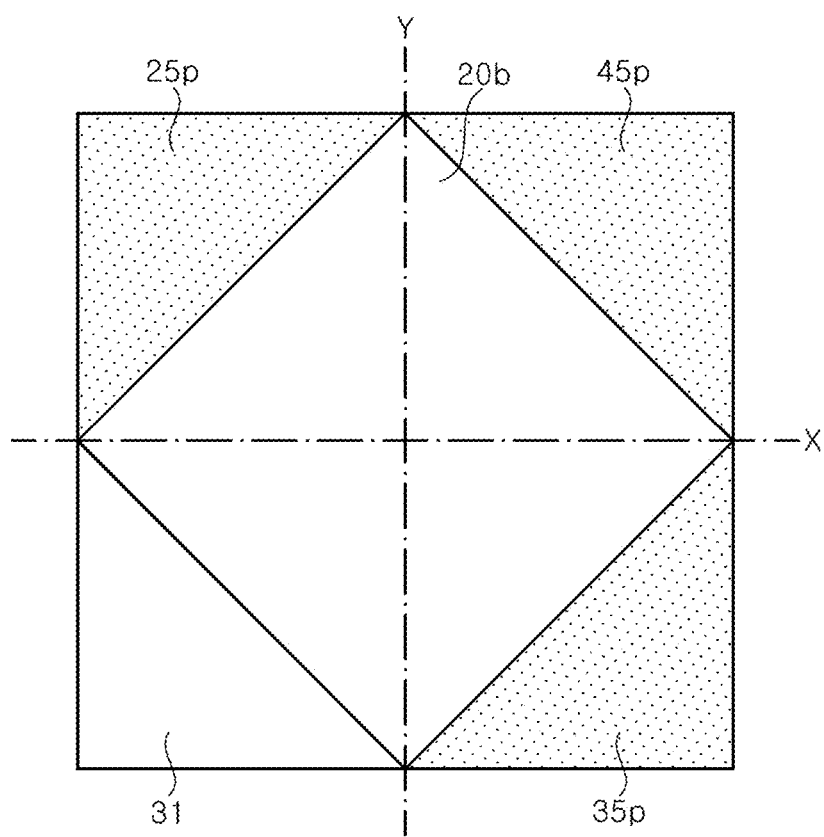
FIG. 17C is a schematic plan view illustrating a shape of a unit pixel according to another yet exemplary embodiment.

FIG. 17C is a schematic plan view illustrating a shape of a unit pixel according to another yet exemplary embodiment.

Referring to FIG. 17C, the first light emitting stack 20 may have a symmetrical structure with respect to an X-axis dividing an upper part from a lower part in plan view. In addition, the first light emitting stack 20 may have a symmetrical structure with respect to a Y axis dividing a left part from a right part in plan view. Accordingly, light emitted from the first light emitting stack 20 may exhibit a symmetrical emission pattern in the X-axis direction, and may also exhibit a symmetrical emission pattern in the Y-axis direction. In the illustrated exemplary embodiment, the first light emitting stack 20 has a rhombus shape. In the illustrated exemplary embodiment, a length of the X-axis direction and a length of the Y-axis direction of the first light emitting stack 20 may be identical, without being limited thereto.

Meanwhile, the second light emitting stack 30 has a shape substantially similar to that of the first light emitting stack 20, but includes additional regions for electrical connection. For example, it may have protrusions near ends of the lead lines of the reference numerals 25p and 31. Accordingly, the second light emitting stack 30 may have a symmetrical structure with respect to the X-axis, but may have an asymmetrical structure with respect to the Y-axis. However, the additional region of the second light emitting stack 30 is out of the X and Y axes. Accordingly, when only the second light emitting stack 30 on the X and Y axes is considered, the second light emitting stack 30 has the symmetrical structure. Accordingly, light emitted from the second light emitting stack 30 may also exhibit a generally symmetrical light emitting pattern in the X-axis direction and the Y-axis direction.

Further, the third light emitting stack 40 has a shape including regions indicated by reference numerals 25p, 31, 35p, and 45p, that is, a rectangular or square shape, and thus, has a symmetrical structure with respect to the X and Y axes. Accordingly, light emitted from the third light emitting stack 40 may exhibit a generally symmetric light emitting pattern.

Figure 18:
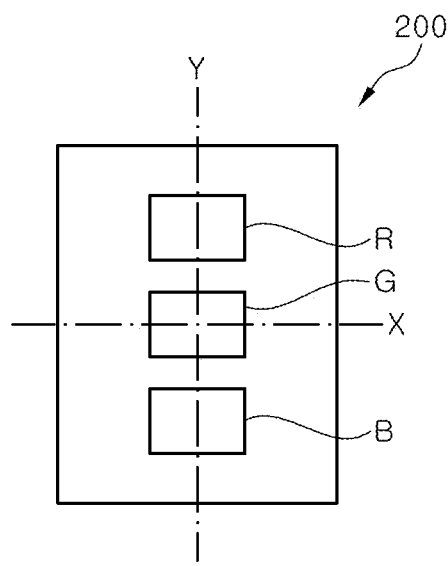
FIG. 18 is a schematic plan view showing a conventional unit pixel having light emitting devices R, G, and B.
Figure 19A:
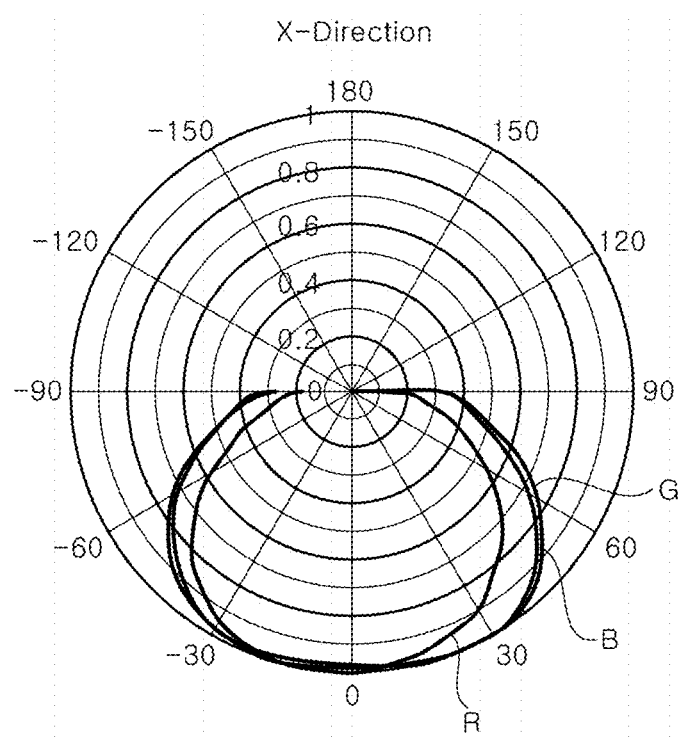
FIGS. 19A and 19B are graphs illustrating light emission patterns in X and Y directions of the conventional unit pixel.
Figure 19B:
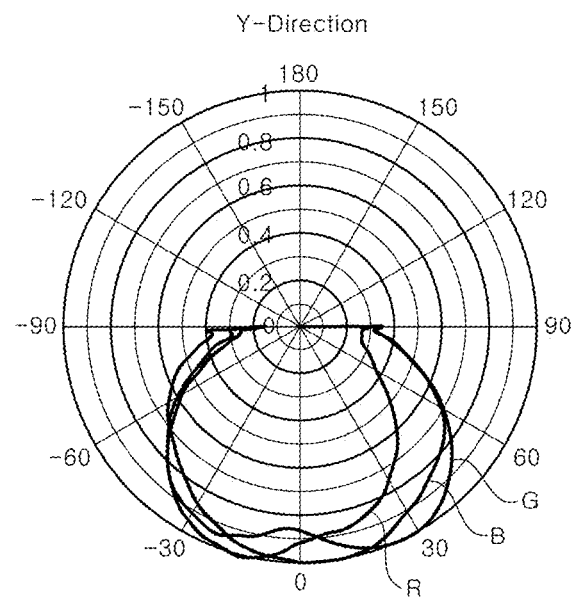

FIG. 18 is a schematic plan view showing a conventional unit pixel 200 having light emitting devices R, G, and B arranged. FIGS. 19A and 19B are graphs illustrating light emission patterns in X and Y directions of the conventional unit pixel, and FIGS. 20A and 20B are graphs illustrating light emission patterns in X and Y directions of the unit pixel according to an exemplary embodiment, respectively.

Referring to FIG. 18, the conventional unit pixel 200 includes the light emitting devices R, G, and B arranged on a same plane. The light emitting devices may emit red light, green light, and blue light, respectively. As illustrated, a red light emitting device R and a blue light emitting device B are disposed on both sides in the Y-axis direction with a green light emitting device G therebetween at the center.

Referring to FIGS. 19A and 19B, the conventional unit pixel 200 exhibits a generally symmetrical emission pattern in the X-axis direction, but exhibits a relatively asymmetrical emission pattern in the Y-axis direction. In particular, a symmetry of red light and blue light emitted from the red light emitting device R and the blue light emitting device B is less favorable than that of green light emitting device G disposed at the center.

Figure 20A:
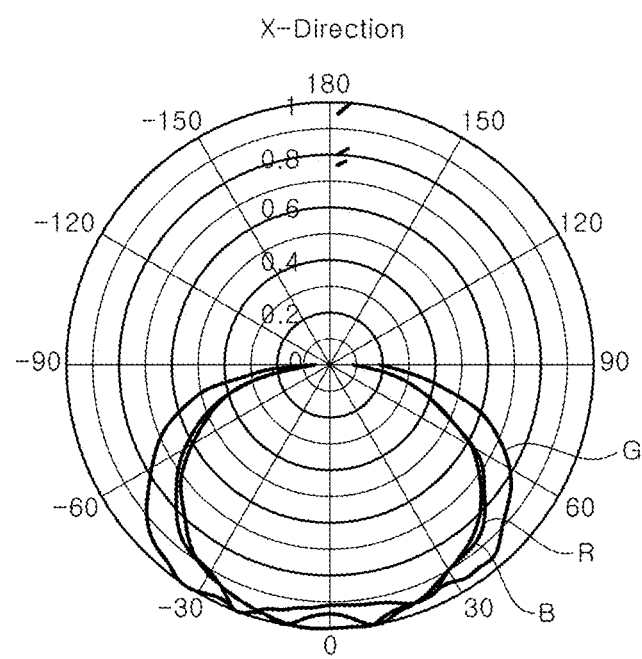
FIGS. 20A and 20B are graphs illustrating light emission patterns in X and Y directions of a unit pixel according to an exemplary embodiment, respectively.
Figure 20B:
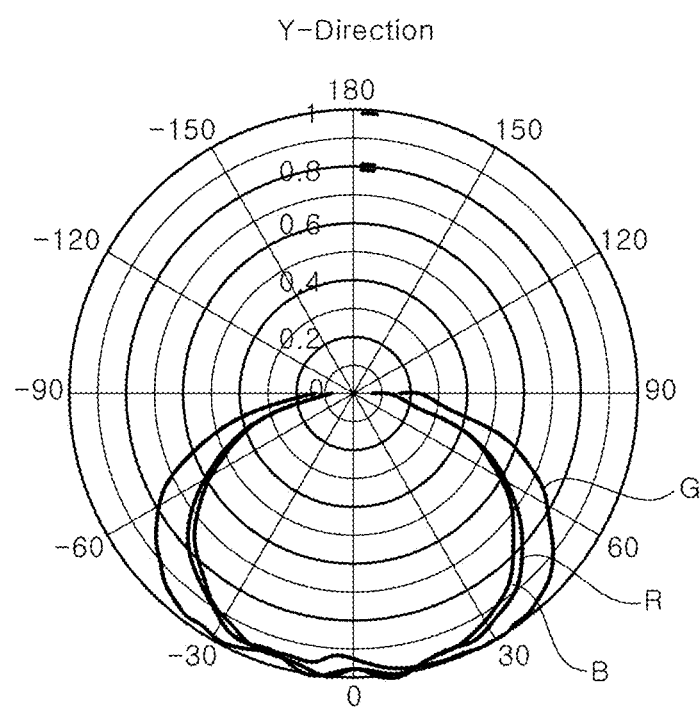

Referring to FIGS. 20A and 20B, the unit pixel 100 according to an exemplary embodiment exhibits symmetrical emission patterns in the X-axis direction and the Y-axis direction for all of red light, blue light, and green light.

Figure 21:
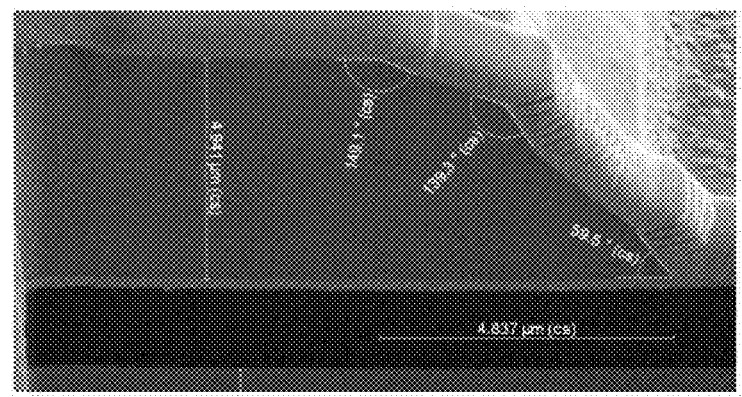
FIG. 21 is an image showing a side surface of a first light emitting stack in a unit pixel according to an exemplary embodiment.

FIG. 21 is an image showing a side surface of a first light emitting stack in a unit pixel according to an exemplary embodiment.

Referring to FIG. 21, a first light emitting stack 20 is formed to have inclined side surfaces, and in particular, includes a side surface with multiple steps. Among the side surfaces of the first light emitting stack 20, a side surface contacting a first lower contact electrode 25p has an inclination angle of about 60 degrees, and a side surface connected to an upper surface of the first light emitting stack 20 has an inclination angle greater than 60 degrees.

Figure 22A:
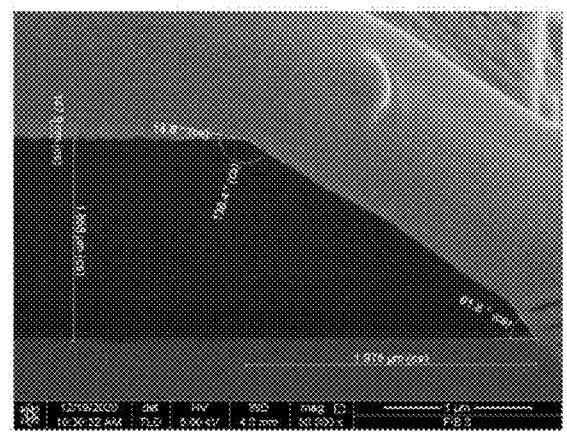
FIG. 22A is an image showing a side surface of a first adhesive layer in a unit pixel according to an exemplary embodiment.
Figure 22B:
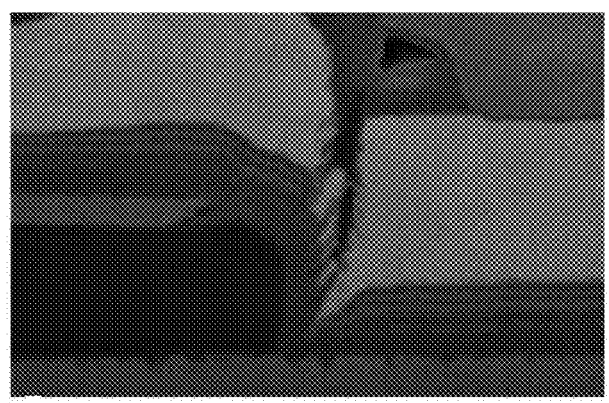
FIG. 22B is an image showing a side surface of a first adhesive layer in a unit pixel according to Comparative Example.

FIG. 22A is an image showing a side surface of a first adhesive layer in the unit pixel according to an exemplary embodiment, and FIG. 22B is an image showing a side surface of a first adhesive layer in a unit pixel according to Comparative Example.

As shown in FIG. 22A, a first adhesive layer 61 was formed to have an inclination angle of about 62 degrees. Meanwhile, as shown in FIG. 22B, in a case of the Comparative Example, a first adhesive layer 61 had an approximately vertical side surface, and thus, cracks occurred in an insulation layer and a metal layer covering the side surface of the first adhesive layer 61.

Figure 23A:
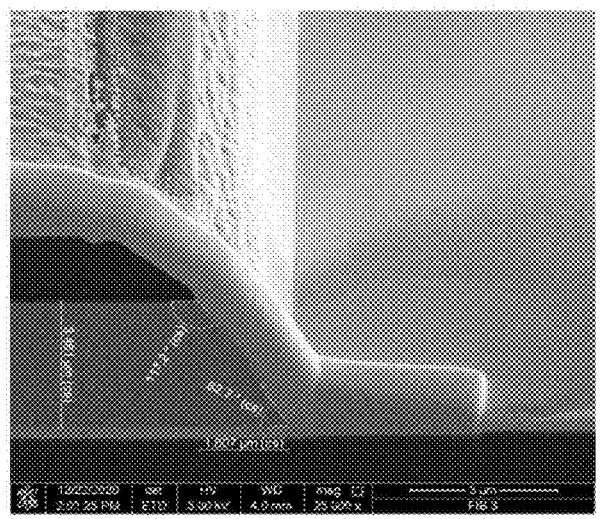
FIG. 23A is an image showing a side surface of a second light emitting stack in a unit pixel according to an exemplary embodiment.
Figure 23B:
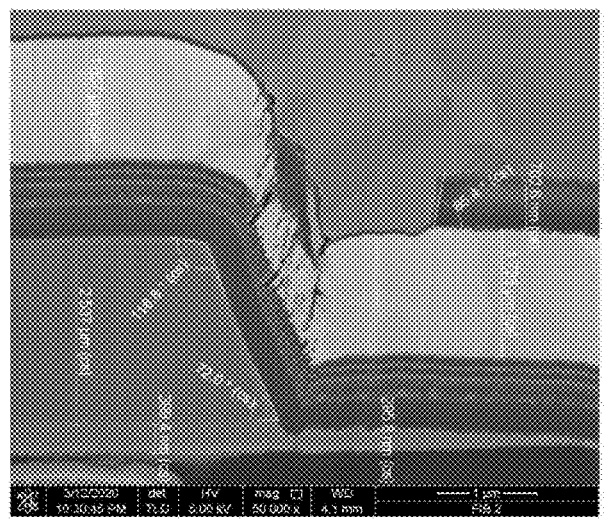
FIG. 23B is an image showing a side surface of a second light emitting stack in a unit pixel according to Comparative Example.

FIG. 23A is an image showing a side surface of a second light emitting stack in the unit pixel according to an exemplary embodiment, and FIG. 23B is an image showing a side surface of a second light emitting stack in the unit pixel according to Comparative Example.

Referring to FIG. 23A, a second light emitting stack 30 was formed to have an inclination angle of about 63 degrees. Meanwhile, as shown in FIG. 23B, when a second light emitting stack 30 has an inclination angle of about 72 degrees, cracks occurred in a metal layer formed thereon.

Figure 24:
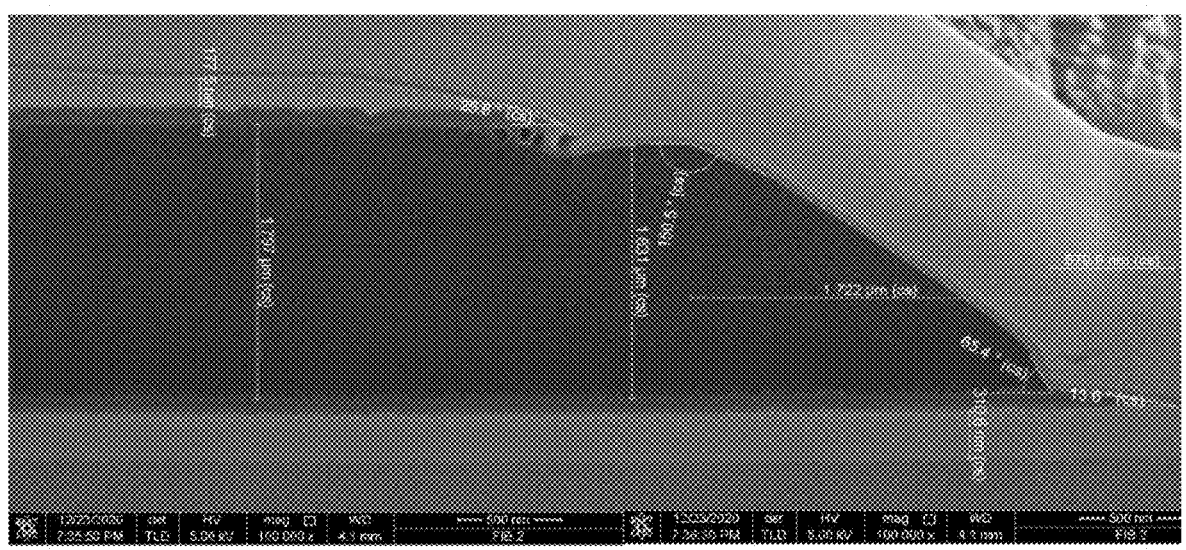
FIG. 24 is an image showing a side surface of a second adhesive layer in a unit is pixel according to an exemplary embodiment.

FIG. 24 is an image showing a side surface of a second adhesive layer in the unit pixel according to an exemplary embodiment.

Referring to FIG. 24, a second lower contact electrode 35p and a first adhesion enhancement layer 37 were formed to have inclination angles of about 26 degrees, a second adhesive layer 63 was formed to have an inclination angle of about 65 degrees, and a second adhesion enhancement layer 47 was formed to have an inclination angle of about 14 degrees.

Figure 25:
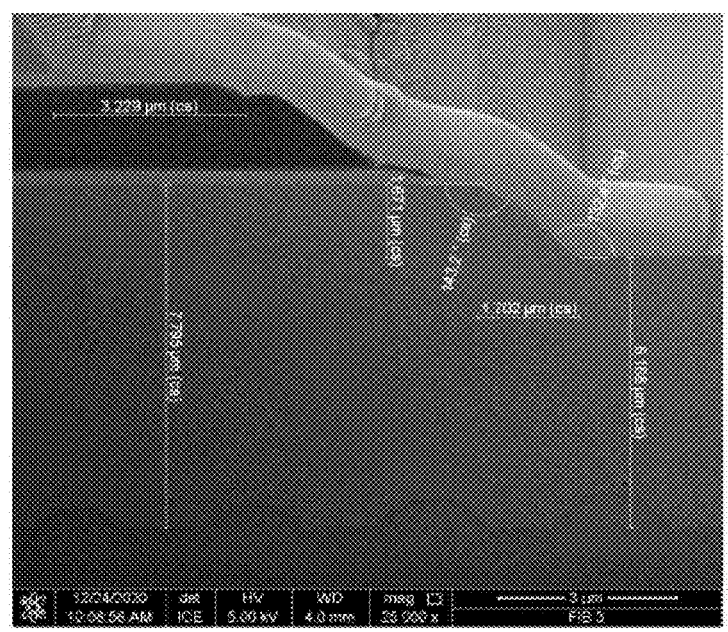
FIG. 25 is an image showing a side surface of a mesa of a third light emitting stack in a unit pixel according to an exemplary embodiment.

FIG. 25 is an image showing a side surface of a mesa of a third light emitting stack 40 in the unit pixel according to an exemplary embodiment. Referring to FIG. 25, a mesa of a third light emitting stack 40 was formed to have an inclination angle of about 47 degrees.

Figure 26:
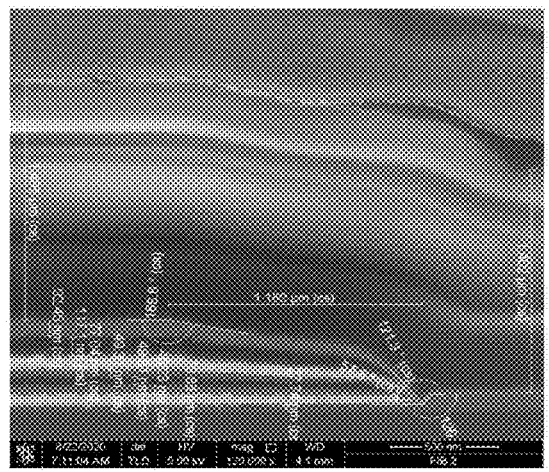
FIG. 26 is an image showing a side surface of a first upper contact electrode in a unit pixel according to an exemplary embodiment.

FIG. 26 is an image showing a side surface of a first upper contact electrode in the unit pixel according to an exemplary embodiment.

Referring to FIG. 26, it can be seen that a side surface of a first upper contact electrode 21n was formed to have an inclination angle of about 58 degrees and has a multi-stepped structure. Accordingly, it can be seen that an insulation layer and a metal layer formed thereon are cleanly formed without cracks.

Figure 27A:
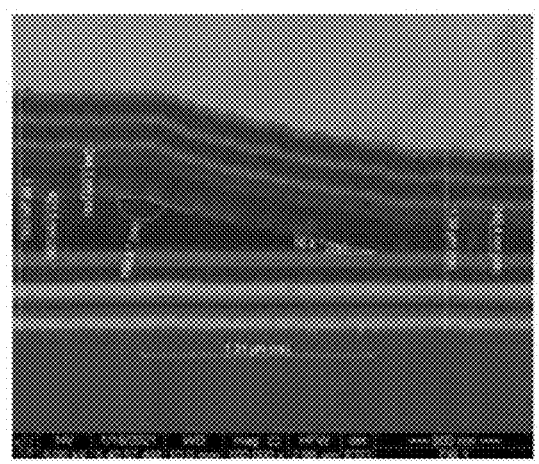
FIG. 27A is an image showing a contact hole of a first insulation layer in a unit pixel according to an exemplary embodiment.
Figure 27B:
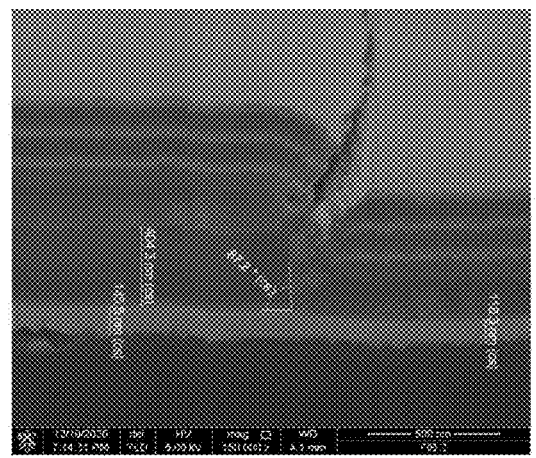
FIG. 27B is an image showing a contact hole of a first insulation layer in a unit pixel according to Comparative Example.

FIG. 27A is an image showing a contact hole of a first insulation layer 71 in the unit pixel according to an exemplary embodiment, and FIG. 27B is an image showing a contact hole of a first insulation layer 71 in the unit pixel according to Comparative Example.

Referring to FIG. 27A, a sidewall of the first insulation layer 71 defining the contact hole was formed to have an inclination angle of about 16 degrees, and the metal layers formed thereon were cleanly formed without cracks. Meanwhile, as shown in FIG. 27B, when a sidewall of the first insulation layer 71 defining the contact hole was formed substantially vertically, cracks occurred in the metal layer formed thereon.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A unit pixel, comprising:
   a first light emitting stack;
   a second light emitting stack disposed under the first light emitting stack, and having an area greater than that of the first light emitting stack;
   a third light emitting stack disposed under the second light emitting stack, and having an area greater than that of the second light emitting stack; and
   a first upper contact electrode disposed on the first light emitting stack,
   wherein at least one of the first through third light emitting stacks includes a side surface having an inclination angle within a range of about 30 degrees to about 70 degrees with respect to a first plane parallel to a top surface of the third light emitting stack, and
   wherein the first upper contact electrode includes a side surface including a first region with a first inclination angle within a range of about 20 degrees to about 70 degrees with respect to the first plane, and a second region with a second inclination angle within a range of about 20 degrees to about 70 degrees with respect to the first plane, wherein the second region is disposed above the first region and the second inclination angle is less than the first inclination angle.

2. The unit pixel of claim 1, wherein each of the first through third light emitting stacks has an inclination angle within a range of about 30 degrees to about 70 degrees with respect to the first plane.

3. The unit pixel of claim 2, wherein the third light emitting stack includes a mesa, and a side surface of the mesa has an inclination angle within a range of about 30degrees to about 70 degrees with respect to the first plane.

4. The unit pixel of claim 1, wherein:
   the first light emitting stack includes a first side surface having a first inclination angle with respect to the first plane and a second side surface having a second inclination angle less than the first inclination angle; and
   the first side surface is disposed closer to the second light emitting stack than the second side surface.

5. The unit pixel of claim 4, wherein the first side surface is continuous with the second side surface.

6. The unit pixel of claim 1, further comprising:
a first adhesive layer disposed between the first light emitting stack and the second light emitting stack; and
a second adhesive layer disposed between the second light emitting stack and the third light emitting stack,
wherein the first adhesive layer and the second adhesive layer include side surfaces having inclination angles within a range of about 30 degrees to about 70 degrees with respect to the first plane.

7. The unit pixel of claim 6, further comprising a first adhesion enhancement layer disposed between the second adhesive layer and the second light emitting stack,
wherein the first adhesion enhancement layer includes a side surface having an inclination angle within a range of about 5 degrees to about 60 degrees with respect to the first plane.

8. The unit pixel of claim 7, further comprising a second adhesion enhancement layer disposed between the second adhesive layer and the third light emitting stack,
wherein the second adhesion enhancement layer includes a side surface having an inclination angle within a range of about 5 degrees to about 60 degrees with respect to the first plane.

9. The unit pixel of claim 8, wherein the first adhesion enhancement layer or the second adhesion enhancement layer includes a silicon oxide film.

10. The unit pixel of claim 1, further comprising:
a first lower contact electrode electrically connected to a second conductivity type semiconductor layer of the first light emitting stack;
a second lower contact electrode electrically connected to a second conductivity type semiconductor layer of the second light emitting stack; and
a third lower contact electrode electrically connected to a second conductivity type semiconductor layer of the third light emitting stack,
wherein the first through third lower contact electrodes include side surfaces having inclination angles within a range of about 5 degrees to about 60 degrees with respect to the first plane.

11. The unit pixel of claim 1, further comprising:
a first insulation layer covering the first through third unit pixels; and
first, second, third, and fourth pads disposed on the first insulation layer,
wherein:
the first insulation layer has contact holes providing an electrical path for the first through third light emitting stacks;
the first through fourth pads are electrically connected to the first through third light emitting stacks through the contact holes; and
sidewalls of the contact holes have inclination angles within a range of about 10 degrees to about 70 degrees with respect to the first plane.

12. The unit pixel of claim 11, further comprising:
a second insulation layer covering the first through fourth pads; and
first, second, third, and fourth connection electrodes disposed on the second insulation layer,
wherein:
the second insulation layer has through holes providing an electrical path for the first through fourth pads;
the first through fourth connection electrodes are electrically connected to the first through fourth pads through the through holes of the second insulation layer; and
sidewalls of the through holes have inclination angles within a range of about 10 degrees to about 70 degrees with respect to the first plane.

13. The unit pixel of claim 1, wherein at least one of the first through third light emitting stacks has a mirror symmetrical structure with respect to at least one vertical plane passing through a center of the at least one of the first through third light emitting stacks in plan view.

14. The unit pixel of claim 13, wherein:
the unit pixel has a rectangular shape in plan view, and
the at least one vertical plane passes through a straight line parallel to an edge of the unit pixel.

15. The unit pixel of claim 1, further comprising a substrate disposed under the third light emitting stack.

16. A display apparatus, comprising:
a circuit board;
a unit pixel disposed on the circuit board, the unit pixel, comprising:
a first light emitting stack;
a second light emitting stack disposed under the first light emitting stack, and having an area greater than that of the first light emitting stack;
a third light emitting stack disposed under the second light emitting stack, and having an area greater than that of the second light emitting stack; and
a first upper contact electrode disposed on the first light emitting stack,
wherein at least one of the first through third light emitting stacks includes a side surface having an inclination angle within a range of about 30 degrees to about 70 degrees with respect to a first plane parallel to a top surface of the third light emitting stack, and
wherein the first upper contact electrode includes a side surface including a first region with a first inclination angle within a range of about 20 degrees to about 70 degrees with respect to the first plane, and a second region with a second inclination angle within a range of about 20 degrees to about 70 degrees with respect to the first plane, wherein the second region is disposed above the first region and the second inclination angle is less than the first inclination angle.

17. The display apparatus of claim 16, wherein:
the first light emitting stack includes a first side surface having a first inclination angle with respect to the first plane, and a second side surface having a second inclination angle less than the first inclination angle; and
the first side surface is disposed closer to the second light emitting stack than the second side surface.

18. The display apparatus of claim 16, wherein the unit pixel further comprises:
a first adhesive layer disposed between the first light emitting stack and the second light emitting stack; and
a second adhesive layer disposed between the second light emitting stack and the third light emitting stack,
wherein the first adhesive layer and the second adhesive layer include side surfaces having inclination angles within a range of about 30 degrees to about 70 degrees with respect to the first plane.

19. The display apparatus of claim 18, wherein the unit pixel further comprises:
a first lower contact electrode electrically connected to a second conductivity type semiconductor layer of the first light emitting stack;

a second lower contact electrode electrically connected to a second conductivity type semiconductor layer of the second light emitting stack; and
a third lower contact electrode electrically connected to a second conductivity type semiconductor layer of the third light emitting stack,
wherein the first through third lower contact electrodes include side surfaces having inclination angles within a range of about 5 degrees to about 60 degrees with respect to the first plane.

* * * * *